(12) United States Patent
Seo et al.

(10) Patent No.: US 12,029,114 B2
(45) Date of Patent: Jul. 2, 2024

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Atsugi (JP)

(72) Inventors: Satoshi Seo, Kanagawa (JP); Nobuharu Ohsawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 356 days.

(21) Appl. No.: 17/118,798

(22) Filed: Dec. 11, 2020

(65) Prior Publication Data

US 2021/0104677 A1     Apr. 8, 2021

Related U.S. Application Data

(63) Continuation of application No. 15/155,255, filed on May 16, 2016, now Pat. No. 10,868,256.

(30) Foreign Application Priority Data

May 21, 2015    (JP) ................................. 2015-103903

(51) Int. Cl.
     *H10K 50/11*        (2023.01)
     *C09K 11/02*        (2006.01)
     (Continued)

(52) U.S. Cl.
     CPC .......... *H10K 85/654* (2023.02); *C09K 11/025* (2013.01); *C09K 11/06* (2013.01);
     (Continued)

(58) Field of Classification Search
None
See application file for complete search history.

(56) References Cited

U.S. PATENT DOCUMENTS

| 5,597,890 A | 1/1997 | Jenekhe |
| 5,599,899 A | 2/1997 | Jenekhe et al. |

(Continued)

FOREIGN PATENT DOCUMENTS

| CN | 103443950 A | 12/2013 |
| CN | 103579515 A | 2/2014 |

(Continued)

OTHER PUBLICATIONS

Lee, Dong Ryun, et al. Above 30% external quantum efficiency in green delayed fluorescent organic light-emitting diodes, ACS applied materials & interfaces 7.18 (2015): 9625-9629. (Year: 2015).*

(Continued)

*Primary Examiner* — Robert S Loewe
(74) *Attorney, Agent, or Firm* — Fish & Richardson P.C.

(57) ABSTRACT

A light-emitting element containing a light-emitting material and having high light emission efficiency is provided. The light-emitting element includes a host material and a guest material. The host material includes at least a first molecule and a second molecule having the same molecular structure. The guest material has a function of exhibiting fluorescence or converting triplet excitation energy into light emission. The first molecule and the second molecule each include a first skeleton, a second skeleton, and a third skeleton, and the first skeleton and the second skeleton are bonded to each other through the third skeleton. The first skeleton includes at least one of a π-electron rich heteroaromatic skeleton and an aromatic amine skeleton and the second skeleton includes a π-electron deficient heteroaromatic skeleton. The first molecule and the second molecule have a function of forming an excited complex.

12 Claims, 47 Drawing Sheets

(51) Int. Cl.
*C09K 11/06* (2006.01)
*H10K 85/60* (2023.01)
*H10K 101/00* (2023.01)
*H10K 101/30* (2023.01)

(52) U.S. Cl.
CPC ......... *H10K 85/636* (2023.02); *H10K 85/657* (2023.02); *H10K 85/6572* (2023.02); *C09K 2211/1007* (2013.01); *C09K 2211/1044* (2013.01); *H10K 50/11* (2023.02); *H10K 2101/30* (2023.02); *H10K 2101/90* (2023.02); *Y02P 20/582* (2015.11)

(56) References Cited

U.S. PATENT DOCUMENTS

| | | | |
|---|---|---|---|
| 5,726,282 A | 3/1998 | Jenekhe et al. | |
| 5,814,833 A | 9/1998 | Jenekhe | |
| 5,959,070 A | 9/1999 | Jenekhe et al. | |
| 7,175,922 B2 | 2/2007 | Jarikov et al. | |
| 7,183,010 B2 | 2/2007 | Jarikov | |
| 7,332,857 B2 | 2/2008 | Seo et al. | |
| 7,597,967 B2 | 10/2009 | Kondakova et al. | |
| 7,906,226 B2 | 3/2011 | Matsuura et al. | |
| 7,993,760 B2 | 8/2011 | Komori et al. | |
| 8,034,465 B2 | 10/2011 | Liao et al. | |
| 8,105,701 B2 | 1/2012 | Matsuura et al. | |
| 8,178,215 B2 | 5/2012 | Yabe et al. | |
| 8,274,214 B2 | 9/2012 | Ikeda et al. | |
| 8,470,455 B2 | 6/2013 | Matsuura et al. | |
| 8,853,680 B2 | 10/2014 | Yamazaki et al. | |
| 8,963,127 B2 | 2/2015 | Pieh et al. | |
| 8,981,355 B2 | 3/2015 | Seo | |
| 8,993,129 B2 | 3/2015 | Endo et al. | |
| 8,994,013 B2 | 3/2015 | Seo | |
| 8,994,263 B2 | 3/2015 | Shitagaki et al. | |
| 9,054,317 B2 | 6/2015 | Monkman et al. | |
| 9,059,430 B2 | 6/2015 | Seo et al. | |
| 9,076,976 B2 | 7/2015 | Seo et al. | |
| 9,142,710 B2 | 9/2015 | Seo et al. | |
| 9,159,942 B2 | 10/2015 | Seo et al. | |
| 9,175,213 B2 | 11/2015 | Seo et al. | |
| 9,263,693 B2 | 2/2016 | Seo et al. | |
| 9,276,228 B2 | 3/2016 | Seo et al. | |
| 9,312,498 B2 | 4/2016 | Inoue et al. | |
| 9,356,250 B2 | 5/2016 | Ohsawa et al. | |
| 9,496,503 B2 | 11/2016 | Takeda et al. | |
| 9,512,136 B2 | 12/2016 | Lin et al. | |
| 9,525,149 B2 | 12/2016 | Seo et al. | |
| 9,559,324 B2 | 1/2017 | Seo et al. | |
| 9,590,208 B2 | 3/2017 | Seo et al. | |
| 9,604,928 B2 | 3/2017 | Shitagaki et al. | |
| 9,634,279 B2 | 4/2017 | Seo et al. | |
| 9,905,782 B2 | 2/2018 | Inoue et al. | |
| 10,062,867 B2 | 8/2018 | Seo et al. | |
| 10,121,984 B2 | 11/2018 | Seo et al. | |
| 10,193,086 B2 | 1/2019 | Inoue et al. | |
| 10,367,160 B2 | 7/2019 | Seo et al. | |
| 10,868,256 B2* | 12/2020 | Seo | H01L 51/0061 |
| 10,978,661 B2 | 4/2021 | Seo et al. | |
| 2003/0175553 A1 | 9/2003 | Thompson et al. | |
| 2005/0048310 A1 | 3/2005 | Cocchi et al. | |
| 2005/0221116 A1 | 10/2005 | Cocchi et al. | |
| 2006/0134464 A1 | 6/2006 | Nariyuki | |
| 2007/0090756 A1 | 4/2007 | Okada et al. | |
| 2009/0184635 A1 | 7/2009 | Pan et al. | |
| 2011/0089407 A1 | 4/2011 | Schmidhalter et al. | |
| 2012/0205632 A1 | 8/2012 | Shitagaki et al. | |
| 2012/0217487 A1 | 8/2012 | Yamazaki et al. | |
| 2012/0242219 A1 | 9/2012 | Seo et al. | |
| 2013/0306945 A1 | 11/2013 | Seo | |
| 2014/0145149 A1 | 5/2014 | Lin et al. | |
| 2014/0175420 A1 | 6/2014 | Pan et al. | |
| 2014/0291645 A1 | 10/2014 | Inoue et al. | |
| 2015/0021556 A1 | 1/2015 | Xia et al. | |
| 2015/0069352 A1 | 3/2015 | Kim et al. | |
| 2015/0073147 A1 | 3/2015 | Inoue et al. | |
| 2015/0102331 A1* | 4/2015 | Seo | H01L 51/0052 257/40 |
| 2016/0049607 A1 | 2/2016 | Seo et al. | |
| 2016/0093823 A1 | 3/2016 | Seo et al. | |
| 2016/0308139 A1 | 10/2016 | Seo et al. | |
| 2016/0343949 A1 | 11/2016 | Seo et al. | |
| 2017/0092878 A1 | 3/2017 | Seo et al. | |
| 2019/0173024 A1 | 6/2019 | Inoue et al. | |

FOREIGN PATENT DOCUMENTS

| | | |
|---|---|---|
| CN | 104247077 A | 12/2014 |
| CN | 105103327 A | 11/2015 |
| EP | 1202608 A | 5/2002 |
| EP | 1820801 A | 8/2007 |
| JP | 2006-188493 A | 7/2006 |
| JP | 2007-214465 A | 8/2007 |
| JP | 2008-288344 A | 11/2008 |
| JP | 2010-182699 A | 8/2010 |
| JP | 2012-212879 A | 11/2012 |
| JP | 2013-258402 A | 12/2013 |
| JP | 2014-045179 A | 3/2014 |
| JP | 2014-105209 A | 6/2014 |
| JP | 2014-208614 A | 11/2014 |
| JP | 2014-209611 A | 11/2014 |
| JP | 2015-078178 A | 4/2015 |
| KR | 2014-0067910 A | 6/2014 |
| KR | 2015-0132837 A | 11/2015 |
| TW | 201443058 | 11/2014 |
| WO | WO-2012/127990 | 9/2012 |
| WO | WO-2013/137088 | 9/2013 |
| WO | WO-2013/157506 | 10/2013 |
| WO | WO-2014/157599 | 10/2014 |

OTHER PUBLICATIONS

Wang, Hao, et al. "Ir (ppy) 3 phosphorescent microrods and nanowires: Promising micro-phosphors." Journal of Materials Chemistry 19.1 (2009): 89-96. (Year: 2009).*

Chinese Office Action (Application No. 201910832018.0) Dated Jun. 3, 2021.

Yersin.H et al., Highly Efficient OLEDs with Phosphorescent Materials, 2008, pp. 1-97,283-309, Wiley-VCH Verlag Gmbh & Co..

Tokito.S et al., "Improvement in performance by doping", Organic EL Display, Aug. 20, 2004, pp. 67-99, Ohmsha.

Jeon. W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(FIrpic): Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino. Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

(56) References Cited

OTHER PUBLICATIONS

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato) aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Chinese Office Action (Application No. 201610342968.1) Dated Feb. 2, 2019.

Taiwanese Office Action (Application No. 105114753) Dated Oct. 25, 2019.

STN search for U.S. Appl. No. 15/155,255, 2020, pp. 1-1673.

\* cited by examiner

HOMO
TPA

LUMO
TPA

HOMO
DBq

LUMO
DBq

HOMO
P2Pm

LUMO
P2Pm

FIG. 3A
HOMO
TPA + DBq
FIG. 3B
LUMO
TPA + DBq
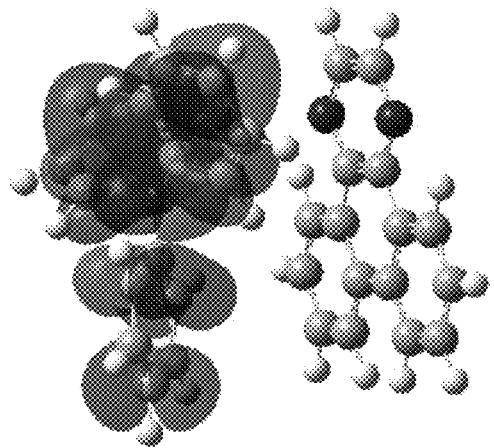
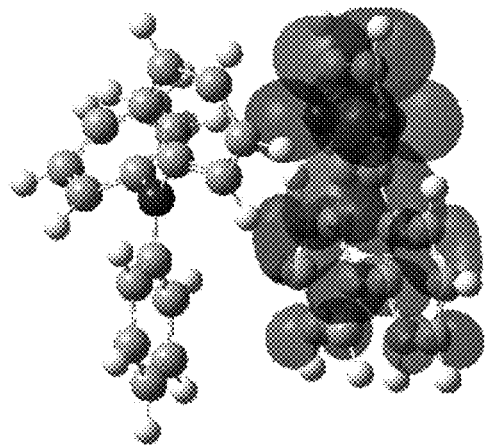
FIG. 3C
HOMO
TPA + P2Pm
FIG. 3D
LUMO
TPA + P2Pm
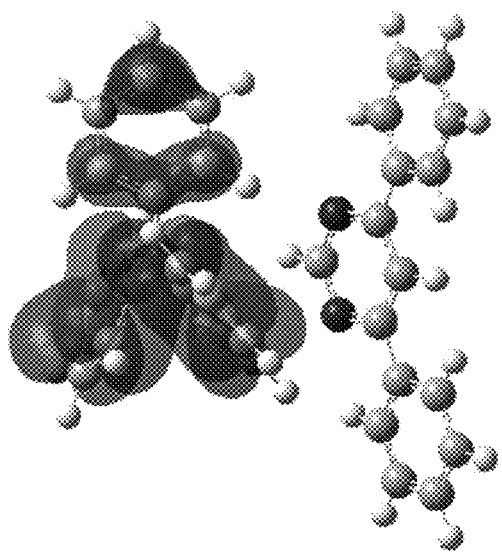
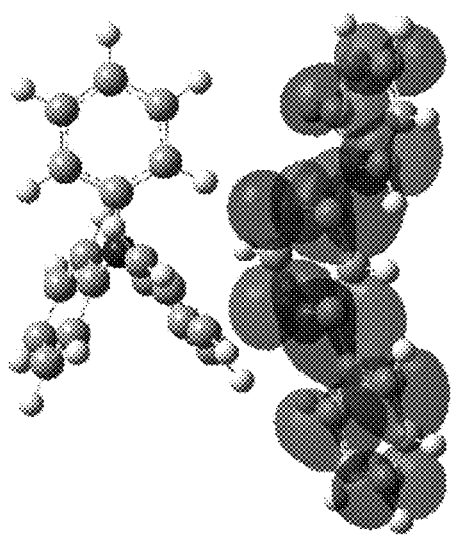

HOMO
PCz

LUMO
PCz

HOMO
Bfpm

LUMO
Bfpm

HOMO
PCz + Bfpm

LUMO
PCz + Bfpm

HOMO
2DPhAPDBq

LUMO
2DPhAPDBq

HOMO
2DPhAPDBq dimer

LUMO
2DPhAPDBq dimer

HOMO
2mDPhABPDBq

LUMO
2mDPhABPDBq

HOMO
2mDPhABPDBq dimer

LUMO
2mDPhABPDBq dimer

FIG. 7A
HOMO
4DPhAPPm
FIG. 7B
LUMO
4DPhAPPm
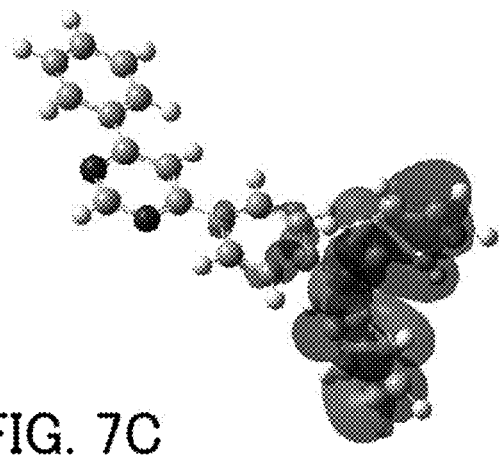
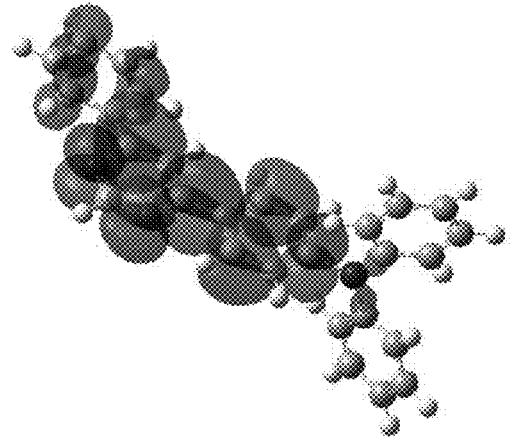
FIG. 7C
HOMO
4DPhAPPm dimer
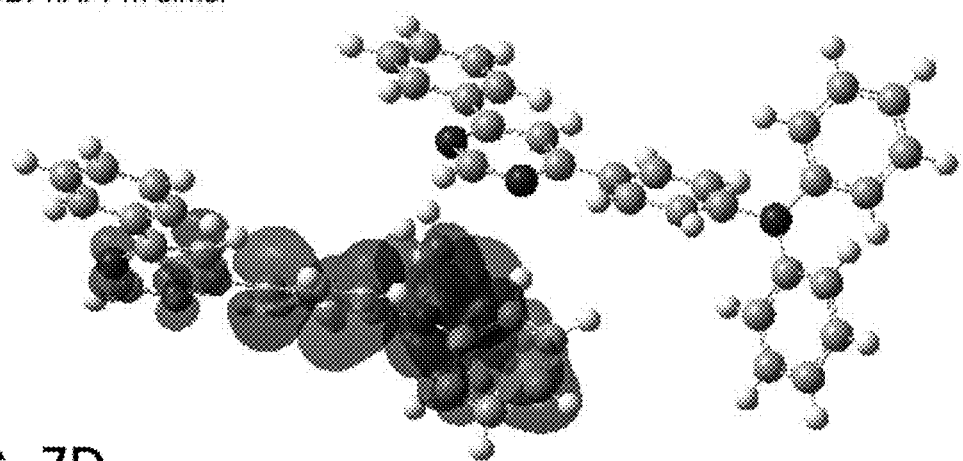
FIG. 7D
LUMO
4DPhAPPm dimer
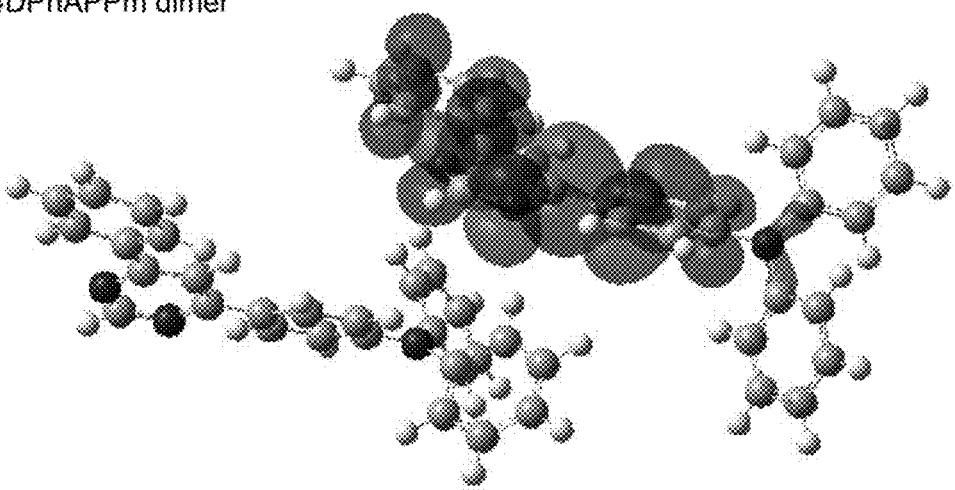

FIG. 8A
HOMO
4mDPhABPPm
FIG. 8B
LUMO
4mDPhABPPm
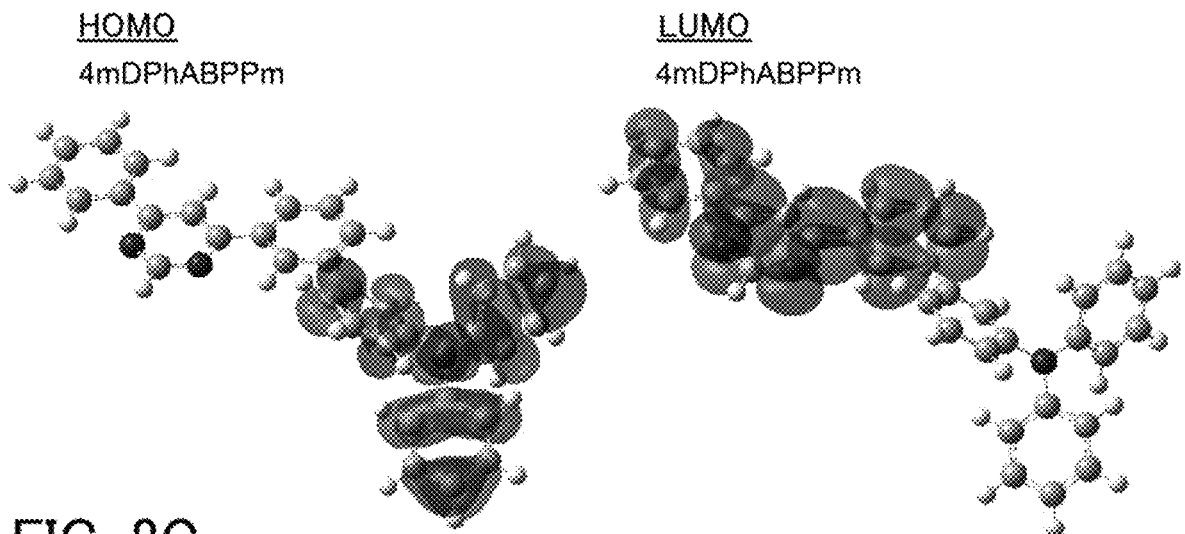
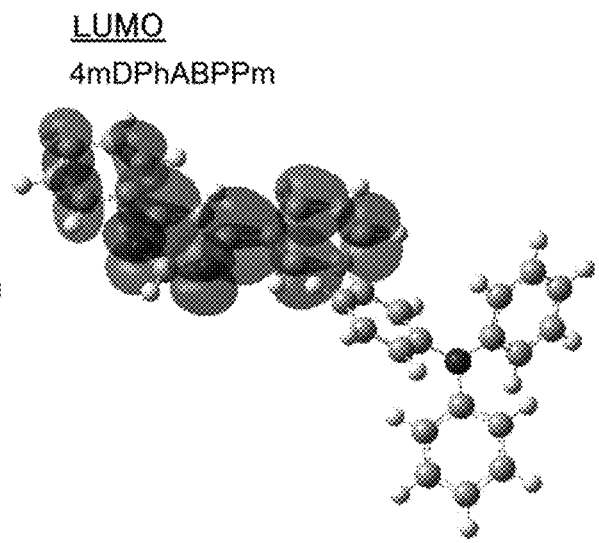
FIG. 8C
HOMO
4mDPhABPPm dimer
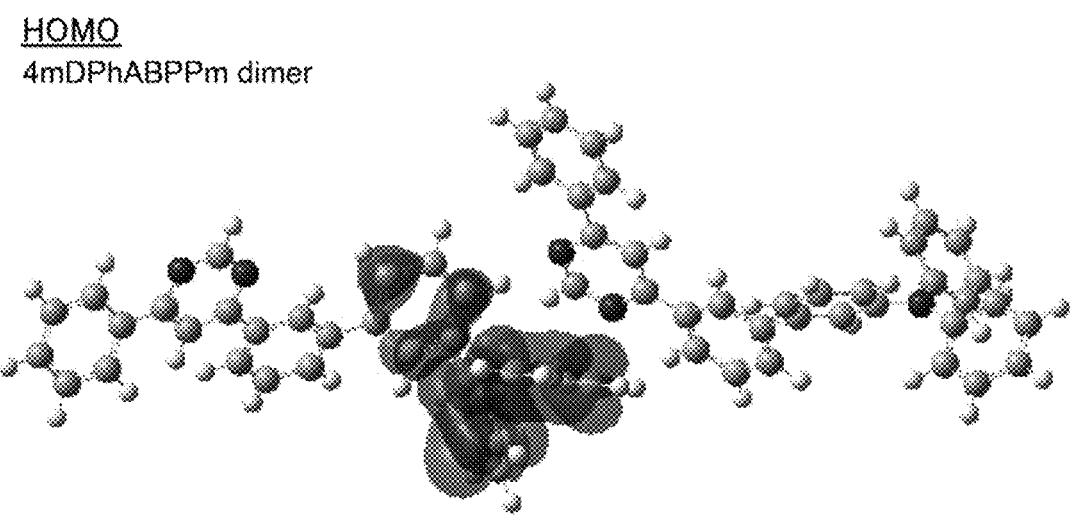
FIG. 8D
LUMO
4mDPhABPPm dimer
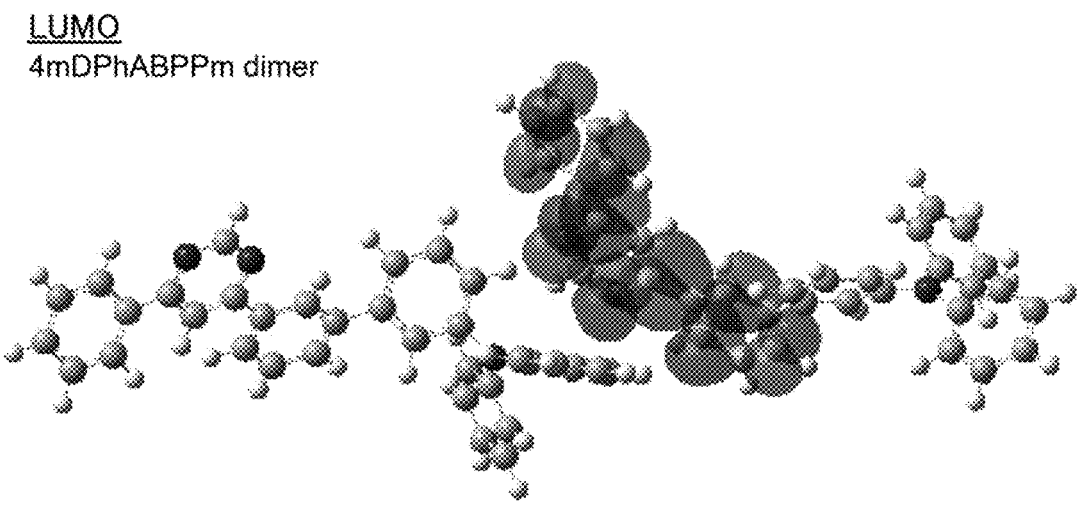

HOMO
4CzPBfpm

LUMO
4CzPBfpm

HOMO
4CzPBfpm dimer

LUMO
4CzPBfpm dimer

HOMO
4mCzBPBfpm

LUMO
4mCzBPBfpm

HOMO
4mCzBPBfpm dimer

LUMO
4mCzBPBfpm dimer

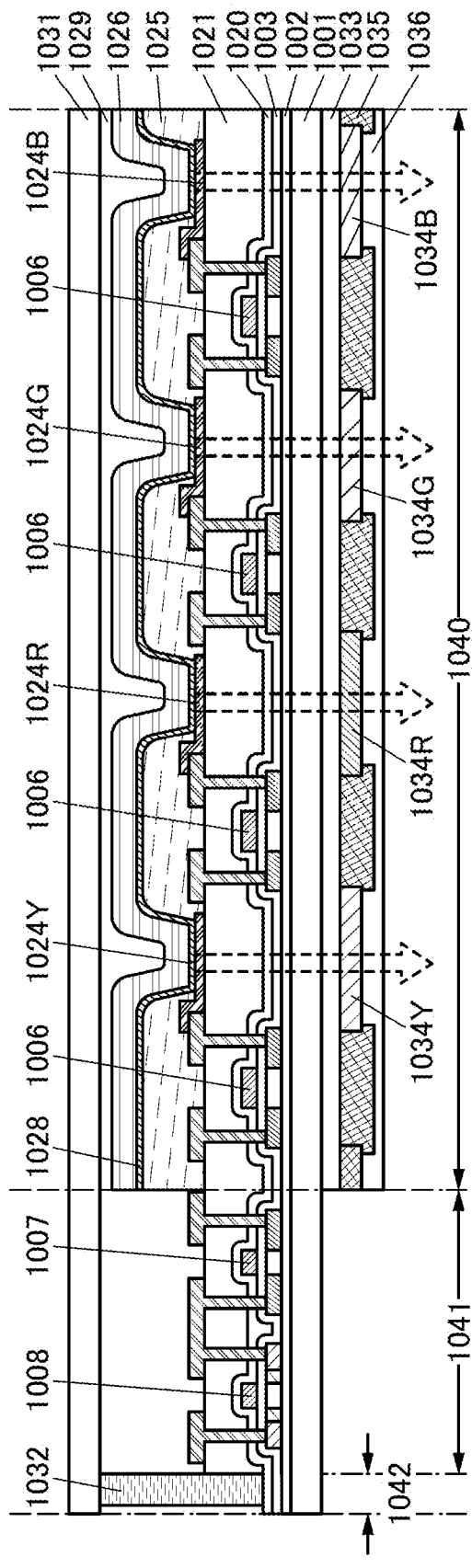
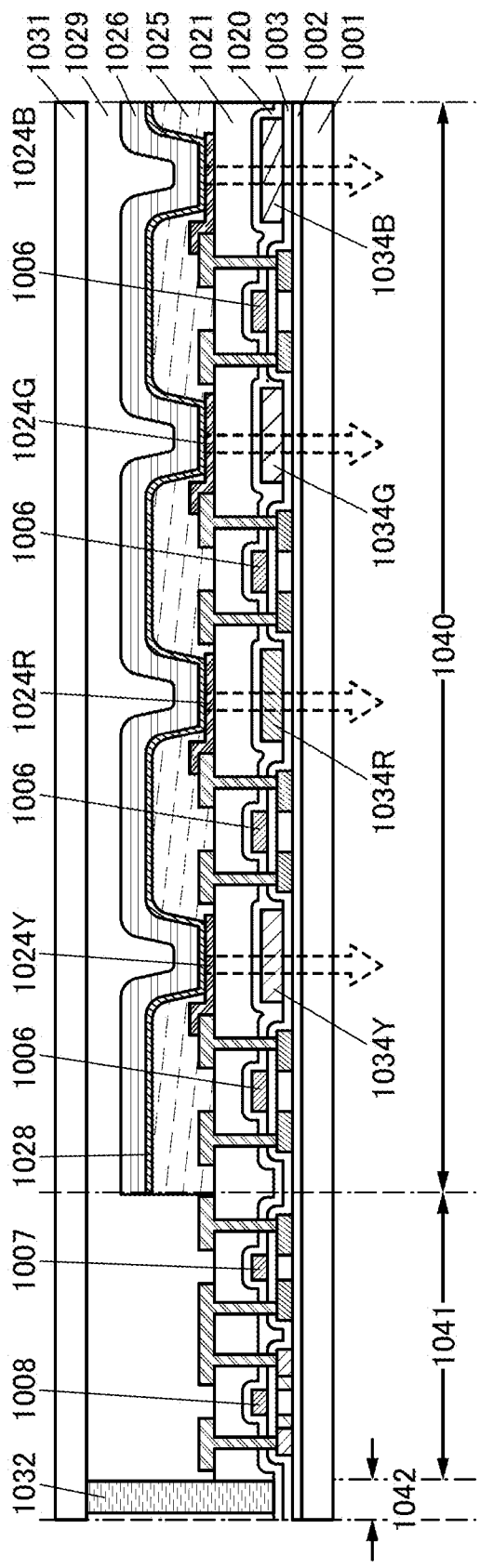

ID EMITTING ELEMENT, DISPLAY
DEVICE, ELECTRONIC DEVICE, AND
LIGHTING DEVICE

CROSS-REFERENCE TO RELATED
APPLICATIONS

This application is a continuation of U.S. application Ser. No. 15/155,255, filed May 16, 2016, now allowed, which claims the benefit of a foreign priority application filed in Japan as Serial No. 2015-103903 on May 21, 2015, both of which are incorporated by reference.

BACKGROUND OF THE INVENTION

1. Field of the Invention

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method of driving any of them, and a method of manufacturing any of them.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. Furthermore, such a light-emitting element also has advantages in that the element can be manufactured to be thin and lightweight, and has high response speed.

In a light-emitting element whose EL layer contains an organic compound as a light-emitting substance and is provided between a pair of electrodes (e.g., an organic EL element), application of a voltage between the pair of electrodes causes injection of electrons from a cathode and holes from an anode into the EL layer having a light-emitting property and thus a current flows. By recombination of the injected electrons and holes, the light-emitting organic compound is brought into an excited state to provide light emission.

Note that an excited state formed by an organic compound can be a singlet excited state ($S^*$) or a triplet excited state ($T^*$). Light emission from the singlet excited state is referred to as fluorescence, and light emission from the triplet excited state is referred to as phosphorescence. The formation ratio of $S^*$ to $T^*$ in the light-emitting element is 1:3. In other words, a light-emitting element containing a compound emitting phosphorescence (phosphorescent compound) has higher light emission efficiency than a light-emitting element containing a compound emitting fluorescence (fluorescent compound). Therefore, light-emitting elements containing phosphorescent compounds capable of converting a triplet excited state into light emission has been actively developed in recent years (e.g., see Patent Document 1).

Energy needed for exciting an organic compound depends on an energy difference between the LUMO level and the HOMO level of the organic compound, and the energy difference approximately corresponds to the energy of the singlet excited state. In the light-emitting element containing a phosphorescent compound, triplet excitation energy is converted into light emission energy. Thus, when the energy difference between the singlet excited state and the triplet excited state of an organic compound is large, the energy needed for exciting the organic compound is higher than the light emission energy by the amount corresponding to the energy difference. The energy difference between the energy needed for exciting the organic compound and the light emission energy increases the driving voltage in the light-emitting element and affects element characteristics. Thus, a method for reducing the driving voltage has been searched (see Patent Document 2).

Among light-emitting elements containing phosphorescent compounds, a light-emitting element that emits blue light in particular has yet been put into practical use because it is difficult to develop a stable compound having a high triplet excitation energy level. For this reason, the development of a light-emitting element containing a more stable fluorescent compound has been conducted and a technique for increasing the light emission efficiency of a light-emitting element containing a fluorescent compound (fluorescent element) has been searched.

As one of materials capable of partly converting the energy of the triplet excited state into light emission, a thermally activated delayed fluorescent (TADF) emitter has been known. In a thermally activated delayed fluorescent emitter, a singlet excited state is generated from a triplet excited state by reverse intersystem crossing, and the singlet excited state is converted into light emission.

In order to increase light emission efficiency of a light-emitting element using a thermally activated delayed fluorescent emitter, not only efficient generation of a singlet excited state from a triplet excited state but also efficient emission from a singlet excited state, that is, a high fluorescence quantum yield is important in a thermally activated delayed fluorescent emitter. It is, however, difficult to design a light-emitting material that meets these two.

Patent Document 3 discloses a method: in a light-emitting element containing a thermally activated delayed fluorescent emitter and a fluorescent compound, singlet excitation energy of the thermally activated delayed fluorescent emitter is transferred to the fluorescent compound and light emission is obtained from the fluorescent compound.

REFERENCE

Patent Documents

[Patent Document 1] Japanese Published Patent Application No. 2010-182699
[Patent Document 2] Japanese Published Patent Application No. 2012-212879

[Patent Document 3] Japanese Published Patent Application No. 2014-45179

SUMMARY OF THE INVENTION

In a light-emitting element containing a light-emitting organic compound, to increase light emission efficiency or to reduce driving voltage, it is preferable that an energy difference between the singlet excited state and the triplet excited state of a host material be small.

In order to increase light emission efficiency of a light-emitting element containing a fluorescent compound, efficient generation of a singlet excited state from a triplet excited state is preferable. In addition, efficient energy transfer from a singlet excited state of the host material to a singlet excited state of the fluorescent compound is preferable.

In view of the above, an object of one embodiment of the present invention is to provide a light-emitting element that contains a fluorescent compound or a phosphorescent compound and has high light emission efficiency. Another object of one embodiment of the present invention is to provide a light-emitting element with low power consumption. Another object of one embodiment of the present invention is to provide a novel light-emitting element. Another object of one embodiment of the present invention is to provide a novel light-emitting device. Another object of one embodiment of the present invention is to provide a novel display device.

Note that the description of the above object does not preclude the existence of other objects. In one embodiment of the present invention, there is no need to achieve all the objects. Objects other than the above objects will be apparent from and can be derived from the description of the specification and the like.

One embodiment of the present invention is a light-emitting element containing a compound which forms an excited complex efficiently. Alternatively, one embodiment of the present invention is a light-emitting element in which a triplet exciton is converted into a singlet exciton and light can be emitted from a compound containing the singlet exciton or light can be emitted from a fluorescent compound due to energy transfer of the singlet exciton.

Thus, one embodiment of the present invention is a light-emitting element including a host material and a guest material. The host material includes at least a first molecule and a second molecule having the same molecular structure. The guest material has a function of exhibiting fluorescence. The first molecule and the second molecule each include a first skeleton, a second skeleton, and a third skeleton. The first skeleton and the second skeleton are bonded to each other through the third skeleton. The first skeleton has a function of transferring holes. The second skeleton has a function of transferring electrons. The first molecule and the second molecule have a function of forming an excited complex.

Another embodiment of the present invention is a light-emitting element including a host material and a guest material. The host material includes at least a first molecule and a second molecule having the same molecular structure. The guest material has a function of exhibiting fluorescence. The first molecule and the second molecule each include a first skeleton, a second skeleton, and a third skeleton. The first skeleton and the second skeleton are bonded to each other through the third skeleton. The first skeleton includes at least one of a π-electron rich heteroaromatic skeleton and an aromatic amine skeleton. The second skeleton includes a π-electron deficient heteroaromatic skeleton. The first molecule and the second molecule have a function of forming an excited complex.

Another embodiment of the present invention is a light-emitting element including a host material and a guest material. The host material includes at least a first molecule and a second molecule having the same molecular structure. The guest material has a function of converting triplet excitation energy into light emission. The first molecule and the second molecule each include a first skeleton, a second skeleton, and a third skeleton. The first skeleton and the second skeleton are bonded to each other through the third skeleton. The first skeleton has a function of transferring holes. The second skeleton has a function of transferring electrons. The first molecule and the second molecule have a function of forming an excited complex.

Another embodiment of the present invention is a light-emitting element including a host material and a guest material. The host material includes at least a first molecule and a second molecule having the same molecular structure. The guest material has a function of converting triplet excitation energy into light emission. The first molecule and the second molecule each include a first skeleton, a second skeleton, and a third skeleton. The first skeleton and the second skeleton are bonded to each other through the third skeleton. The first skeleton includes at least one of a π-electron rich heteroaromatic skeleton and an aromatic amine skeleton. The second skeleton includes a π-electron deficient heteroaromatic skeleton. The first molecule and the second molecule have a function of forming an excited complex.

In each of the above structures, the π-electron deficient heteroaromatic skeleton preferably includes at least one of a pyridine skeleton, a diazine skeleton, and a triazine skeleton. The π-electron rich heteroaromatic skeleton preferably includes at least one of a thiophene skeleton, a furan skeleton, and a pyrrole skeleton.

In each of the above structures, the first molecule and the second molecule have a function of forming the excited complex with the first skeleton in the first molecule and the second skeleton in the second molecule.

In each of the above structures, the third skeleton preferably includes at least one of a m-phenylene group and an o-phenylene group. In addition, the third skeleton preferably has a structure where an arylene group and at least one of a m-phenylene group and an o-phenylene group are bonded to each other. In addition, the third skeleton preferably includes a biphenyldiyl group.

In each of the above structures, the excited complex preferably has a function of exhibiting thermally activated delayed fluorescence at room temperature. In addition, the excited complex preferably has a function of supplying excitation energy to the guest material. In addition, light emitted from the excited complex preferably has a region overlapping with an absorption band of the guest material on the lowest energy side.

Another embodiment of the present invention is a display device including the light-emitting element having any of the above-described structures, and at least one of a color filter and a transistor. Another embodiment of the present invention is an electronic device including the above-described display device and at least one of a housing and a touch sensor. Another embodiment of the present invention is a lighting device including the light-emitting element having any of the above-described structures, and at least one of a housing and a touch sensor. The category of one embodiment of the present invention includes not only a light-emitting device including a light-emitting element but also an electronic device including a light-emitting device. Thus, the light-emitting device in this specification refers to an image display device and a light source (e.g., a lighting device). The light-emitting device may be included in a module in which a connector such as a flexible printed circuit (FPC) or a tape carrier package (TCP) is connected to a light-emitting device, a module in which a printed wiring board is provided on the tip of a TCP, or a module in which an integrated circuit (IC) is directly mounted on a light-emitting element by a chip on glass (COG) method.

With one embodiment of the present invention, a light-emitting element containing a fluorescent compound or a phosphorescent compound which has high light emission efficiency can be provided. With one embodiment of the present invention, a light-emitting element with low power consumption can be provided. With one embodiment of the present invention, a novel light-emitting element can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily have all the effects described above. Other effects will be apparent from and can be derived from the description of the specification, the drawings, the claims, and the like.

BRIEF DESCRIPTION OF THE DRAWINGS

In the accompanying drawings:

FIGS. 3A to 3D illustrate molecular orbitals of excited complexes of one embodiment of the present invention;

FIGS. 7A to 7D illustrate molecular orbitals of a compound and an excited complex of one embodiment of the present invention;

FIGS. 8A to 8D illustrate molecular orbitals of a compound and an excited complex of one embodiment of the present invention;

FIGS. 22A and 22B are schematic cross-sectional views each illustrating a display device of one embodiment of the present invention;

DETAILED DESCRIPTION OF THE INVENTION

Figure 1A:
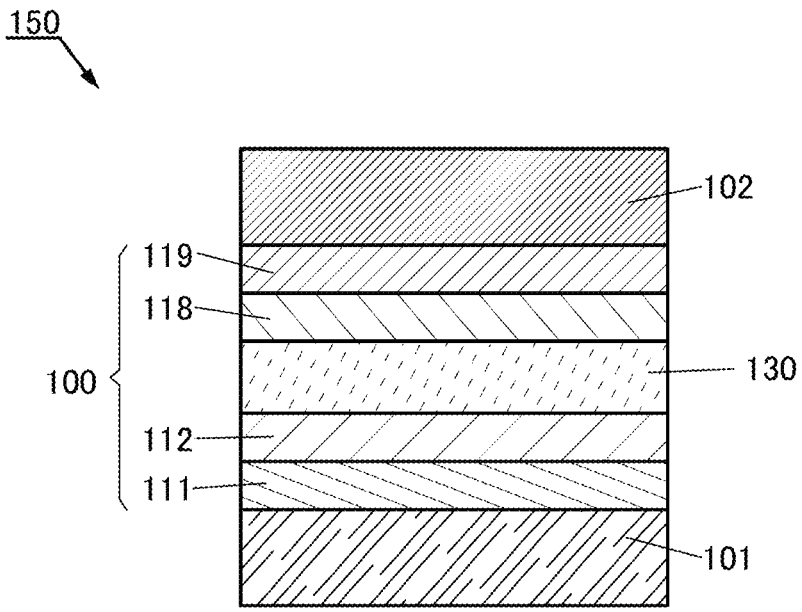
FIGS. 1A and 1B are schematic cross-sectional views of a light-emitting element of one embodiment of the present invention and FIG. 1C illustrates the correlation of energy levels in a light-emitting layer.

Embodiments of the present invention will be described below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet excitation energy, that is, the lowest level of excitation energy in a singlet excited state. A triplet excited state (T*) refers to a triplet state having excitation energy. A T1 level means the lowest level of the triplet excitation energy, that is, the lowest level of excitation energy in a triplet excited state.

In this specification and the like, a fluorescent compound refers to a compound that emits light in the visible light region when the relaxation from the singlet excited state to the ground state occurs. A phosphorescent compound refers to a compound that emits light in the visible light region at room temperature when the relaxation from the triplet excited state to the ground state occurs. That is, a phosphorescent compound refers to a compound that can convert triplet excitation energy into visible light.

Thermally activated delayed fluorescence emission energy refers to an emission peak (including a shoulder) on the shortest wavelength side of thermally activated delayed fluorescence. Phosphorescence emission energy or triplet excitation energy refers to an emission peak (including a shoulder) on the shortest wavelength side of phosphorescence emission. Note that the phosphorescence emission can be observed by time-resolved photoluminescence in a low-temperature (e.g., 10 K) environment.

Note that in this specification and the like, "room temperature" refers to a temperature higher than or equal to 0° C. and lower than or equal to 40° C.

In this specification and the like, a wavelength range of blue refers to a wavelength range of greater than or equal to 400 nm and less than 490 nm, and blue light emission refers to light emission with at least one emission spectrum peak in the wavelength range. A wavelength range of green refers to a wavelength range of greater than or equal to 490 nm and less than 580 nm, and green light emission refers to light emission with at least one emission spectrum peak in the wavelength range. A wavelength range of red refers to a wavelength range of greater than or equal to 580 nm and less than or equal to 680 nm, and red light emission refers to light emission with at least one emission spectrum peak in the wavelength range.

Embodiment 1

In this embodiment, a light-emitting element of one embodiment of the present invention will be described below with reference to FIGS. 1A to 1C, FIGS. 2A to 2F, FIGS. 3A to 3D, FIGS. 4A to 4F, FIGS. 5A to 5D, FIGS. 6A to 6D, FIGS. 7A to 7D, FIGS. 8A to 8D, FIGS. 9A to 9D, and FIGS. 10A to 10D.

<Structure Example of Light-Emitting Element>

First, a structure of the light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

Although description is given assuming that the electrode 101 and the electrode 102 of the pair of electrodes serve as an anode and a cathode, respectively in this embodiment, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1A, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

Figure 1B:
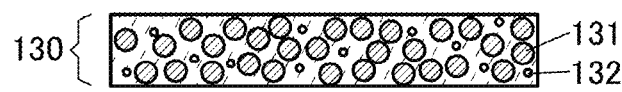

FIG. 1B is a schematic cross-sectional view illustrating an example of the light-emitting layer 130 in FIG. 1A. The light-emitting layer 130 in FIG. 1B includes a host material 131 and a guest material 132.

The guest material 132 may be a light-emitting organic compound, and the light-emitting organic compound is preferably a substance capable of emitting fluorescence (hereinafter also referred to as a fluorescent compound). A structure in which a fluorescent compound is used as the guest material 132 will be described below. The guest material 132 may be rephrased as the fluorescent compound.

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. Accordingly, in a light-emitting element that contains a fluorescent compound, the probability of generation of singlet excitons, which contribute to light emission, is 25% and the probability of generation of triplet excitons, which do not contribute to light emission, is 75%. Therefore, it is important to convert the triplet excitons, which do not contribute to light emission, into singlet excitons, which contribute to light emission, for increasing the light emission efficiency of the light-emitting element.

Thus, the host material 131 preferably has a function of generating the singlet excited state from the triplet excited state.

<Light Emission Mechanism of Light-Emitting Element>

Next, the light emission mechanism of the light-emitting layer 130 is described below.

The host material 131 in the light-emitting layer 130 preferably includes a skeleton having a function of transporting holes (a hole-transport property) and a skeleton having a function of transporting electrons (an electron-transport property). Alternatively, the host material 131 preferably includes at least one of a π-electron rich heteroaromatic skeleton and an aromatic amine skeleton, and a π-electron deficient heteroaromatic skeleton.

In one embodiment of the present invention, the host material 131 has a function of forming an excited complex (also referred to as an excited dimer) with two molecules having the same molecular structure of the host material 131. In particular, the skeleton having a hole-transport property and the skeleton having an electron-transport property of the host material 131 preferably form an excited complex in two molecules having the same molecular structure. Alternatively, at least one of the π-electron rich heteroaromatic skeleton and the aromatic amine skeleton included in the host material 131 and the π-electron deficient heteroaromatic skeleton included in the host material 131 preferably form an excited complex in two molecules having the same molecular structure. Although the above excited complex forms an excited state with the two molecules having the same molecular structure, it is important that the above excited complex form a charge-transfer excited state unlike a general excited dimer (also referred to as an excimer). That is, the excited state is formed by the two molecules having the same molecular structure, and one molecule is in an excited state which is positively charged and the other molecule is in an excited state which is negatively charged. Note that in this specification and the like, molecules having the same molecular structure refer to molecules which can be represented by the same structural formula, and may have different bond directions, bond angles, bond lengths, and the like of atoms and skeletons. Alternatively, molecules having the same molecular structure may be isomers, such as geometrical isomers, stereoisomers, and optical isomers.

In other words, the host material 131 has a function of forming an excited complex with a first molecule and a second molecule of the host material 131. In particular, the skeleton having a hole-transport property in the first molecule and the skeleton having an electron-transport property in the second molecule of the host material 131 preferably form an excited complex. Alternatively, at least one of the π-electron rich heteroaromatic skeleton and the aromatic amine skeleton in the first molecule of the host material 131 and the π-electron deficient heteroaromatic skeleton in the second molecule of the host material 131 preferably form an excited complex.

In the case where the host material 131 includes the skeleton having a hole-transport property and the skeleton having an electron-transport property, a donor-acceptor excited complex is easily formed by two molecules; thus, efficient formation of an excited complex is possible. Alternatively, in the case where the host material 131 includes at least one of the π-electron rich heteroaromatic skeleton and the aromatic amine skeleton, and the π-electron deficient heteroaromatic skeleton, a donor-acceptor excited complex is easily formed by two molecules; thus, efficient formation of an excited complex is possible.

Thus, to increase both the donor property and the acceptor property in the molecules of the host material 131, a structure where the conjugation between the skeleton having a hole-transport property and the skeleton having an electron-transport property is reduced is preferably used. Alternatively, a structure where the conjugation between the π-electron deficient heteroaromatic skeleton and at least one of the π-electron rich heteroaromatic skeleton and the aromatic amine skeleton is reduced is preferably used. Thus, an overlap between a region where the highest occupied molecular orbital (HOMO) is distributed and a region where the lowest unoccupied molecular orbital (LUMO) is distributed can be small. In addition, a difference between a singlet excitation energy level and a triplet excitation energy level of the host material 131 can be reduced. Moreover, the triplet excitation energy level of the host material 131 can be high.

Note that a molecular orbital refers to spatial distribution of electrons in a molecule, and can show the probability of finding of electrons. In addition, with the molecular orbital, electron configuration of the molecule (spatial distribution and energy of electrons) can be described in detail.

Furthermore, in the excited complex formed by the two molecules having the same molecular structure, one molecule includes the HOMO and the other molecule includes the LUMO; thus, an overlap between the HOMO and the LUMO is extremely small. That is, in the excited complex, a difference between a singlet excitation energy level and a triplet excitation energy level is small. Therefore, in the excited complex formed by the two molecules of the host material 131, a difference between a singlet excitation energy level and a triplet excitation energy level is small and is preferably larger than 0 eV and smaller than or equal to 0.2 eV.

In the case where the host material 131 includes the skeleton having a hole-transport property and the skeleton having an electron-transport property, the carrier balance can be easily controlled. As a result, a carrier recombination region can also be controlled easily.

Figure 1C:
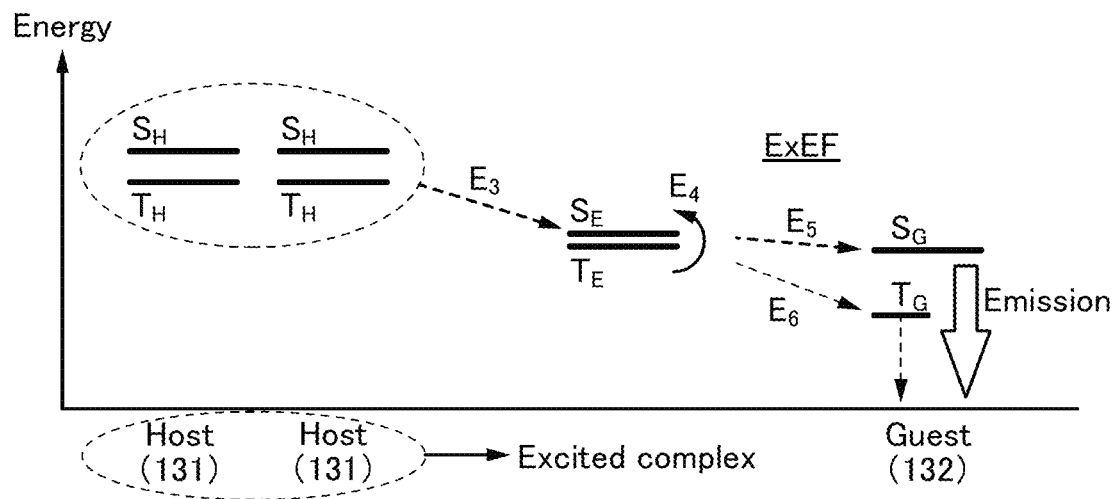

FIG. 1C shows a correlation of energy levels of the host material 131 and the guest material 132 in the light-emitting layer 130. The following explains what terms and signs in FIG. 1C represent:

Host (131): the host material 131;
Guest (132): the guest material 132 (the fluorescent compound);
$S_H$: the S1 level of the host material 131;
$T_H$: the T1 level of the host material 131;
$S_G$: the S1 level of the guest material 132 (the fluorescent compound);
$T_G$: the T1 level of the guest material 132 (the fluorescent compound);
$S_E$: the S1 level of the excited complex; and
$T_E$: the T1 level of the excited complex.

In the light-emitting element of one embodiment of the present invention, an excited complex is formed by the two molecules of the host material 131 included in the light-emitting layer 130. The lowest singlet excitation energy level ($S_E$) of the excited complex and the lowest triplet excitation energy level ($T_E$) of the excited complex are close to each other (see Route $E_3$ in FIG. 1C).

An excited complex is an excited state formed by two molecules. In photoexcitation, the excited complex is formed by interaction between one molecule in an excited state and the other molecule in a ground state. The two molecules that have formed the excited complex return to a ground state by emitting light and then serve as the original two molecules. In electrical excitation, one molecule brought into an excited state immediately interacts with the other molecule to form an excited complex. Alternatively, one molecule receives a hole and the other molecule receives an electron to immediately form an excited complex. In this case, any of the molecules can form an excited complex without forming an excited state with a single molecule and; accordingly, most excitons in the light-emitting layer 130 can exist as excited complexes. Because the excitation energy levels ($S_E$ and $T_E$) of the excited complex are lower than the singlet excitation energy level ($S_H$) of a single molecule of the host material 131 that forms the excited complex, the excited state of the host material 131 can be formed with lower excitation energy. Accordingly, the driving voltage of the light-emitting element 150 can be reduced.

Since the singlet excitation energy level ($S_E$) and the triplet excitation energy level ($T_E$) of the excited complex are close to each other, the excited complex has a function of exhibiting thermally activated delayed fluorescence. In other words, the excited complex has a function of converting triplet excitation energy into singlet excitation energy by reverse intersystem crossing (upconversion) (see Route $E_4$ in FIG. 1C). Thus, the triplet excitation energy generated in the light-emitting layer 130 is partly converted into singlet excitation energy by the excited complex. In order to cause this conversion, the energy difference between the singlet excitation energy level ($S_E$) and the triplet excitation energy level ($T_E$) of the excited complex is preferably larger than 0 eV and smaller than or equal to 0.2 eV.

Furthermore, the singlet excitation energy level ($S_E$) of the excited complex is preferably higher than the singlet excitation energy level ($S_G$) of the guest material 132. In this way, the singlet excitation energy of the formed excited complex can be transferred from the singlet excitation energy level ($S_E$) of the excited complex to the singlet excitation energy level ($S_G$) of the guest material 132, so that the guest material 132 is brought into the singlet excited state, causing light emission (see Route $E_5$ in FIG. 1C).

To obtain efficient light emission from the singlet excited state of the guest material 132, the fluorescence quantum yield of the guest material 132 is preferably high, and specifically, 50% or higher, further preferably 70% or higher, still further preferably 90% or higher.

Note that in order to efficiently make reverse intersystem crossing occur, the triplet excitation energy level ($T_E$) of the excited complex formed by two molecules is preferably lower than the triplet excitation energy level ($T_H$) of the single molecule of the host material 131 which forms the excited complex. Thus, quenching of the triplet excitation energy of the excited complex due to another one or more molecules in the host material 131 is less likely to occur, which causes reverse intersystem crossing efficiently.

Thus, the triplet excitation energy level of the host material 131 is preferably high, and the energy difference between the singlet excitation energy level and the triplet excitation energy level of the host material 131 is preferably small.

Note that since direct transition from a singlet ground state to a triplet excited state in the guest material 132 is forbidden, energy transfer from the singlet excitation energy level ($S_E$) of the excited complex to the triplet excitation energy level ($T_G$) of the guest material 132 is unlikely to be a main energy transfer process.

When transfer of the triplet excitation energy from the triplet excitation energy level ($T_E$) of the excited complex to the triplet excitation energy level ($T_G$) of the guest material 132 occurs, the triplet excitation energy is deactivated (see Route $E_6$ in FIG. 1C). Thus, it is preferable that the energy transfer of Route $E_6$ be less likely to occur because the efficiency of generating the triplet excited state of the guest material 132 can be decreased and thermal deactivation can be reduced. In order to make this condition, the weight ratio of the guest material 132 to the host material 131 is preferably low, specifically, preferably greater than or equal to 0.001 and less than or equal to 0.05, further preferably greater than or equal to 0.001 and less than or equal to 0.03, further preferably greater than or equal to 0.001 and less than or equal to 0.01.

Note that when the direct carrier recombination process in the guest material 132 is dominant, a large number of triplet excitons are generated in the light-emitting layer 130, resulting in decreased light emission efficiency due to thermal deactivation. Thus, it is preferable that the probability of the energy transfer process through the excited complex formation process (Routes $E_4$ and $E_5$ in FIG. 1C) be higher than the probability of the direct carrier recombination process in the guest material 132 because the efficiency of generating the triplet excited state of the guest material 132 can be decreased and thermal deactivation can be reduced. Therefore, as described above, the weight ratio of the guest material 132 to the host material 131 is preferably low, specifically, preferably greater than or equal to 0.001 and less than or equal to 0.05, further preferably greater than or equal to 0.001 and less than or equal to 0.03, further preferably greater than or equal to 0.001 and less than or equal to 0.01.

By making all the energy transfer processes of Routes $E_4$ and $E_5$ efficiently occur in the above-described manner, both the singlet excitation energy and the triplet excitation energy of the host material 131 can be efficiently converted into the singlet excitation energy of the guest material 132, whereby the light-emitting element 150 can emit light with high light emission efficiency.

Since an excited complex is called "an exciplex" in some cases, the above-described processes through Routes $E_3$, $E_4$, and $E_5$ may be referred to as exciplex-singlet energy transfer (ExSET) or exciplex-enhanced fluorescence (ExEF) in this specification and the like. In other words, in the light-emitting layer 130, excitation energy is transferred from the excited complex to the guest material 132.

When the light-emitting layer 130 has the above-described structure, light emission from the guest material 132 of the light-emitting layer 130 can be obtained efficiently.

As the material having a function of generating a singlet excited state from a triplet excited state, a thermally activated delayed fluorescent (TADF) material is known. The TADF material can generate the singlet excited state by itself from the triplet excited state by reverse intersystem crossing. In other words, the TADF material has a function of partly converting the energy of the triplet excitation energy into light emission.

Thus, the TADF material has a small difference between the triplet excitation energy level and the singlet excitation energy level and can up-convert the triplet excited state into a singlet excited state with little thermal energy. Specifically, the difference between the triplet excitation energy level and the singlet excitation energy level is preferably larger than 0 eV and smaller than or equal to 0.2 eV, further preferably larger than 0 eV and smaller than or equal to 0.1 eV.

As an example of the TADF material, a heterocyclic compound including a π-electron rich heteroaromatic skeleton and a π-electron deficient heteroaromatic skeleton is given. To make the heterocyclic compound have a function of exhibiting thermally activated delayed fluorescence, it is preferable that the π-electron rich heteroaromatic skeleton and the π-electron deficient heteroaromatic skeleton be directly bonded to each other and thus both the donor property of the π-electron rich heteroaromatic skeleton and the acceptor property of the π-electron deficient heteroaromatic skeleton be increased. Furthermore, it is preferable that the conjugation between the π-electron rich heteroaromatic skeleton and the π-electron deficient heteroaromatic skeleton be reduced and an overlap between the HOMO and the LUMO be reduced. However, it is preferable that a certain overlap between the HOMO and the LUMO be provided to increase probability of transition (oscillator strength) between the HOMO and the LUMO. In this manner, the difference between the singlet excitation energy level and the triplet excitation energy level can be reduced and light emission from the singlet excited state can be efficiently obtained.

For such a heterocyclic compound, a structure where the π-electron rich heteroaromatic skeleton, such as an acridine skeleton, a phenazine skeleton, and a phenoxazine skeleton, has a strong twist in a portion bonded to the π-electron deficient heteroaromatic skeleton, and the conjugation between the π-electron rich heteroaromatic skeleton and the π-electron deficient heteroaromatic skeleton is reduced is preferably used. However, the molecular structure of a skeleton having such a twist structure is limited.

Thus, in one embodiment of the present invention, it is preferable that, in the host material 131, the skeleton having a hole-transport property and the skeleton having an electron-transport property be bonded to each other through a structure including at least one of a m-phenylene group and an o-phenylene group. In particular, the structure including at least one of the m-phenylene group and the o-phenylene group is preferably a structure where an arylene group and at least one of the m-phenylene group and the o-phenylene group are bonded to each other. With such a structure, the HOMO and the LUMO in the molecule are physically apart (are distanced) from each other. As a result, the formation of the above excited complex (e.g., based on electron transition between the HOMO in the first molecule and the LUMO in the second molecule) is more dominant than the formation of the charge-transfer excited state in the molecule (based on HOMO-LUMO transition in the molecule); thus, the above structure is suitable for one embodiment of the present invention. For the same reason, it is particularly preferable that, in the host material 131, the skeleton having a hole-transport property and the skeleton having an electron-transport property be bonded to each other through a biphenyldiyl group.

Alternatively, it is preferable that, in the host material 131, the π-electron deficient heteroaromatic skeleton and at least one of the π-electron rich heteroaromatic skeleton and the aromatic amine skeleton be bonded to each other through a structure including at least one of a m-phenylene group and an o-phenylene group. In particular, the structure including at least one of the m-phenylene group and the o-phenylene group is preferably a structure where an arylene group and at least one of the m-phenylene group and the o-phenylene group are bonded to each other. With such a structure, the HOMO and the LUMO in the molecule are physically apart (are distanced) from each other. As a result, the formation of the above excited complex (e.g., based on electron transition between the HOMO in the first molecule and the LUMO in the second molecule) is more dominant than the formation of the charge-transfer excited state in the molecule (based on HOMO-LUMO transition in the molecule); thus, the above structure is suitable for one embodiment of the present invention. For the same reason, it is particularly preferable that, in the host material 131, the π-electron deficient heteroaromatic skeleton and at least one of the π-electron rich heteroaromatic skeleton and the aromatic amine skeleton be bonded to each other through a biphenyldiyl group.

<Calculation of Energy Level and Molecular Orbital by Quantum Chemistry Calculation>

Next, energy levels of compounds which can be used for the host material 131 of one embodiment of the present invention were calculated by quantum chemistry calculation.

<<Quantum Chemistry Calculation 1>>

The structures and abbreviations of compounds used in the calculation are shown below. In addition, Tables 1 to 3 show S1 levels, T1 levels, and energy differences between the S1 levels and the T1 levels (ΔS1-T1) in the most stable structures of the compounds, which were obtained by the calculation.

[Chemical Formulae 1]
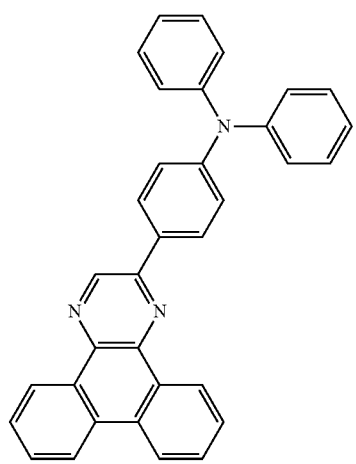
2DPhAPDBq
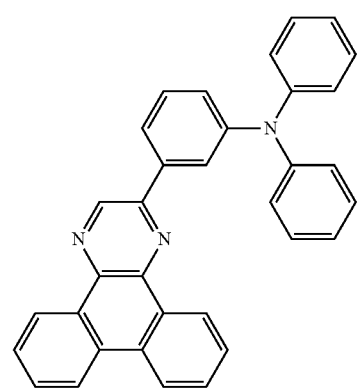
2mDPhAPDBq
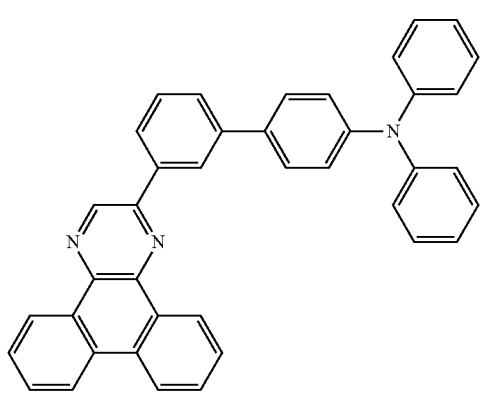
2mpDPhABPDBq
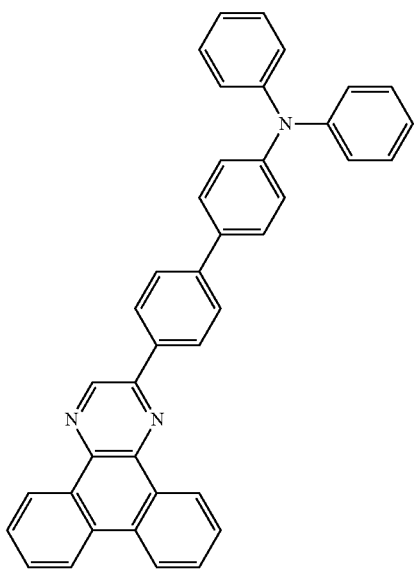
2DPhABPDBq
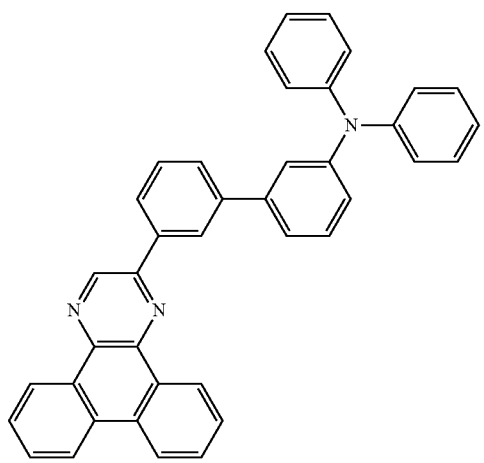
2mDPhABPDBq
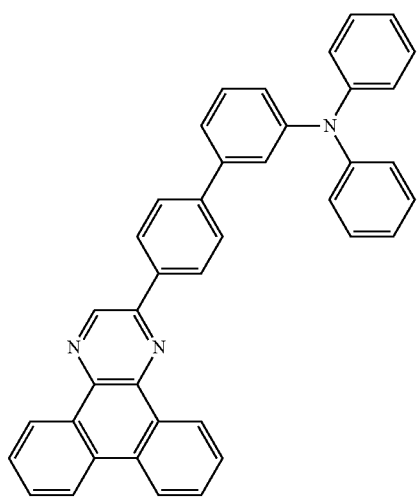
2pmDPhABPDBq

[Chemical Formulae 2]
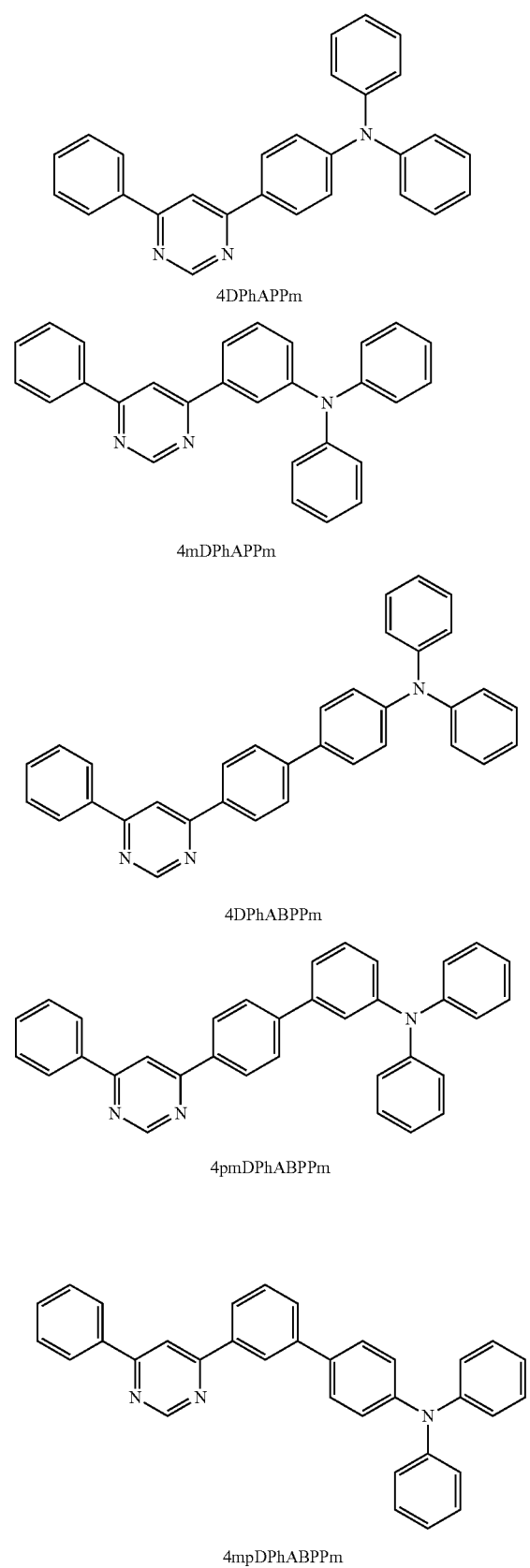
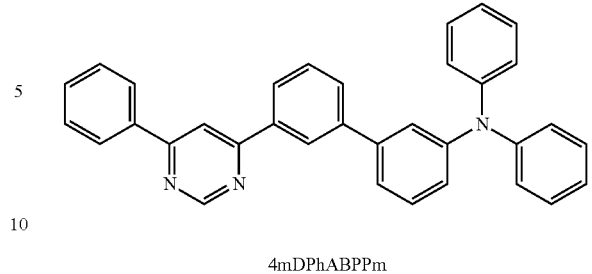
[Chemical Formulae 3]
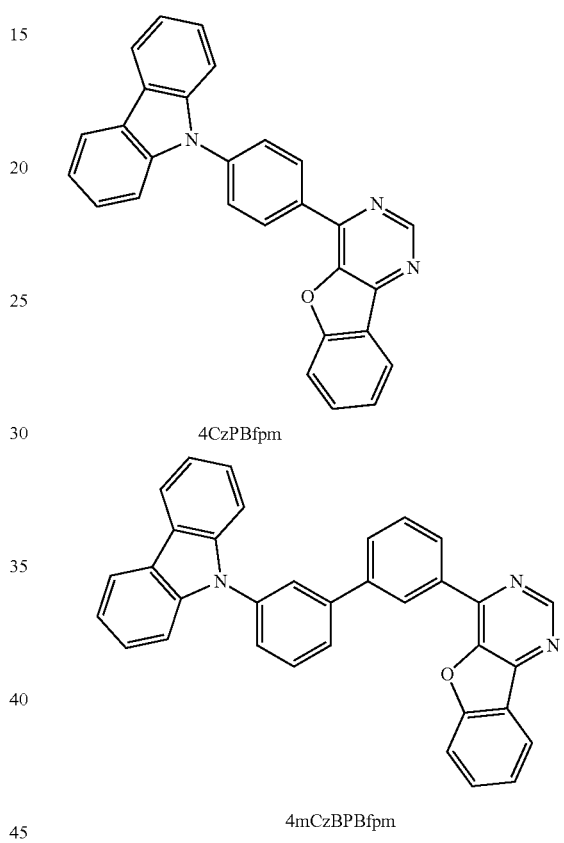
TABLE 1
| Abbreviation | S1 level [eV] | T1 level [eV] | ΔS1 − T1 [eV] |
|---|---|---|---|
| 2DPhAPDBq | 2.90 | 2.38 | 0.52 |
| 2mDPhAPDBq | 2.77 | 2.55 | 0.22 |
| 2DPhABPDBq | 2.82 | 2.45 | 0.38 |
| 2pmDPhABPDBq | 2.84 | 2.60 | 0.24 |
| 2mpDPhABPDBq | 2.81 | 2.66 | 0.15 |
| 2mDPhABPDBq | 2.85 | 2.70 | 0.14 |
TABLE 2
| Abbreviation | S1 level [eV] | T1 level [eV] | ΔS1 − T1 [eV] |
|---|---|---|---|
| 4DPhAPPm | 3.13 | 2.54 | 0.59 |
| 4mDPhAPPm | 2.86 | 2.59 | 0.27 |
| 4DPhABPPm | 2.94 | 2.52 | 0.42 |
| 4pmDPhABPPm | 2.91 | 2.71 | 0.20 |

TABLE 2-continued

| Abbreviation | S1 level [eV] | T1 level [eV] | ΔS1 − T1 [eV] |
|---|---|---|---|
| 4mpDPhABPPm | 2.92 | 2.73 | 0.19 |
| 4mDPhABPPm | 2.95 | 2.90 | 0.05 |

TABLE 3

| Abbreviation | S1 level [eV] | T1 level [eV] | ΔS1 − T1 [eV] |
|---|---|---|---|
| 4CzPBfpm | 2.95 | 2.62 | 0.33 |
| 4mCzBPBfpm | 3.01 | 2.93 | 0.08 |

The calculating method is as follows. Gaussian 09 was used as the quantum chemistry computational program. A high performance computer (ICE X, manufactured by SGI Japan, Ltd.) was used for the calculation.

First, the most stable structure in the singlet ground state was calculated using the density functional theory (DFT). As a basis function, 6-311G (d,p) was used. As a functional, B3LYP was used. Next, energy required for the transition from the most stable structure in the singlet ground state to the singlet excited state and the triplet excited state was calculated using the time-dependent density functional theory (TD-DFT). In the DFT, the total energy is represented as the sum of potential energy, electrostatic energy between electrons, electronic kinetic energy, and exchange-correlation energy including all the complicated interactions between electrons. Also in the DFT, an exchange-correlation interaction is approximated by a functional (a function of another function) of one electron potential represented in terms of electron density to enable high-accuracy calculations.

Compounds shown in Chemical Formulae 1 each include dibenzo[f,h]quinoxaline (abbreviation: DBq), which is the π-electron deficient heteroaromatic skeleton, and triphenylamine (abbreviation: TPA), which is the aromatic amine skeleton. Compounds shown in Chemical Formulae 2 each include 4,6-diphenylpyrimidine (abbreviation: P2Pm), which is the π-electron deficient heteroaromatic skeleton, and TPA, which is the aromatic amine skeleton. Compounds shown in Chemical Formulae 3 each include benzofuro[3,2-d]pyrimidine (abbreviation: Bfpm), which is the π-electron deficient heteroaromatic skeleton, and 9-phenyl-9H-carbazole (abbreviation: PCz), which is the π-electron rich heteroaromatic skeleton.

As shown in Chemical Formulae 1 and Table 1, 4-(dibenzo[f,h]quinoxalin-2-yl)triphenylamine (abbreviation: 2DPhAPDBq) includes a p-phenylene group and has a large energy difference between the S1 level and the T1 level. Thus, the T1 level is relatively low. In contrast, 3-(dibenzo[f,h]quinoxalin-2-yl)triphenylamine (abbreviation: 2mDPhAPDBq) includes a m-phenylene group and has a smaller energy difference between the S1 level and the T1 level than that of 2DPhAPDBq. In addition, N,N-diphenyl-N-[4-(dibenzo[f,h]quinoxalin-2-yl)phenyl]phenyl-4-amine (abbreviation: 2DPhABPDBq) includes a biphenyldiyl group and has a smaller energy difference between the S1 level and the T1 level than that of 2DPhAPDBq. Moreover, N,N-diphenyl-N-[4-(dibenzo[f,h]quinoxalin-2-yl)phenyl]phenyl-3-amine (abbreviation: 2pmDPhABPDBq), N,N-diphenyl-N-[3-(dibenzo[f,h]quinoxalin-2-yl)phenyl]phenyl-4-amine (abbreviation: 2mpDPhABPDBq), and N,N-diphenyl-N-[3-(dibenzo[f,h]quinoxalin-2-yl)phenyl]phenyl-3-amine (abbreviation: 2mDPhABPDBq) each include a biphenyldiyl group including a m-phenylene group and have a smaller energy difference between the S1 level and the T1 level than those of 2DPhAPDBq and 2DPhABPDBq. In particular, 2mDPhABPDBq, which includes a biphenyldiyl group including two m-phenylene groups, is preferable because the energy difference between the S1 level and the T1 level is larger than 0 eV and smaller than or equal to 0.2 eV. As shown in Table 1, as the energy difference between the S1 level and the T1 level is smaller, the T1 level becomes relatively high. As described later, when the T1 level of a single molecule is high, the T1 level of an excited complex becomes more stable than that of the single molecule, which is suitable for the structure of the present invention.

As shown in Chemical Formulae 2 and Table 2, N,N-diphenyl-N-(4-phenyl-pyrimidin-6-yl)phenyl-4-amine (abbreviation: 4DPhAPPm) includes a p-phenylene group and has a large energy difference between the S1 level and the T1 level. Thus, the T1 level is relatively low. In contrast, N,N-diphenyl-N-(4-phenyl-pyrimidin-6-yl)phenyl-3-amine (abbreviation: 4mDPhAPPm) includes a m-phenylene group and has a smaller energy difference between the S1 level and the T1 level than that of 4DPhAPPm. In addition, N,N-diphenyl-N-[4-(4-phenyl-pyrimidin-6-yl)phenyl]phenyl-4-amine (abbreviation: 4DPhABPPm) includes a biphenyldiyl group and has a smaller energy difference between the S1 level and the T1 level than that of 4DPhAPPm. Moreover, N,N-diphenyl-N-[4-(4-phenyl-pyrimidin-6-yl)phenyl]phenyl-3-amine (abbreviation: 4pmDPhABPPm), N,N-diphenyl-N-[3-(4-phenyl-pyrimidin-6-yl)phenyl]phenyl-4-amine (abbreviation: 4mpDPhABPPm), and N,N-diphenyl-N-[3-(4-phenyl-pyrimidin-6-yl)phenyl]phenyl-3-amine (abbreviation: 4mDPhABPPm) each include a biphenyldiyl group including a m-phenylene group and have a smaller energy difference between the S1 level and the T1 level than those of 4DPhAPPm and 4DPhABPPm. In particular, 4mDPhABPPm, which includes a biphenyldiyl group including two m-phenylene groups, is further preferable because the energy difference between the S1 level and the T1 level is smaller than or equal to 0.1 eV. As shown in Table 2, as the energy difference between the S1 level and the T1 level is smaller, the T1 level becomes relatively high. As described later, when the T1 level of a single molecule is high, the T1 level of an excited complex becomes more stable than that of the single molecule, which is suitable for the structure of the present invention.

As shown in Chemical Formulae 3 and Table 3, 4-{3-[3'-(9H-carbazol-9-yl)]biphenyl-3-yl}benzofuro[3,2-d]pyrimidine (abbreviation: 4mCzBPBfpm) includes a biphenyldiyl group including a m-phenylene group and has an energy difference between the S1 level and the T1 level of 0.1 eV or smaller, which is smaller than that of 4-[4-(9H-carbazol-9-yl)phenyl]benzofuro[3,2-d]pyrimidine (abbreviation: 4CzPBfpm) including a p-phenylene group. As shown in Table 3, as the energy difference between the S1 level and the T1 level is smaller, the T1 level becomes relatively high. As described later, when the T1 level of a single molecule is high, the T1 level of an excited complex becomes more stable than that of the single molecule, which is suitable for the structure of the present invention.

As described above, it is preferable that, in the host material 131 of one embodiment of the present invention, a π-electron deficient heteroaromatic skeleton and at least one of a π-electron rich heteroaromatic skeleton and an aromatic amine skeleton be bonded to each other through a structure including at least one of a m-phenylene group and an o-phenylene group or through a biphenyldiyl group including at least one of a m-phenylene group and an o-phenylene group.

<<Quantum Chemistry Calculation 2>>

Next, energy levels and molecular orbitals of excited complexes (excited dimers) were calculated by quantum chemistry calculation.

First, compounds each including a single π-electron deficient heteroaromatic skeleton, a single π-electron rich heteroaromatic skeleton, or a single aromatic amine skeleton were subjected to calculation. Next, excited complexes (excited dimers) formed by combinations of two kinds of compounds selected from the above compounds were subjected to calculation. The structures and abbreviations of single compounds used in the calculation are shown below. In addition, Tables 4 and 5 show HOMO levels, LUMO levels, S1 levels, T1 levels, and energy differences between the S1 levels and the T1 levels (ΔS1−T1) of the single compounds and the excited complexes formed by combinations of two kinds of these compounds, which were obtained by the calculation.

[Chemical Formulae 4]

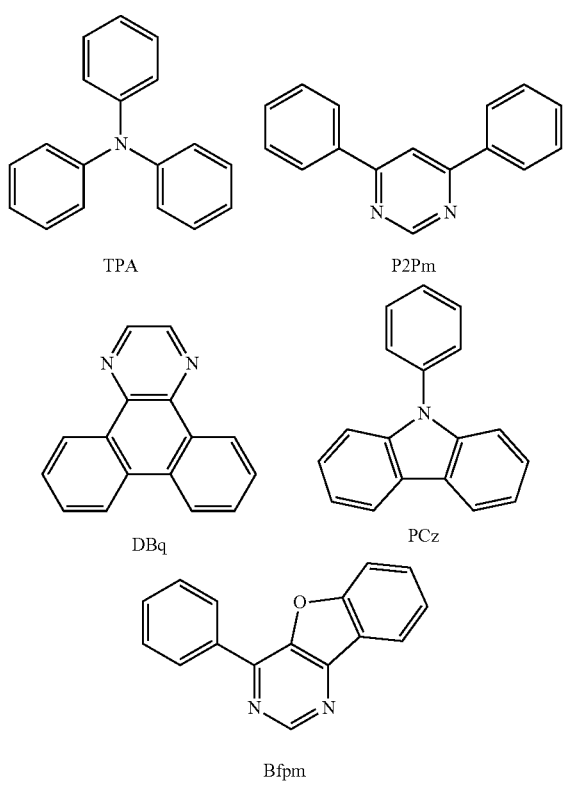

TPA      P2Pm

DBq      PCz

Bfpm

TABLE 4

| Abbreviation | HOMO level [eV] | LUMO level [eV] | S1 level [eV] | T1 level [eV] | ΔS1 − T1 [eV] |
|---|---|---|---|---|---|
| TPA | −5.05 | −1.11 | 3.11 | 2.61 | 0.50 |
| PCz | −5.54 | −1.23 | 3.68 | 2.51 | 1.17 |
| DBq | −6.37 | −2.00 | 3.32 | 2.46 | 0.86 |
| P2Pm | −6.29 | −2.14 | 2.98 | 2.33 | 0.65 |
| Bfpm | −6.38 | −2.28 | 2.94 | 2.23 | 0.71 |

TABLE 5

| Abbreviation | HOMO level [eV] | LUMO level [eV] | S1 level [eV] | T1 level [eV] | ΔS1 − T1 [eV] |
|---|---|---|---|---|---|
| TPA + DBq | −4.93 | −2.35 | 2.037 | 2.034 | 0.003 |
| TPA + P2Pm | −4.89 | −2.37 | 2.046 | 2.045 | 0.001 |
| PCz + Bfpm | −5.27 | −2.60 | 2.268 | 2.265 | 0.002 |

The calculating method is as follows. First, the optimal molecular structures in the lowest singlet excited state and the lowest triplet excited state of DBq, P2Pm, and Bfpm alone each including a π-electron deficient heteroaromatic skeleton, TPA alone including an aromatic amine skeleton, and PCz alone including a π-electron rich heteroaromatic skeleton were calculated, and the excitation energy levels and the molecular orbitals thereof were calculated using the time-dependent density functional theory (TD-DFT). Moreover, excited complexes formed by TPA and DBq, TPA and P2Pm, and PCz and Bfpm were subjected to calculation similarly. As a basis function, 6-311G (d,p) was used. As a functional, B3LYP was used.

Figure 2A:
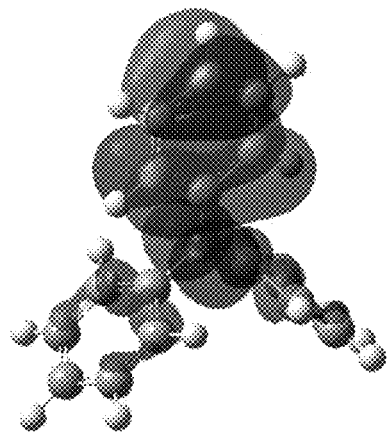
FIGS. 2A to 2F illustrate molecular orbitals of compounds of one embodiment of the present invention.
Figure 2B:
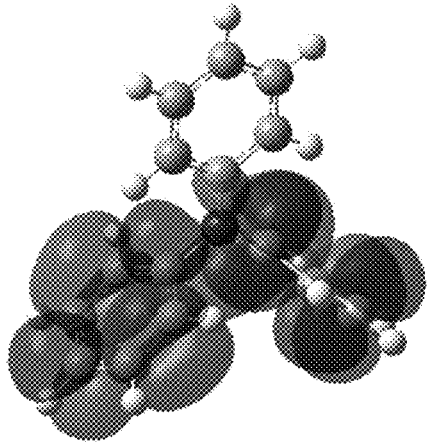
Figure 2C:
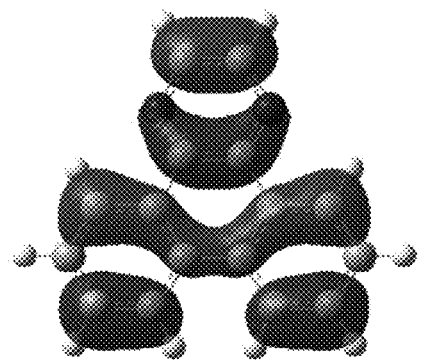
Figure 2D:
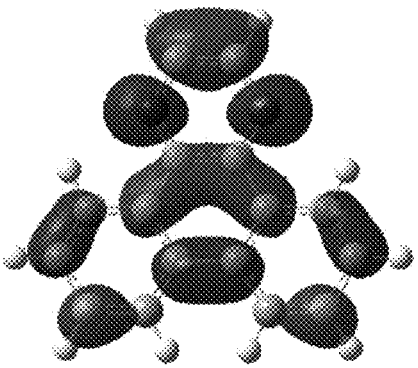
Figure 2E:
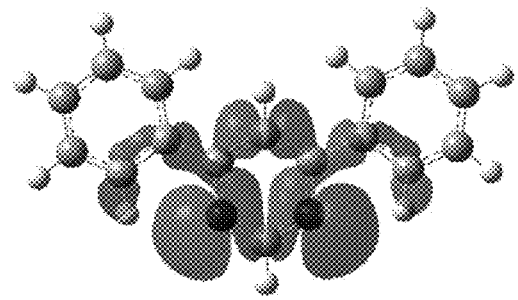
Figure 2F:
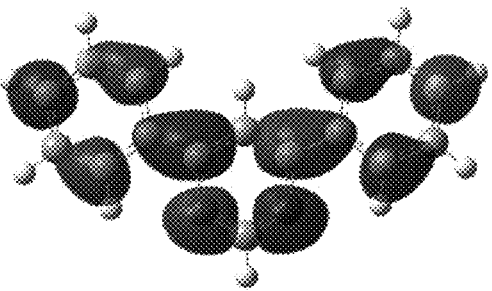
Figure 4A:
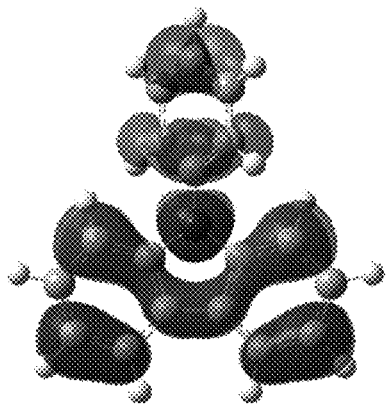
FIGS. 4A to 4F illustrate molecular orbitals of compounds and an excited complex of one embodiment of the present invention.
Figure 4B:
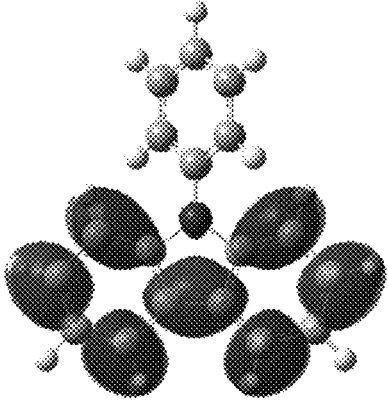
Figure 4C:
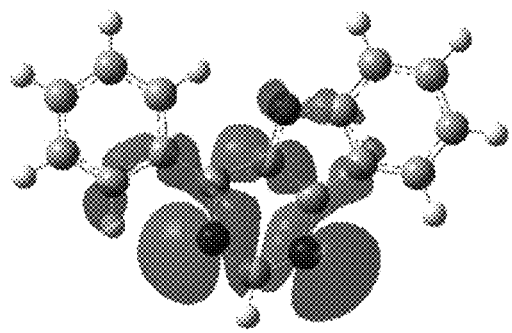
Figure 4D:
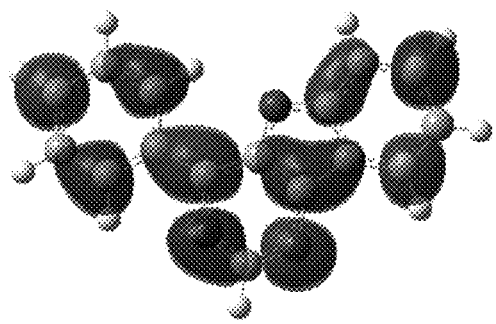

FIGS. 2A to 2F and FIGS. 4A to 4D show calculated distribution of the HOMOs and the LUMOs of single molecules of compounds. FIGS. 2A and 2B show distribution of the HOMO and the LUMO of TPA alone. FIGS. 2C and 2D show distribution of the HOMO and the LUMO of DBq alone. FIGS. 2E and 2F show distribution of the HOMO and the LUMO of P2Pm alone. FIGS. 4A and 4B show distribution of the HOMO and the LUMO of PCz alone. FIGS. 4C and 4D show distribution of the HOMO and the LUMO of Bfpm alone.

Distribution of the HOMO and distribution of the LUMO of TPA alone, distribution of the HOMO and distribution of the LUMO of DBq alone, distribution of the HOMO and distribution of the LUMO of P2Pm alone, distribution of the HOMO and distribution of the LUMO of PCz alone, and distribution of the HOMO and distribution of the LUMO of Bfpm alone have regions where the distribution of the HOMO and the distribution of the LUMO substantially overlap with each other. Thus, as shown in Table 4, the energy difference between the S1 level and the T1 level of each of the compounds is as large as 0.5 eV or more.

Figure 4E:
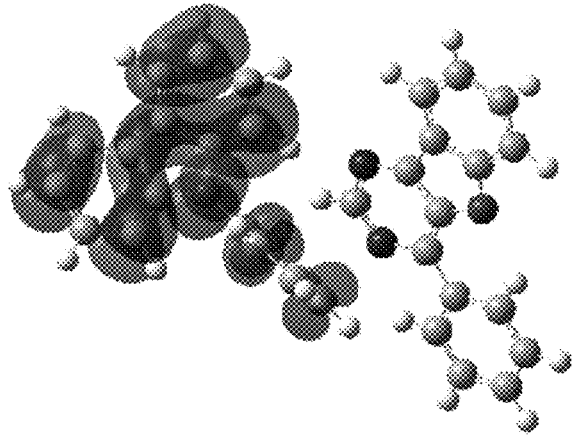
Figure 4F:
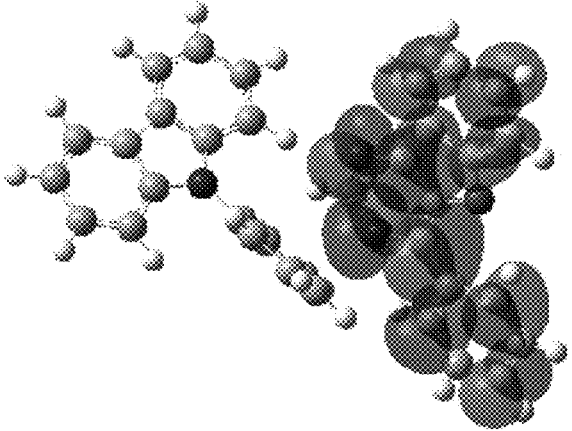

Next, distribution of the HOMOs and the LUMOs of the excited complexes formed by TPA and DBq, TPA and P2Pm, and PCz and Bfpm was calculated, and the results are shown in FIGS. 3A to 3D and FIGS. 4E and 4F. FIGS. 3A and 3B show distribution of the HOMO and the LUMO of the excited complex formed by TPA and DBq. FIGS. 3C and 3D show distribution of the HOMO and the LUMO of the excited complex formed by TPA and P2Pm. FIGS. 4E and 4F show distribution of the HOMO and the LUMO of the excited complex formed by PCz and Bfpm.

As shown in Tables 4 and 5 and FIGS. 3A and 3B, the HOMO of the excited complex formed by TPA and DBq is distributed in TPA having a higher HOMO level than DBq, and the LUMO of the excited complex is distributed in DBq having a lower LUMO level than TPA. Thus, the HOMO level of the excited complex formed by TPA and DBq is close to the HOMO level of TPA, and the LUMO level of the excited complex is close to the LUMO level of DBq. That is, TPA and DBq form a charge-transfer excited complex including the HOMO in TPA and the LUMO in DBq. The S1 level and the T1 level of the excited complex are lower than the S1 levels and the T1 levels of TPA alone and DBq alone and are stabilized. In addition, the HOMO and the LUMO of the excited complex formed by TPA and DBq hardly overlap with each other. Thus, the energy difference between the S1 level and the T1 level of the excited complex formed by TPA and DBq is smaller than or equal to 0.01 eV, which is extremely small.

As shown in Tables 4 and 5 and FIGS. 3C and 3D, the HOMO of the excited complex formed by TPA and P2Pm is distributed in TPA having a higher HOMO level than P2Pm, and the LUMO of the excited complex is distributed in P2Pm having a lower LUMO level than TPA. Thus, the HOMO level of the excited complex formed by TPA and P2Pm is close to the HOMO level of TPA, and the LUMO level of the excited complex is close to the LUMO level of P2Pm. That is, TPA and P2Pm form a charge-transfer excited complex including the HOMO in TPA and the LUMO in P2Pm. The S1 level and the T1 level of the excited complex are lower than the S1 levels and the T1 levels of TPA alone and P2Pm alone and are stabilized. In addition, the HOMO and the LUMO of the excited complex formed by TPA and P2Pm hardly overlap with each other. Thus, the energy difference between the S1 level and the T1 level of the excited complex formed by TPA and P2Pm is smaller than or equal to 0.01 eV, which is extremely small.

As shown in Tables 4 and 5 and FIGS. 4E and 4F, the HOMO of the excited complex formed by PCz and Bfpm is distributed in PCz having a higher HOMO level than Bfpm, and the LUMO of the excited complex is distributed in Bfpm having a lower LUMO level than PCz. Thus, the HOMO level of the excited complex formed by PCz and Bfpm is close to the HOMO level of PCz, and the LUMO level of the excited complex is close to the LUMO level of Bfpm. That is, PCz and Bfpm form a charge-transfer excited complex including the HOMO in PCz and the LUMO in Bfpm. The S1 level and the T1 level of the excited complex are lower than the S1 levels and the T1 levels of PCz alone and Bfpm alone and are stabilized. In addition, the HOMO and the LUMO of the excited complex formed by PCz and Bfpm hardly overlap with each other. Thus, the energy difference between the S1 level and the T1 level of the excited complex formed by PCz and Bfpm is smaller than or equal to 0.01 eV, which is extremely small.

<<Quantum Chemistry Calculation 3>>

Next, energy levels and molecular orbitals of excited complexes (charge-transfer excited dimers) using 2DPhAP-DBq, 2mDPhABPDBq, 4DPhAPPm, 4mDPhABPPm, 4CzPBfpm, and 4mCzBPBfpm of the compounds in Chemical Formulae 1 to 3 were calculated using quantum chemistry calculation to verify whether an excited complex is formed by two molecules having the same molecular structure. Table 6 shows S1 levels, T1 levels, and energy differences between the S1 levels and the T1 levels (ΔS1–T1) in the excited complexes. The calculation is performed in the following manner: the optimal molecular structures in the lowest singlet excited state and the lowest triplet excited state of the excited complexes were calculated, and the excitation energy levels and the molecular orbitals thereof were calculated using the time-dependent density functional theory (TD-DFT). As a basis function, 6-311G (d,p) was used, and as a functional, B3LYP was used.

TABLE 6

| Abbreviation | S1 level [eV] | T1 level [eV] | ΔS1 – T1 [eV] |
| --- | --- | --- | --- |
| 2DPhAPDBq (dimer) | 2.074 | 2.072 | 0.002 |
| 2mDPhABPDBq (dimer) | 1.995 | 1.991 | 0.003 |
| 4DPhAPPm (dimer) | 2.167 | 2.166 | 0.001 |
| 4mDPhABPPm (dimer) | 2.085 | 2.083 | 0.002 |
| 4CzPBfpm (dimer) | 2.189 | 2.188 | 0.001 |
| 4mCzBPBfpm (dimer) | 2.256 | 2.251 | 0.005 |

Figure 5A:
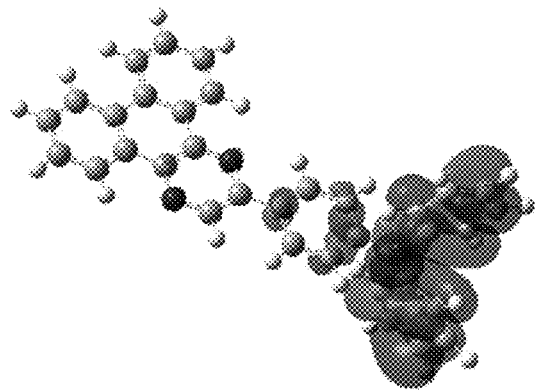
FIGS. 5A to 5D illustrate molecular orbitals of a compound and an excited complex of one embodiment of the present invention.
Figure 5B:
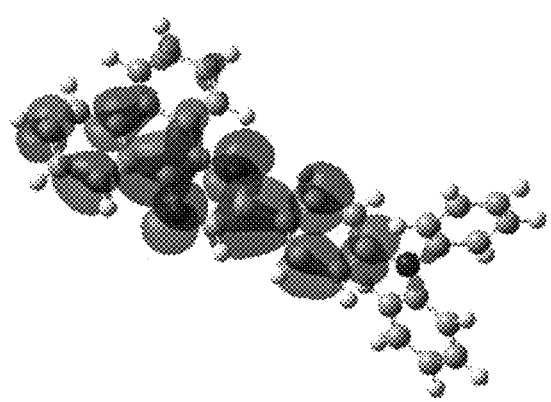
Figure 5C:
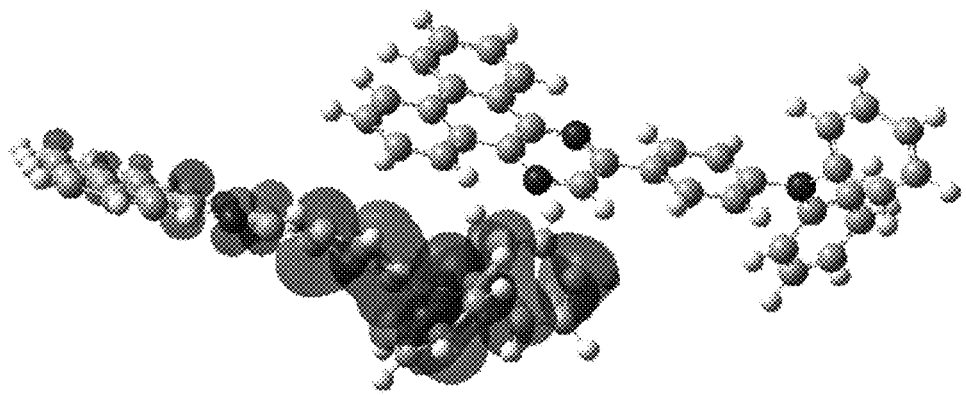
Figure 5D:
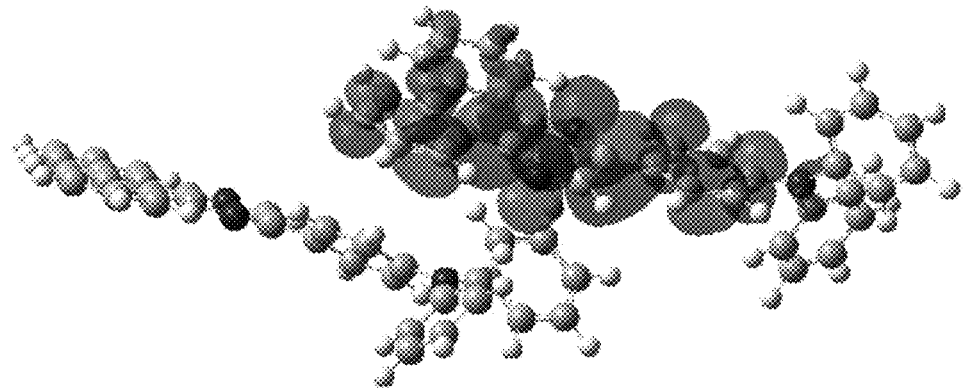
Figure 6A:
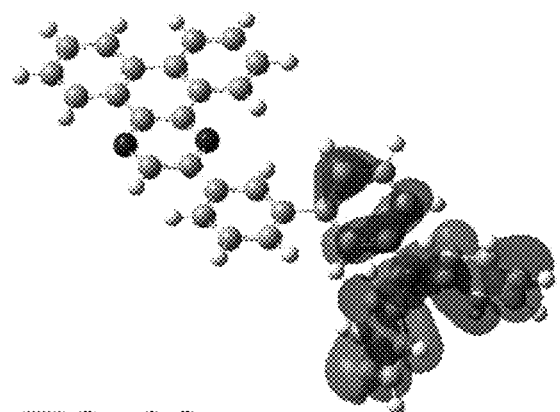
FIGS. 6A to 6D illustrate molecular orbitals of a compound and an excited complex of one embodiment of the present invention.
Figure 6B:
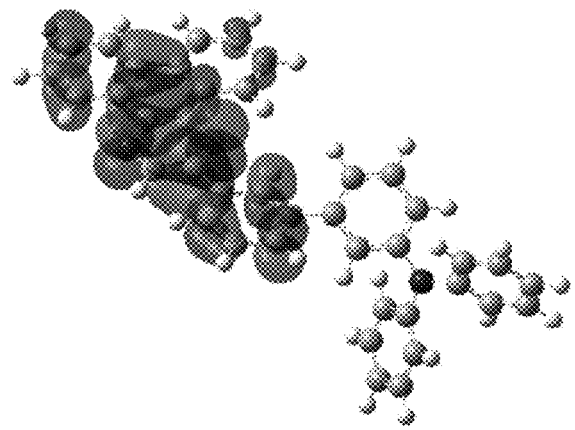
Figure 6C:
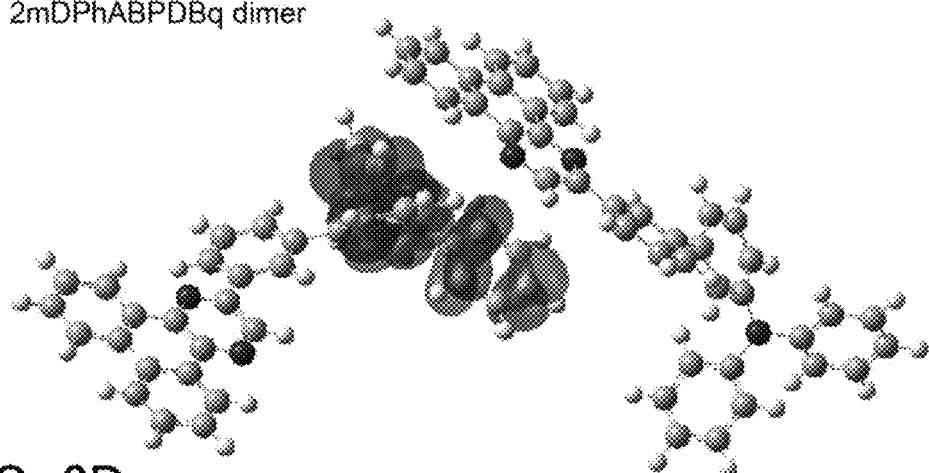
Figure 6D:
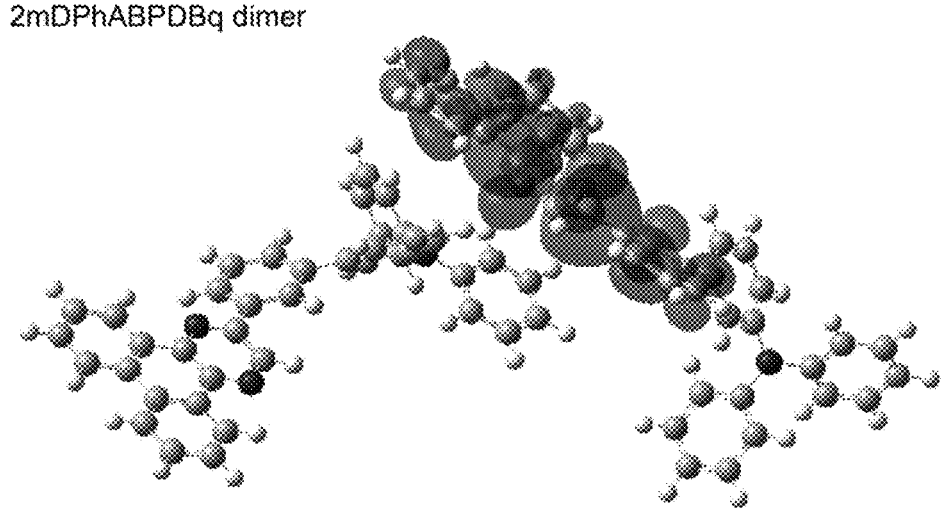
Figure 9A:
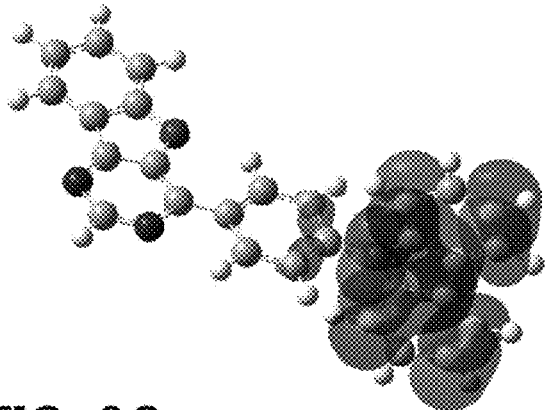
FIGS. 9A to 9D illustrate molecular orbitals of a compound and an excited complex of one embodiment of the present invention.
Figure 9B:
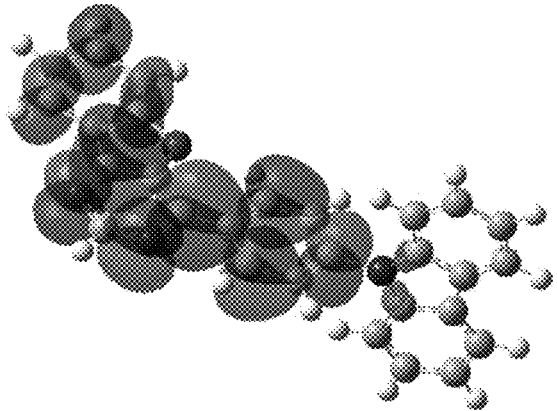
Figure 9C:
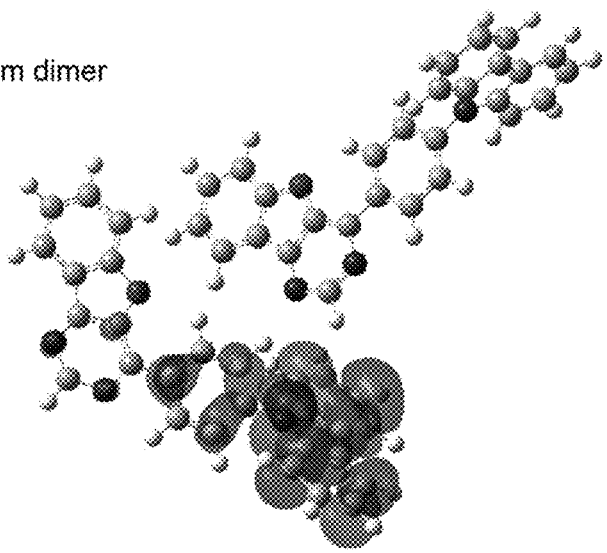
Figure 9D:
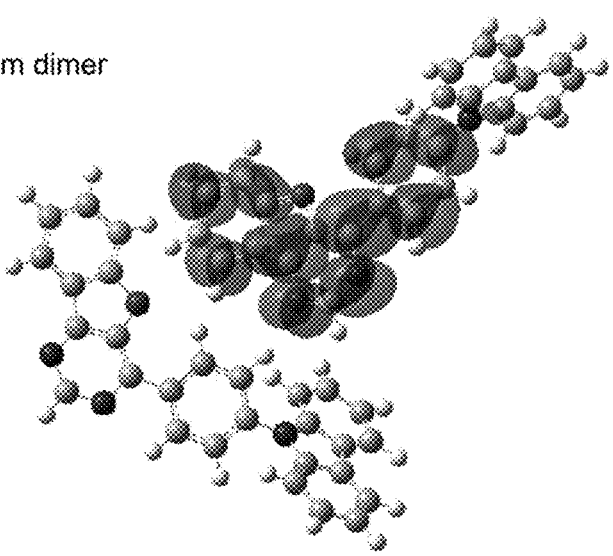
Figure 10A:
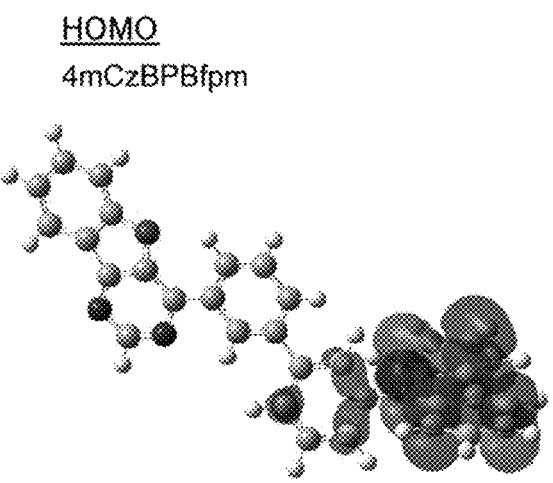
FIGS. 10A to 10D illustrate molecular orbitals of a compound and an excited complex of one embodiment of the present invention.
Figure 10B:
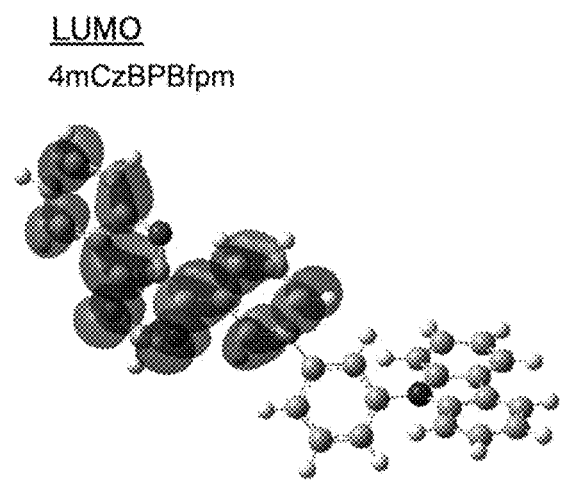
Figure 10C:
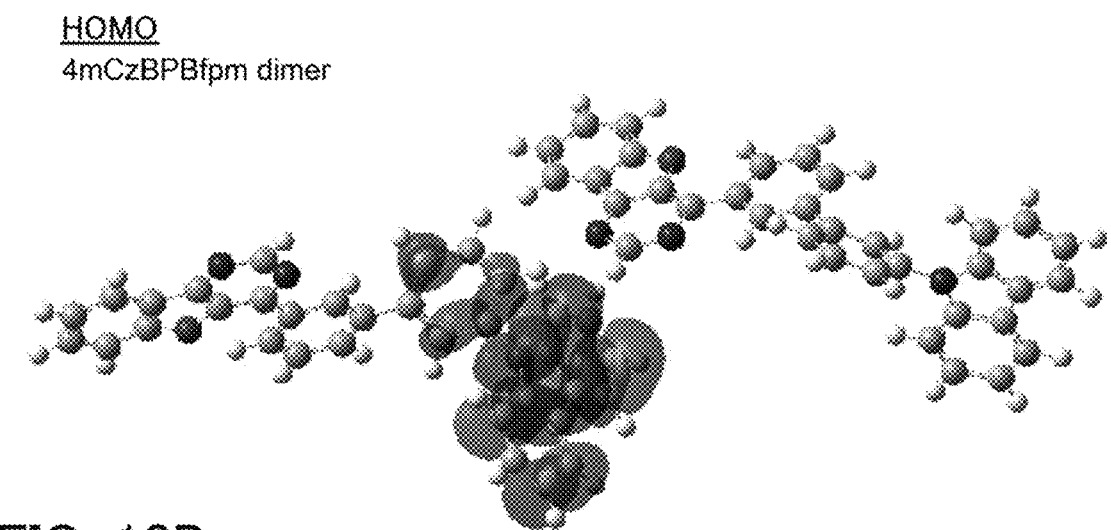
Figure 10D:
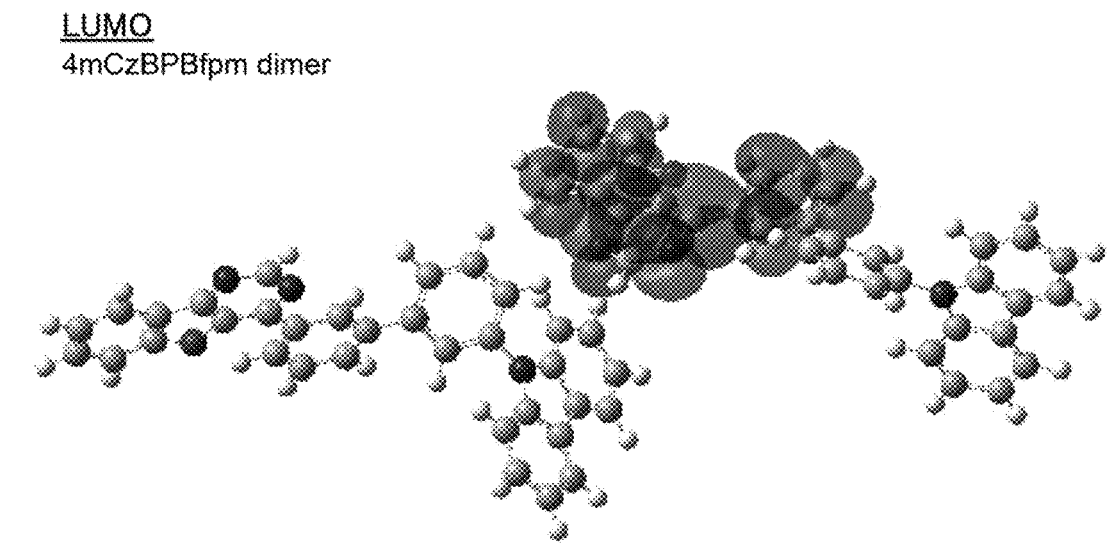

FIGS. 5A to 5D, FIGS. 6A to 6D, FIGS. 7A to 7D, FIGS. 8A to 8D, FIGS. 9A to 9D, and FIGS. 10A to 10D show calculated distribution of HOMOs and LUMOs. FIGS. 5A and 5B show distribution of the HOMO and the LUMO of 2DPhAPDBq alone. FIGS. 5C and 5D show distribution of the HOMO and the LUMO of an excited complex (excited dimer) formed by two molecules of 2DPhAPDBq. FIGS. 6A and 6B show distribution of the HOMO and the LUMO of 2mDPhABPDBq alone. FIGS. 6C and 6D show distribution of the HOMO and the LUMO of an excited complex (excited dimer) formed by two molecules of 2mDPhABPDBq. FIGS. 7A and 7B show distribution of the HOMO and the LUMO of 4DPhAPPm alone. FIGS. 7C and 7D show distribution of the HOMO and the LUMO of an excited complex (excited dimer) formed by two molecules of 4DPhAPPm. FIGS. 8A and 8B show distribution of the HOMO and the LUMO of 4mDPhABPPm alone. FIGS. 8C and 8D show distribution of the HOMO and the LUMO of an excited complex (excited dimer) formed by two molecules of 4mDPhABPPm. FIGS. 9A and 9B show distribution of the HOMO and the LUMO of 4CzPBfpm alone. FIGS. 9C and 9D show distribution of the HOMO and the LUMO of an excited complex (excited dimer) formed by two molecules of 4CzPBfpm. FIGS. 10A and 10B show distribution of the HOMO and the LUMO of 4mCzBPBfpm alone. FIGS. 10C and 10D show distribution of the HOMO and the LUMO of an excited complex (excited dimer) formed by two molecules of 4mCzBPBfpm.

As shown in FIGS. 5A and 5B, the HOMO of 2DPhAP-DBq alone is mainly distributed in TPA, and the LUMO thereof is mainly distributed in DBq. However, 2DPhAP-DBq has a structure in which a TPA skeleton is bonded to a DBq skeleton through the p-phenylene group; thus, the HOMO and the LUMO partly overlap with each other.

In contrast, as shown in FIGS. 6A and 6B, the HOMO of 2mDPhABPDBq alone is mainly distributed in TPA and the LUMO thereof is mainly distributed in DBq, and 2mDPhABPDBq has a structure in which a TPA skeleton is bonded to a DBq skeleton through the biphenyldiyl group including the m-phenylene group. Thus, the HOMO and the LUMO hardly overlap with each other, and the T1 level of 2mDPhABPDBq is higher than that of 2DPhAPDBq. The S1 level of 2mDPhABPDBq alone calculated using this calculation method is 2.390 eV, which is higher than the S1 level of the excited complex (excited dimer) of 2mDPhABPDBq. That is, when the excited complex is formed, the host material can be excited with lower excitation energy.

Furthermore, as shown in FIGS. 5C and 5D and FIGS. 6C and 6D, in each of the excited complexes (excited dimers) of 2DPhAPDBq and 2mDPhABPDBq, the HOMO is distributed in one molecule and the LUMO is distributed in the other molecule. That is, the charge-transfer excited state is formed by the two molecules of 2DPhAPDBq having the same molecular structure or the two molecules of 2mDPhABPDBq having the same molecular structure. Thus, the overlap between the HOMO and the LUMO of each of the excited complexes (excited dimers) is extremely small, and the energy difference between the S1 level and the T1 level is smaller than or equal to 0.01 eV, which is extremely small. In addition, the T1 level of the excited complex (excited dimer) of 2DPhAPDBq and the T1 level of the excited complex (excited dimer) of 2mDPhABPDBq are almost the same. On the other hand, the T1 level of 2mDPhABPDBq alone is higher than that of 2DPhAPDBq alone as shown in Table 1. That is, the difference between the T1 levels of the single molecule and the excited complex (excited dimer) of 2mDPhABPDBq is larger than that of 2DPhAPDBq. Therefore, the transfer of triplet excitation energy from the excited complex (excited dimer) to the single molecule can be effectively prevented, and thus, reverse intersystem crossing in the excited complex easily occurs and the light emission efficiency of the light-emitting element can be increased by ExEF mechanism.

In addition, as shown in FIGS. 7A and 7B, the HOMO of 4DPhAPPm alone is mainly distributed in TPA, and the LUMO thereof is mainly distributed in P2Pm. However, 4DPhAPPm has a structure in which a TPA skeleton is bonded to a P2Pm skeleton through the p-phenylene group; thus, the HOMO and the LUMO partly overlap with each other.

In contrast, as shown in FIGS. 8A and 8B, the HOMO of 4mDPhABPPm alone is mainly distributed in TPA and the LUMO thereof is mainly distributed in P2Pm, and 4mDPhABPPm has a structure in which a TPA skeleton is bonded to a P2Pm skeleton through the biphenyldiyl group including the m-phenylene group. Thus, the HOMO and the LUMO hardly overlap with each other, and the T1 level of 4mDPhABPPm is higher than that of 4DPhAPPm. The S1 level of 4mDPhABPPm alone calculated using this calculation method is 2.498 eV, which is higher than the S1 level of the excited complex (excited dimer) of 4mDPhABPPm. That is, when the excited complex is formed, the host material can be excited with lower excitation energy.

Furthermore, as shown in FIGS. 7C and 7D and FIGS. 8C and 8D, in each of the excited complexes (excited dimers) of 4DPhAPPm and 4mDPhABPPm, the HOMO is distributed in one molecule and the LUMO is distributed in the other molecule. That is, the charge-transfer excited state is formed by the two molecules of 4DPhAPPm having the same molecular structure or the two molecules of 4mDPhABPPm having the same molecular structure. Thus, the overlap between the HOMO and the LUMO of each of the excited complexes (excited dimers) is extremely small, and the energy difference between the S1 level and the T1 level is smaller than or equal to 0.01 eV, which is extremely small. In addition, the T1 level of the excited complex (excited dimer) of 4DPhAPPm and the T1 level of the excited complex (excited dimer) of 4mDPhABPPm are almost the same. On the other hand, the T1 level of 4mDPhABPPm alone is higher than that of 4DPhAPPm alone as shown in Table 2. That is, the difference between the T1 levels of the single molecule and the excited complex (excited dimer) of 4mDPhABPPm is larger than that of 4DPhAPPm. Therefore, the transfer of triplet excitation energy from the excited complex (excited dimer) to the single molecule can be effectively prevented, and thus, reverse intersystem crossing in the excited complex easily occurs and the light emission efficiency of the light-emitting element can be increased by ExEF mechanism.

In addition, as shown in FIGS. 9A and 9B, the HOMO of 4CzPBfpm alone is mainly distributed in PCz, and the LUMO thereof is mainly distributed in Bfpm. However, 4CzPBfpm has a structure in which a PCz skeleton is bonded to a Bfpm skeleton through the p-phenylene group; thus, the HOMO and the LUMO partly overlap with each other.

In contrast, as shown in FIGS. 10A and 10B, the HOMO of 4mCzBPBfpm alone is mainly distributed in PCz and the LUMO thereof is mainly distributed in Bfpm, and 4mCzBPBfpm has a structure in which a PCz skeleton is bonded to a Bfpm skeleton through the biphenyldiyl group including the m-phenylene group. Thus, the HOMO and the LUMO hardly overlap with each other, and the T1 level of 4mCzBPBfpm is higher than that of 4CzPBfpm. The S1 level of 4mCzBPBfpm alone calculated using this calculation method is 2.648 eV, which is higher than the S1 level of the excited complex (excited dimer) of 4mCzBPBfpm. That is, when the excited complex is formed, the host material can be excited with lower excitation energy.

Furthermore, as shown in FIGS. 9C and 9D and FIGS. 10C and 10D, in each of the excited complexes (excited dimers) of 4CzPBfpm and 4mCzBPBfpm, the HOMO is distributed in one molecule and the LUMO is distributed in the other molecule. That is, the charge-transfer excited state is formed by the two molecules of 4CzPBfpm having the same molecular structure or the two molecules of 4mCzBPBfpm having the same molecular structure. Thus, the overlap between the HOMO and the LUMO of each of the excited complexes (excited dimers) is extremely small, and the energy difference between the S1 level and the T1 level is smaller than or equal to 0.01 eV, which is extremely small. In addition, the T1 level of the excited complex (excited dimer) of 4CzPBfpm and the T1 level of the excited complex (excited dimer) of 4mCzBPBfpm are almost the same. On the other hand, the T1 level of 4mCzBPBfpm alone is higher than that of 4CzPBfpm alone as shown in Table 3. That is, the difference between the T1 levels of the single molecule and the excited complex (excited dimer) of 4mCzBPBfpm is larger than that of 4CzPBfpm. Therefore, the transfer of triplet excitation energy from the excited complex (excited dimer) to the single molecule can be effectively prevented, and thus, reverse intersystem crossing in the excited complex easily occurs and the light emission efficiency of the light-emitting element can be increased by ExEF mechanism.

In this manner, the excited complex is formed by the two molecules having the same molecular structure of the host material 131, whereby the energy difference between the S1 level and the T1 level can be extremely small. Thus, reverse intersystem crossing between the S1 level and the T1 level easily occurs, and the generation probability of the singlet excited state can be increased. At this time, as described above, when the group including the m-phenylene group is used, the energy difference between the S1 level and the T1 level of the single molecule is small and thus the T1 level of the single molecule is high, which is preferable for the reverse intersystem crossing.

<Energy Transfer Mechanism>

Next, factors controlling the processes of intermolecular energy transfer between the host material 131 and the guest material 132 will be described. As mechanisms of the intermolecular energy transfer, two mechanisms, i.e., Förster mechanism (dipole-dipole interaction) and Dexter mechanism (electron exchange interaction), have been proposed. Although the intermolecular energy transfer process between the host material 131 and the guest material 132 is described here, the same can apply to a case where the host material 131 forms an excited complex.

<<Förster Mechanism>>

In Förster mechanism, energy transfer does not require direct contact between molecules and energy is transferred through a resonant phenomenon of dipolar oscillation between the host material 131 and the guest material 132. By the resonant phenomenon of dipolar oscillation, the host material 131 provides energy to the guest material 132, and thus, the host material 131 in an excited state is brought to a ground state and the guest material 132 in a ground state is brought to an excited state. Note that the rate constant $k_{h^* \to g}$ of Förster mechanism is expressed by Formula (1).

$$k_{h^* \to g} = \frac{9000c^4 K^2 \phi \ln 10}{128\pi^5 n^4 N \tau R^6} \int \frac{f'_h(v) \varepsilon_g(v)}{v^4} dv \quad (1)$$

In Formula (1), v denotes a frequency, $f'_h(v)$ denotes a normalized emission spectrum of the host material 131 (a fluorescent spectrum in energy transfer from a singlet excited state, and a phosphorescent spectrum in energy transfer from a triplet excited state), $\varepsilon_g(v)$ denotes a molar absorption coefficient of the guest material 132, N denotes Avogadro's number, n denotes a refractive index of a medium, R denotes an intermolecular distance between the host material 131 and the guest material 132, τ denotes a measured lifetime of an excited state (fluorescence lifetime or phosphorescence lifetime), c denotes the speed of light, ϕ) denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host material 131 and the guest material 132. Note that $K^2$ is 2/3 in random orientation.

<<Dexter Mechanism>>

In Dexter mechanism, the host material 131 and the guest material 132 are close to a contact effective range where their orbitals overlap, and the host material 131 in an excited state and the guest material 132 in a ground state exchange their electrons, which leads to energy transfer. Note that the rate constant $k_{h^* \to g}$ of Dexter mechanism is expressed by Formula (2).

$$k_{h^* \to g} = \left(\frac{2\pi}{h}\right) K^2 \exp\left(-\frac{2R}{L}\right) \int f'_h(v) \varepsilon'_g(v) dv \quad (2)$$

In Formula (2), h denotes a Planck constant, K denotes a constant having an energy dimension, v denotes a frequency, $f'_h(v)$ denotes a normalized emission spectrum of the host material 131 (a fluorescent spectrum in energy transfer from a singlet excited state, and a phosphorescent spectrum in energy transfer from a triplet excited state), $\varepsilon'_g(v)$ denotes a normalized absorption spectrum of the guest material 132, L denotes an effective molecular radius, and R denotes an intermolecular distance between the host material 131 and the guest material 132.

Here, the efficiency of energy transfer from the host material 131 to the guest material 132 (energy transfer efficiency $\phi_{ET}$) is expressed by Formula (3). In the formula, $k_r$ denotes a rate constant of a light-emission process (fluorescence in energy transfer from a singlet excited state, and phosphorescence in energy transfer from a triplet excited state) of the host material 131, $k_n$ denotes a rate constant of a non-light-emission process (thermal deactivation or intersystem crossing) of the host material 131, and τ denotes a measured lifetime of an excited state of the host material 131.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\phi_{ET}$ can be increased by increasing the rate constant $k_{h^* \to g}$ of energy transfer so that another competing rate constant $k_r + k_n (=1/\tau)$ becomes relatively small.

<<Concept for Promoting Energy Transfer>>

First, energy transfer by Förster mechanism is considered. When Formula (1) is substituted into Formula (3), τ can be eliminated. Thus, in Förster mechanism, the energy transfer efficiency $\phi_{ET}$ does not depend on the lifetime τ of the excited state of the host material 131. In addition, it can be said that the energy transfer efficiency $\phi_{ET}$ is higher when the luminescence quantum yield ϕ (here, the fluorescence quantum yield because energy transfer from a singlet excited state is discussed) is higher. In general, the luminescence quantum yield of an organic compound in a triplet excited state is extremely low at room temperature. Thus, in the case where the host material 131 is in a triplet excited state, a process of energy transfer by Förster mechanism can be ignored, and a process of energy transfer by Förster mechanism is considered only in the case where the host material 131 is in a singlet excited state.

Furthermore, it is preferable that the emission spectrum (the fluorescent spectrum in the case where energy transfer from a singlet excited state is discussed) of the host material 131 largely overlap with the absorption spectrum (absorption corresponding to the transition from the singlet ground state to the singlet excited state) of the guest material 132. Moreover, it is preferable that the molar absorption coefficient of the guest material 132 be also high. This means that the emission spectrum of the host material 131 overlaps with the absorption band of the guest material 132 which is on the longest wavelength side. Since direct transition from the singlet ground state to the triplet excited state of the guest material 132 is forbidden, the molar absorption coefficient of the guest material 132 in the triplet excited state can be ignored. Thus, a process of energy transfer to a triplet excited state of the guest material 132 by Förster mechanism can be ignored, and only a process of energy transfer to a singlet excited state of the guest material 132 is considered. That is, in Förster mechanism, a process of energy transfer from the singlet excited state of the host material 131 to the singlet excited state of the guest material 132 is considered.

Next, energy transfer by Dexter mechanism is considered. According to Formula (2), in order to increase the rate constant $k_{h^* \to g}$, it is preferable that an emission spectrum of the host material 131 (a fluorescent spectrum in the case where energy transfer from a singlet excited state is discussed) largely overlap with an absorption spectrum of the guest material 132 (absorption corresponding to transition from a singlet ground state to a singlet excited state). Therefore, the energy transfer efficiency can be optimized by making the emission spectrum of the host material 131 overlap with the absorption band of the guest material 132 which is on the longest wavelength side.

When Formula (2) is substituted into Formula (3), it is found that the energy transfer efficiency $\phi_{ET}$ in Dexter mechanism depends on τ. In Dexter mechanism, which is a process of energy transfer based on the electron exchange, as well as the energy transfer from the singlet excited state of the host material 131 to the singlet excited state of the guest material 132, energy transfer from the triplet excited state of the host material 131 to the triplet excited state of the guest material 132 occurs.

In the light-emitting element of one embodiment of the present invention in which the guest material 132 is a fluorescent compound, the efficiency of energy transfer to the triplet excited state of the guest material 132 is preferably low. That is, the energy transfer efficiency based on Dexter mechanism from the host material 131 to the guest material 132 is preferably low and the energy transfer efficiency based on Förster mechanism from the host material 131 to the guest material 132 is preferably high.

As described above, the energy transfer efficiency in Förster mechanism does not depend on the lifetime τ of the excited state of the host material 131. In contrast, the energy transfer efficiency in Dexter mechanism depends on the excitation lifetime τ of the host material 131. Thus, to reduce the energy transfer efficiency in Dexter mechanism, the excitation lifetime τ of the host material 131 is preferably short.

In a manner similar to that of the energy transfer from the host material 131 to the guest material 132, the energy transfer by both Förster mechanism and Dexter mechanism also occurs in the energy transfer process from the excited complex to the guest material 132.

Accordingly, one embodiment of the present invention provides a light-emitting element including the host material 131 in which two molecules form an excited complex which functions as an energy donor capable of efficiently transferring energy to the guest material 132. The excited complex formed by the two molecules in the host material 131 has a singlet excitation energy level and a triplet excitation energy level which are close to each other; accordingly, transition from a triplet exciton generated in the light-emitting layer 130 to a singlet exciton (reverse intersystem crossing) is likely to occur. This can increase the efficiency of generating singlet excitons in the light-emitting layer 130. Furthermore, in order to facilitate energy transfer from the singlet excited state of the excited complex to the singlet excited state of the guest material 132 serving as an energy acceptor, it is preferable that the emission spectrum of the excited complex overlap with the absorption band of the guest material 132 which is on the longest wavelength side (lowest energy side). Thus, the efficiency of generating the singlet excited state of the guest material 132 can be increased.

In addition, fluorescence lifetime of a thermally activated delayed fluorescence component in light emitted from the excited complex is preferably short, and specifically, preferably 10 ns or longer and 50 μs or shorter, further preferably 10 ns or longer and 30 μs or shorter.

The proportion of a thermally activated delayed fluorescence component in the light emitted from the excited complex is preferably high. Specifically, the proportion of a thermally activated delayed fluorescence component in the light emitted from the excited complex is preferably higher than or equal to 5%, further preferably higher than or equal to 10%.

<Material>

Next, components of a light-emitting element of one embodiment of the present invention are described in detail below.

<<Light-Emitting Layer>>

Next, materials that can be used for the light-emitting layer 130 will be described below.

In the light-emitting layer 130, the host material 131 is present in the largest proportion by weight, and the guest material 132 (the fluorescent compound) is dispersed in the host material 131. The S1 level of the host material 131 in the light-emitting layer 130 is preferably higher than the S1 level of the guest material 132 (the fluorescent compound) in the light-emitting layer 130. The T1 level of the host material 131 in the light-emitting layer 130 is preferably higher than the T1 level of the guest material 132 (the fluorescent compound) in the light-emitting layer 130.

The host material 131 in the light-emitting layer 130 is not particularly limited as long as two molecules of the host material 131 have a function of forming an excited complex; however, the host material 131 preferably includes a π-electron deficient heteroaromatic skeleton and at least one of a π-electron rich heteroaromatic skeleton and an aromatic amine skeleton.

As the aromatic amine skeleton included in the host material 131, tertiary amine not including an NH bond, in particular, a triarylamine skeleton is preferably used. As an aryl group of a triarylamine skeleton, a substituted or unsubstituted aryl group having 6 to 13 carbon atoms included in a ring is preferably used and examples thereof include a phenyl group, a naphthyl group, and a fluorenyl group.

As the π-electron rich heteroaromatic skeleton included in the host material 131, one or more of a furan skeleton, a thiophene skeleton, and a pyrrole skeleton are preferable because of their high stability and reliability. As a furan skeleton, a dibenzofuran skeleton is preferable. As a thiophene skeleton, a dibenzothiophene skeleton is preferable. Note that as a pyrrole skeleton, an indole skeleton or a carbazole skeleton, in particular, a 3-(9-phenyl-9H-carbazol-3-yl)-9H-carbazole skeleton is preferable. Each of these skeletons may further have a substituent.

As examples of the above-described aromatic amine skeleton and π-electron rich heteroaromatic skeleton, skeletons represented by the following general formulae (101) to (115) are given. Note that X in the general formulae (113) to (115) represents an oxygen atom or a sulfur atom.

[Chemical Formulae 5]

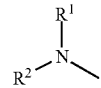

(101)

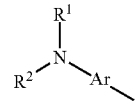

(102)

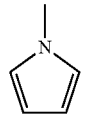

(103)

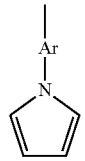

(104)

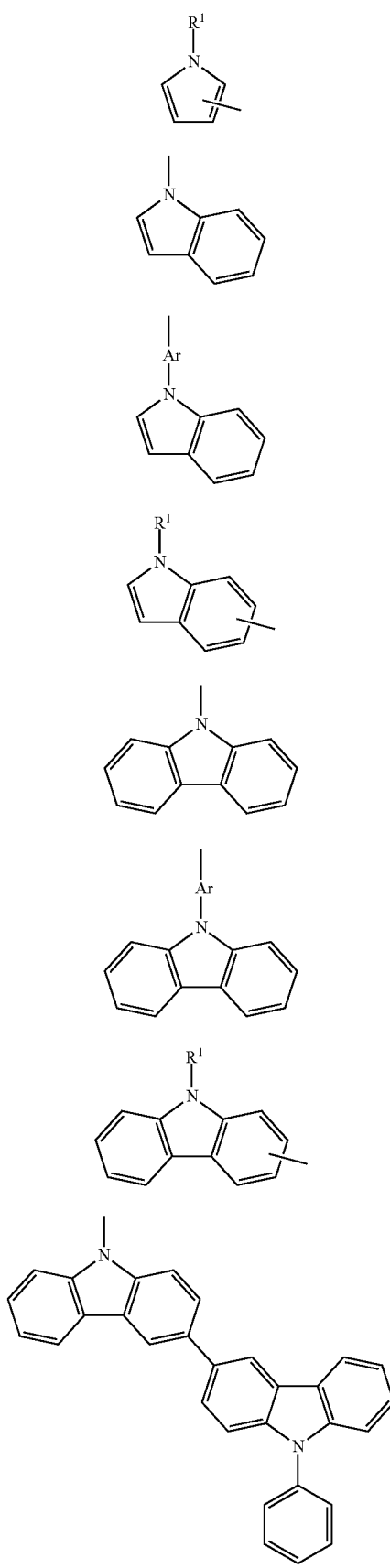

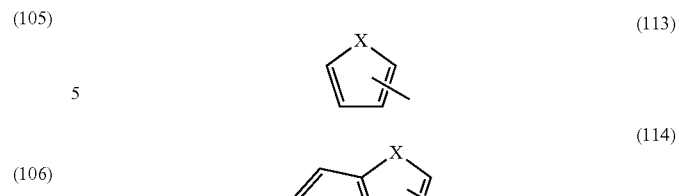

In addition, as the π-electron deficient heteroaromatic skeleton, a pyridine skeleton, a diazine skeleton (a pyrimidine skeleton, a pyrazine skeleton, or a pyridazine skeleton), or a triazine skeleton is preferable; in particular, the diazine skeleton or the triazine skeleton is preferable because of its high stability and reliability.

As examples of the above-described π-electron deficient heteroaromatic skeleton, skeletons represented by the following general formulae (201) to (218) are given.

[Chemical Formulae 6]

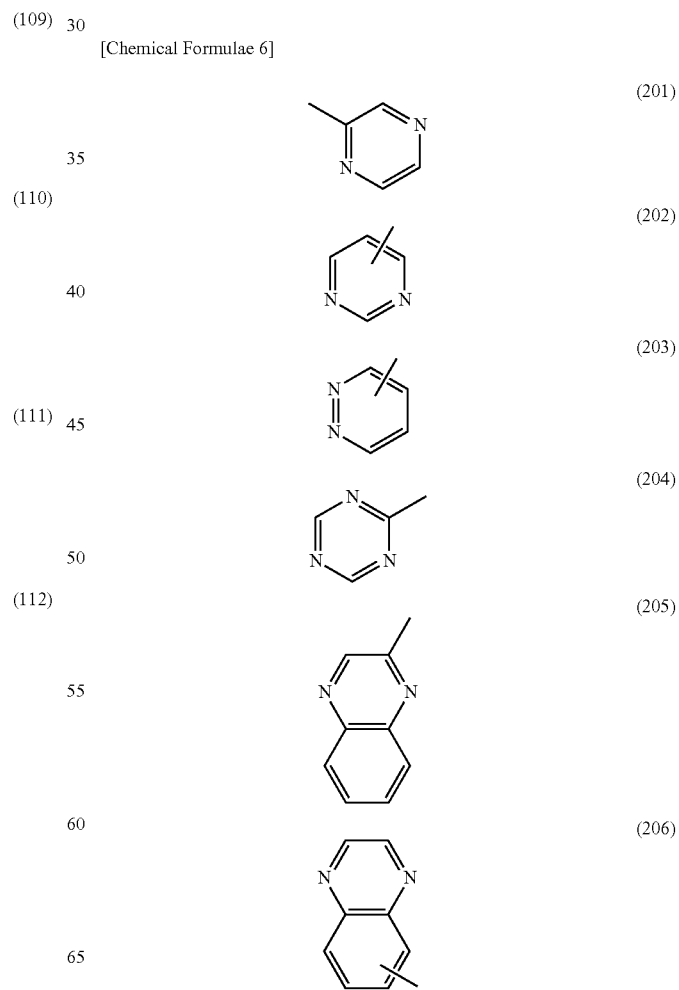

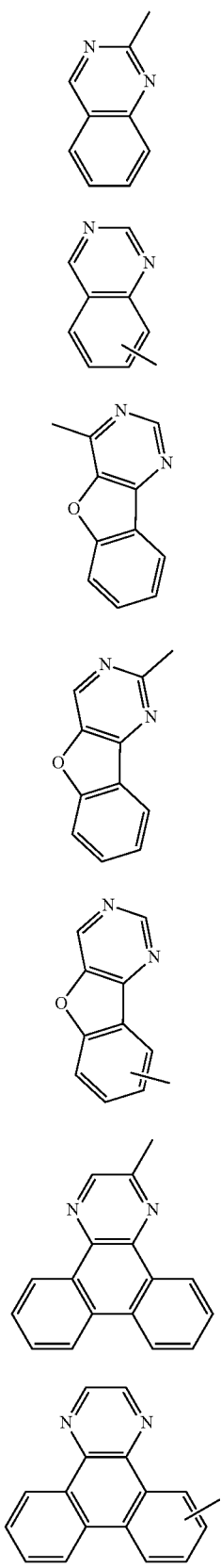

(207)
(208)
(209)
(210)
(211)
(212)
(213)

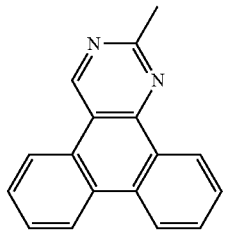

(214)
(215)

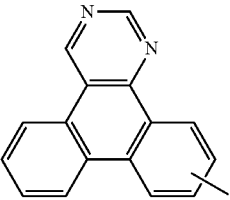

(216)

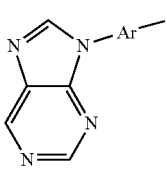

(217)

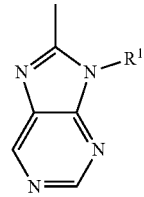

(218)

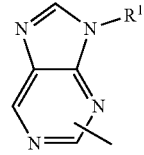

In addition, a skeleton having a hole-transport property (e.g., at least one of the π-electron rich heteroaromatic skeleton and the aromatic amine skeleton) and a skeleton having an electron-transport property (e.g., the π-electron deficient heteroaromatic skeleton) are preferably bonded to each other through a structure including at least one of a m-phenylene group and an o-phenylene group or a structure where an arylene group and at least one of the m-phenylene group and the o-phenylene group are bonded to each other. Alternatively, the skeleton having a hole-transport property and the skeleton having an electron-transport property are preferably bonded to each other through a biphenyldiyl group. Examples of the above-described arylene group include a phenylene group, a biphenyldiyl group, a naphthalenediyl group, a fluorenediyl group, a 9,10-dihydroanthracenediyl group, and a phenanthrenediyl group.

As examples of a bonding group which bonds the above-described skeleton having a hole-transport property and skeleton having an electron-transport property, groups represented by the following general formulae (301) to (315) are given.

[Chemical Formulae 7]
(301) 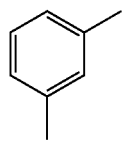
(302) 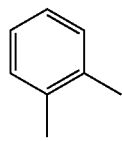
(303) 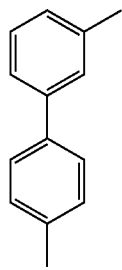
(304) 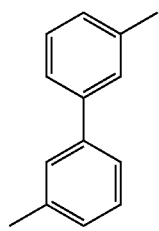
(305) 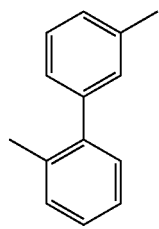
(306) 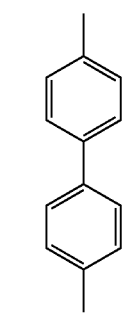
(307) 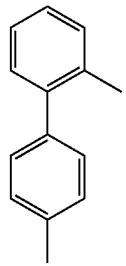
(308) 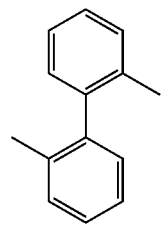
(309) 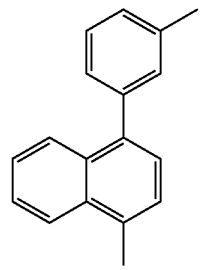
(310) 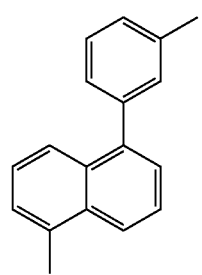
(311) 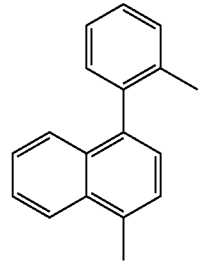
(312) 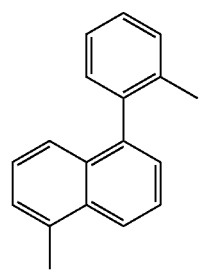

(313)

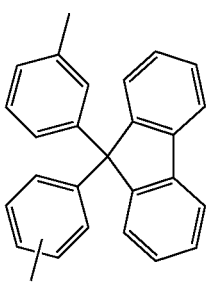

(314)

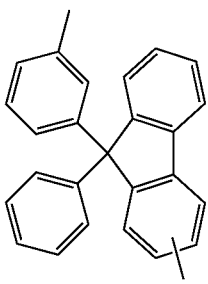

(315)

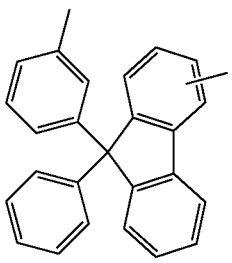

The above-described aromatic amine skeleton (e.g., the triarylamine skeleton), π-electron rich heteroaromatic skeleton (e.g., a ring including the furan skeleton, the thiophene skeleton, or the pyrrole skeleton), and π-electron deficient heteroaromatic skeleton (e.g., a ring including the pyridine skeleton, the diazine skeleton, or the triazine skeleton) or the above-described general formulae (101) to (115), general formulae (201) to (218), and general formulae (301) to (315) may each have a substituent. As the substituent, an alkyl group having 1 to 6 carbon atoms, a cycloalkyl group having 3 to 6 carbon atoms, or a substituted or unsubstituted aryl group having 6 to 12 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like. The above substituents may be bonded to each other to form a ring. For example, in the case where a carbon atom at the 9-position in a fluorene skeleton has two phenyl groups as substituents, the phenyl groups are bonded to form a spirofluorene skeleton. Note that an unsubstituted group has an advantage in easy synthesis and an inexpensive raw material.

Furthermore, Ar represents an arylene group having 6 to 13 carbon atoms. The arylene group may include one or more substituents and the substituents may be bonded to each other to form a ring. For example, a carbon atom at the 9-position in a fluorenyl group has two phenyl groups as substituents and the phenyl groups are bonded to form a spirofluorene skeleton. Specific examples of the arylene group having 6 to 13 carbon atoms are a phenylene group, a naphthalenediyl group, a biphenyldiyl group, a fluorenediyl group, and the like. In the case where the arylene group has a substituent, as the substituent, an alkyl group having 1 to 6 carbon atoms, a cycloalkyl group having 3 to 6 carbon atoms, or an aryl group having 6 to 12 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like.

As the arylene group represented by Ar, for example, groups represented by structural formulae (Ar-1) to (Ar-18) below can be used. Note that the group that can be used as Ar is not limited to these.

[Chemical Formulae 8]

(Ar-1)

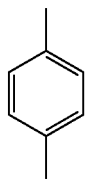

(Ar-2)

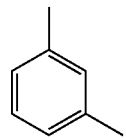

(Ar-3)

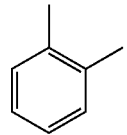

(Ar-4)

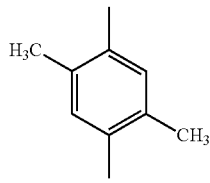

(Ar-5)

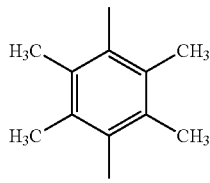

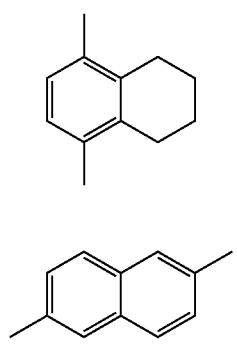
(Ar-6)
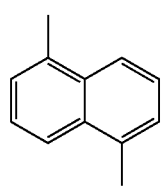
(Ar-7)
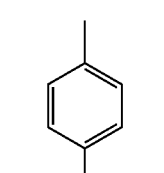
(Ar-8)
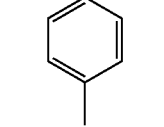
(Ar-9)
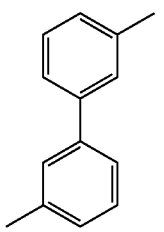
(Ar-10)
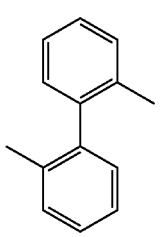
(Ar-11)
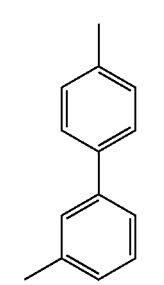
(Ar-12)
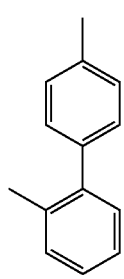
(Ar-13)
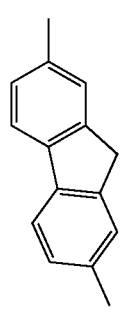
(Ar-14)
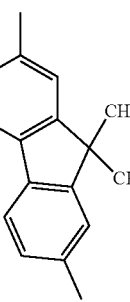
(Ar-15)
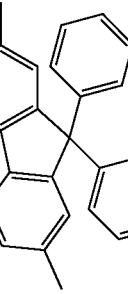
(Ar-16)
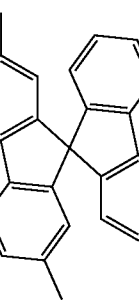
(Ar-17)

-continued (Ar-18)

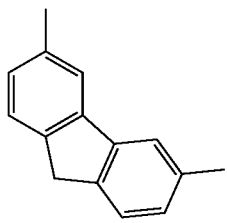

Furthermore, $R^1$ and $R^2$ each independently represent any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms are a phenyl group, a naphthyl group, a biphenyl group, a fluorenyl group, and the like. The above aryl group or phenyl group may include one or more substituents, and the substituents may be bonded to each other to form a ring. As the substituent, an alkyl group having 1 to 6 carbon atoms, a cycloalkyl group having 3 to 6 carbon atoms, or an aryl group having 6 to 12 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms include a phenyl group, a naphthyl group, a biphenyl group, and the like.

For example, groups represented by structural formulae (R-1) to (R-29) below can be used as the alkyl group or aryl group represented by $R^1$ and $R^2$. Note that the groups which can be used as an alkyl group or an aryl group are not limited thereto.

[Chemical Formulae 9]

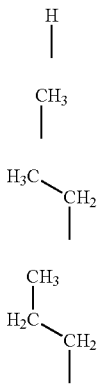

(R-1)

(R-2)

(R-3)

(R-4)

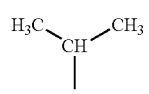 (R-5)

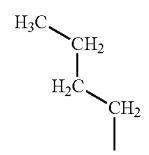 (R-6)

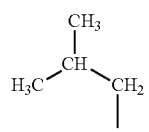 (R-7)

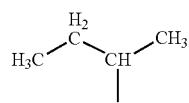 (R-8)

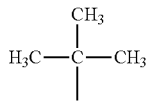 (R-9)

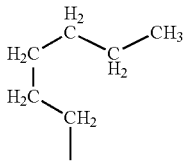 (R-10)

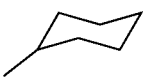 (R-11)

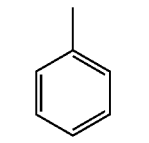 (R-12)

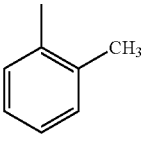 (R-13)

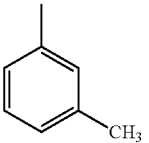 (R-14)

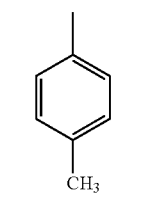 (R-15)

(R-16) 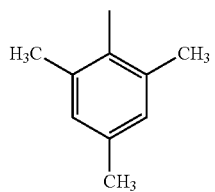
(R-17) 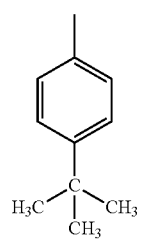
(R-18) 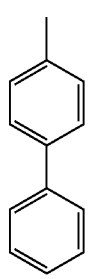
(R-19) 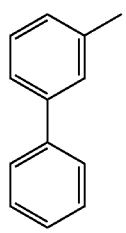
(R-20) 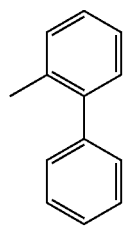
(R-21) 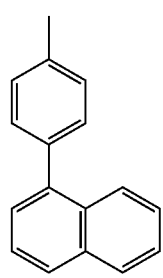
(R-22) 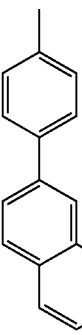
(R-23) 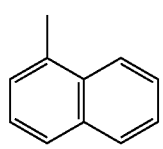
(R-24) 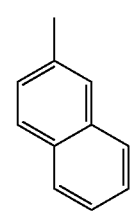
(R-25) 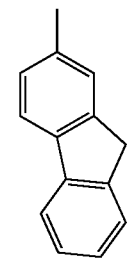
(R-26) 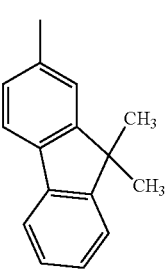
(R-27) 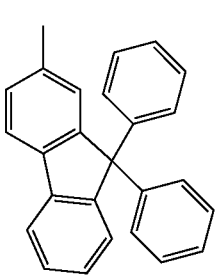

(R-28)
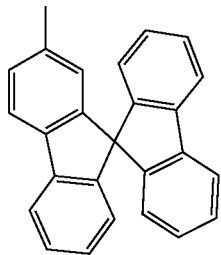

(R-29)
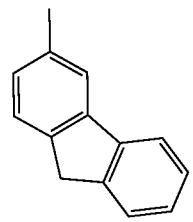

As a substituent that can be included in the general formulae (101) to (115), the general formulae (201) to (218), the general formulae (301) to (315), Ar, $R^1$, and $R^2$, the alkyl group or aryl group represented by the above structural formulae (R-1) to (R-24) can be used, for example. Note that the group which can be used as an alkyl group or an aryl group is not limited thereto.

In the light-emitting layer 130, the guest material 132 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[i]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[i]quinolizin-9-ypethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[i]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd: 1',2',3'-lm]perylene.

As described above, the energy transfer efficiency based on Dexter mechanism from the host material 131 (or the excited complex) to the guest material 132 is preferably low. The rate constant of Dexter mechanism is inversely proportional to the exponential function of the distance between the two molecules. Thus, when the distance between the two molecules is approximately 1 nm or less, Dexter mechanism is dominant, and when the distance is approximately 1 nm or more, Förster mechanism is dominant. To reduce the energy transfer efficiency in Dexter mechanism, the distance between the host material 131 and the guest material 132 is preferably large, and specifically, 0.7 nm or more, preferably 0.9 nm or more, further preferably 1 nm or more. In view of the above, the guest material 132 preferably has a substituent that prevents the proximity to the host material 131. The substituent is preferably aliphatic hydrocarbon, further preferably an alkyl group, still further preferably a branched alkyl group. Specifically, the guest material 132 preferably includes at least two alkyl groups each having 2 or more carbon atoms. Alternatively, the guest material 132 preferably includes at least two branched alkyl groups each having 3 to 10 carbon atoms. Alternatively, the guest material 132 preferably includes at least two cycloalkyl groups each having 3 to 10 carbon atoms.

The light-emitting layer 130 may include another material in addition to the host material 131 and the guest material 132. For example, any of the following hole-transport materials and electron-transport materials can be used.

A material having a property of transporting more holes than electrons can be used as the hole-transport material, and a material having a hole mobility of $1 \times 10^{-6}$ $cm^2/Vs$ or higher is preferable. Specifically, an aromatic amine, a carbazole derivative, an aromatic hydrocarbon, a stilbene derivative, or the like can be used. Furthermore, the hole-transport material may be a high molecular compound.

Examples of the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis {4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylene-2-yl)phenyl]dibenzothiophene (abbreviation: mDBTPTp-II). The substances described here are mainly substances having a hole mobility of $1 \times 10^{-6}$ cm$^2$/Vs or higher. Note that other than these substances, any substance that has a property of transporting more holes than electrons may be used.

As the electron-transport material, a material having a property of transporting more electrons than holes can be used, and a material having an electron mobility of $1\times10^{-6}$ cm$^2$/Vs or higher is preferable. A π-electron deficient heteroaromatic compound such as a nitrogen-containing heteroaromatic compound, a metal complex, or the like can be used as the material which easily accepts electrons (the material having an electron-transport property). Specific examples include a metal complex having a quinoline ligand, a benzoquinoline ligand, an oxazole ligand, or a thiazole ligand, an oxadiazole derivative, a triazole derivative, a phenanthroline derivative, a pyridine derivative, a bipyridine derivative, a pyrimidine derivative, and the like.

Examples include metal complexes having a quinoline or benzoquinoline skeleton, such as tris(8-quinolinolato)aluminum(III) (abbreviation: Alq), tris(4-methyl-8-quinolinolato) aluminum(III) (abbreviation: Almq$_3$), bis(10-hydroxybenzo [h]quinolinato)beryllium(II) (abbreviation: BeBq$_2$), bis(2-methyl-8-quinolinolato)(4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(biphenyl-4-yl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl] dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h] quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl) phenyl]dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl) phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl) phenyl]pyridine (abbreviation: 35DCzPPy); and heteroaromatic compounds such as 4,4'-bis(5-methylbenzoxazol-2-yl) stilbene (abbreviation: BzOs). Among the heterocyclic compounds, the heterocyclic compounds having diazine skeletons (pyrimidine, pyrazine, pyridazine) or having a pyridine skeleton are highly reliable and stable and is thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6, 6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

In addition, the light-emitting layer 130 may contain a thermally activated delayed fluorescent emitter in addition to the host material 131 and the guest material 132. Alternatively, a material having a function of exhibiting thermally activated delayed fluorescence at room temperature is preferably contained. Note that a thermally activated delayed fluorescent emitter is a material which can generate a singlet excited state from a triplet excited state by reverse intersystem crossing by thermal activation. The thermally activated delayed fluorescent emitter may contain a material which can generate a singlet excited state by itself from a triplet excited state by reverse intersystem crossing, for example, a TADF material. Such a material preferably has a difference between the singlet excitation energy level and the triplet excitation energy level of larger than 0 eV and smaller than or equal to 0.2 eV.

As the TADF material serving as the thermally activated delayed fluorescent emitter, for example, any of the following materials can be used.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)).

As the thermally activated delayed fluorescence material composed of one kind of material, a heterocyclic compound having a π-electron rich heteroaromatic ring and a π-electron deficient heteroaromatic ring can be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazine-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro [acridin-9,9'-anthracen]-10'-one (abbreviation: ACRSA), can be used. The heterocyclic compound is preferable because of having the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the singlet excitation energy level and the triplet excitation energy level becomes small.

Alternatively, the thermally activated delayed fluorescent material may contain a combination of two kinds of materials which form an excited complex. As the combination of two kinds of materials, a combination of the above-described hole-transport material and electron-transport material is preferable. Specifically, a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, or the like can be used. Other examples are an aromatic amine and a carbazole derivative.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer 130 can be used. Furthermore, the hole-transport material may be a high molecular compound.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, a substance having a hole mobility of $1\times10^{-6}$ cm$^2$/Vs or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand, an oxadiazole derivative; a triazole derivative, a phenanthroline derivative, a pyridine derivative, a bipyridine derivative, a pyrimidine derivative, and the like, which are described as the electron-transport materials that can be used in the light-emitting layer 130, can be given. A substance having an electron mobility of $1\times10^{-6}$ cm$^2$/Vs or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

Between the electron-transport layer 118 and the light-emitting layer 130, a layer that controls transfer of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. Alternatively, a rare earth metal compound like erbium fluoride ($ErF_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, and ytterbium are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and ytterbium (Yb), or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductive containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1\times10^5$ Ω·cm, further preferably lower than or equal to $1\times10^4$ Ω·cm.

Alternatively, the electrode 101 and/or the electrode 102 may be formed by stacking two or more of these materials.

Furthermore, to increase light extraction efficiency, a material having a higher refractive index than an electrode that has a function of transmitting light may be formed in contact with the electrode. Such a material may be a conductive material or a non-conductive material as long as having a function of transmitting visible light. For example, in addition to the above-described oxide conductor, an oxide semiconductor and an organic material are given as examples. As examples of the organic material, materials of the light-emitting layer, the hole-injection layer, the hole-transport layer, the electron-transport layer, and the electron-injection layer are given. Alternatively, an inorganic carbon-based material or a metal thin film that allows transmission of light can be used. A plurality of layers each of which is formed using the material having a high refractive index and has a thickness of several nanometers to several tens of nanometers may be stacked.

In the case where the electrode 101 or the electrode 102 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, and the like.

In the case where the electrode 101 or the electrode 102 is used as an anode, a material having a high work function (higher than or equal to 4.0 eV) is preferably used.

Alternatively, the electrodes 101 and 102 may each be a stack of a conductive material having a function of reflecting light and a conductive material having a function of transmitting light. In that case, the electrodes 101 and 102 can each have a function of adjusting the optical path length so that light at a desired wavelength emitted from each light-emitting layer resonates and is intensified; thus, such a structure is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

A light-emitting element in one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

In this specification and the like, a light-emitting element can be formed using any of a variety of substrates, for example. There is no particular limitation on the type of substrate. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an alumino-borosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, and a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to a field-effect transistor (FET), for example, which is formed over any of the above-described substrates. Accordingly, an active matrix display device in which the FET controls the driving of the light-emitting element 150 can be manufactured.

In Embodiment 1, one embodiment of the present invention has been described. Other embodiments of the present invention are described in Embodiments 2 to 10. Note that one embodiment of the present invention is not limited thereto. That is, since various embodiments of the present invention are disclosed in Embodiment 1 and Embodiments 2 to 10, one embodiment of the present invention is not limited to a specific embodiment. The example in which one embodiment of the present invention is used in a light-emitting element is described; however, one embodiment of the present invention is not limited thereto. For example, depending on circumstances or conditions, one embodiment of the present invention is not necessarily used in a light-emitting element. Although another example in which the EL layer includes the host material and the guest material, the host material has a structure where the first skeleton and the second skeleton are bonded to each other through the third skeleton, and the first molecule and the second molecule of the host material form an excited complex is shown as one embodiment of the present invention, one embodiment of the present invention is not limited thereto. Depending on circumstances or conditions, the first molecule and the second molecule of the host material do not need to form an excited complex in one embodiment of the present invention, for example. Alternatively, the structure where the first skeleton and the second skeleton in the host material are bonded to each other through the third skeleton is not necessarily provided. Although another example in which the first skeleton in the host material includes at least one of the π-electron rich heteroaromatic skeleton and the aromatic amine skeleton, the second skeleton includes the π-electron deficient heteroaromatic skeleton, and the third skeleton includes the m-phenylene group, the o-phenylene group, or the biphenyldiyl group is shown as one embodiment of the present invention, one embodiment of the present invention is not limited thereto. Depending on circumstances or conditions, the first skeleton does not necessarily include the π-electron rich heteroaromatic skeleton or the aromatic amine skeleton in one embodiment of the present invention, for example. Alternatively, the second skeleton does not necessarily include the π-electron deficient heteroaromatic skeleton. Alternatively, the third skeleton does not necessarily include the m-phenylene group, the o-phenylene group, or the biphenyldiyl group.

The structures described in this embodiment can be used in appropriate combination with any of the other embodiments.

Embodiment 2

Figure 11A:
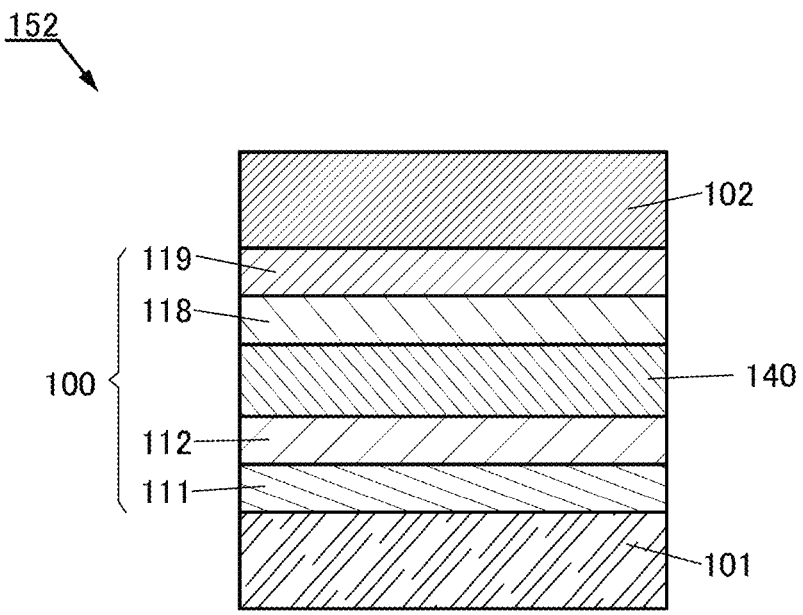
FIGS. 11A and 11B are schematic cross-sectional views of a light-emitting element of one embodiment of the present invention and FIG. 11C illustrates the correlation of energy levels in a light-emitting layer.

In this embodiment, a light-emitting element having a structure different from that described in Embodiment 1 and light emission mechanisms of the light-emitting element are described below with reference to FIGS. 11A to 11C. In FIG. 11A, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

<Structure Example of Light-Emitting Element>

FIG. 11A is a schematic cross-sectional view of a light-emitting element 152 of one embodiment of the present invention.

The light-emitting element 152 includes a pair of electrodes (an electrode 101 and an electrode 102) and an EL layer 100 between the pair of electrodes. The EL layer 100 includes at least a light-emitting layer 140.

Note that the electrode 101 functions as an anode and the electrode 102 functions as a cathode in the following description of the light-emitting element 152; however, the functions may be interchanged in the light-emitting element 152.

Figure 11B:

FIG. 11B is a schematic cross-sectional view illustrating an example of the light-emitting layer 140 in FIG. 11A. The light-emitting layer 140 in FIG. 11B includes a host material 141 and a guest material 142.

The guest material 142 may be a light-emitting organic compound, and the light-emitting organic compound is preferably a substance capable of emitting phosphorescence (hereinafter also referred to as a phosphorescent compound). A structure in which a phosphorescent compound is used as the guest material 142 will be described below. The guest material 142 may be rephrased as the phosphorescent compound.

<Light Emission Mechanism of Light-Emitting Element>

Next, the light emission mechanism of the light-emitting layer 140 is described below.

The host material 141 in the light-emitting layer 140 preferably includes a skeleton having a function of transporting holes (a hole-transport property) and a skeleton having a function of transporting electrons (an electron-transport property). Alternatively, the host material 141 preferably includes at least one of a π-electron rich heteroaromatic skeleton and an aromatic amine skeleton, and a π-electron deficient heteroaromatic skeleton.

In one embodiment of the present invention, the host material 141 has a function of forming an excited complex (also referred to as an excited dimer) with two molecules having the same molecular structure. In particular, the skeleton having a hole-transport property and the skeleton having an electron-transport property of the host material 141 preferably form an excited complex in two molecules having the same molecular structure. Alternatively, at least one of the π-electron rich heteroaromatic skeleton and the aromatic amine skeleton included in the host material 141 and the π-electron deficient heteroaromatic skeleton included in the host material 141 preferably form an excited complex in two molecules having the same molecular structure. Although the above excited complex forms an excited state with the two molecules having the same molecular structure, it is important that the above excited complex form a charge-transfer excited state unlike a general excited dimer (also referred to as an excimer). That is, the excited state is formed by the two molecules having the same molecular structure, and one molecule is in an excited state which is positively charged and the other molecule is in an excited state which is negatively charged.

In other words, the host material 141 has a function of forming an excited complex with a first molecule and a second molecule of the host material 141. In particular, the skeleton having a hole-transport property in the first molecule and the skeleton having an electron-transport property in the second molecule of the host material 141 preferably form an excited complex. Alternatively, at least one of the π-electron rich heteroaromatic skeleton and the aromatic amine skeleton in the first molecule of the host material 141 and the π-electron deficient heteroaromatic skeleton in the second molecule of the host material 141 preferably form an excited complex.

In the case where the host material 141 includes the skeleton having a hole-transport property and the skeleton having an electron-transport property, a donor-acceptor excited complex is easily formed by two molecules; thus, efficient formation of an excited complex is possible. Alternatively, in the case where the host material 141 includes at least one of the π-electron rich heteroaromatic skeleton and the aromatic amine skeleton, and the π-electron deficient heteroaromatic skeleton, a donor-acceptor excited complex is easily formed by two molecules; thus, efficient formation of an excited complex is possible.

Thus, to increase both the donor property and the acceptor property in the molecules of the host material 141, a structure where the conjugation between the skeleton having a hole-transport property and the skeleton having an electron-transport property is reduced is preferably used. Alternatively, a structure where the conjugation between the π-electron deficient heteroaromatic skeleton and at least one of the π-electron rich heteroaromatic skeleton and the aromatic amine skeleton is reduced is preferably used. Thus, a difference between a singlet excitation energy level and a triplet excitation energy level of the host material 141 can be reduced. Moreover, the triplet excitation energy level of the host material 141 can be high.

Furthermore, in the excited complex formed by the two molecules having the same molecular structure, one molecule includes the HOMO and the other molecule includes the LUMO; thus, an overlap between the HOMO and the LUMO is extremely small. That is, in the excited complex whose donor property and acceptor property are both high, a difference between a singlet excitation energy level and a triplet excitation energy level is small. Therefore, in the excited complex formed by the two molecules of the host material 141, a difference between a singlet excitation energy level and a triplet excitation energy level is small and is preferably larger than 0 eV and smaller than or equal to 0.2 eV.

In the case where the host material 141 includes the skeleton having a hole-transport property and the skeleton having an electron-transport property, the carrier balance can be easily controlled. As a result, a carrier recombination region can also be controlled easily.

Figure 11C:
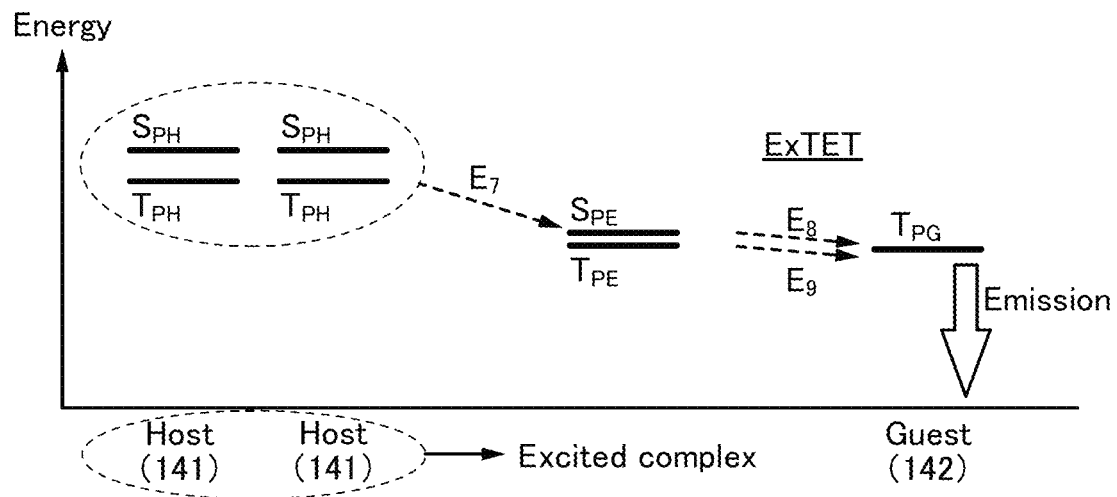

FIG. 11C shows a correlation of energy levels of the host material 141 and the guest material 142 in the light-emitting layer 140. The following explains what terms and signs in FIG. 11C represent:

Host (141): the host material 141;
Guest (142): the guest material 142 (the phosphorescent compound);
$S_{PH}$: the S1 level of the host material 141;
$T_{PH}$: the T1 level of the host material 141;
$T_{PG}$: the T1 level of the guest material 142 (the phosphorescent compound);
$S_{PE}$: the S1 level of the excited complex; and
$T_{PE}$: the T1 level of the excited complex.

In the light-emitting element of one embodiment of the present invention, an excited complex is formed by the two molecules having the same molecular structure of the host material 141 included in the light-emitting layer 140. The lowest energy level ($S_{PE}$) in a singlet excited state of the excited complex and the lowest energy level ($T_{PE}$) in a triplet excited state of the excited complex are close to each other (see Route $E_7$ in FIG. 11C).

In the two molecules close to each other of the host material 141, one molecule receives a hole and the other molecule receives an electron to immediately form an excited complex. Alternatively, one molecule brought into an excited state immediately interacts with the other molecule to form an excited complex. Therefore, most excitons in the light-emitting layer 140 exist as excited complexes. Because the excitation energy levels ($S_{PE}$ and $T_{PE}$) of the excited complex are lower than the singlet excitation energy level ($S_{PH}$) of a single molecule of the host material 141 that forms the excited complex, the excited state of the host material 141 can be formed with lower excitation energy. Accordingly, the driving voltage of the light-emitting element 152 can be reduced.

Both energies of $S_{PE}$ and $T_{PE}$ of the excited complex are then transferred to the lowest energy level in the triplet excited state of the guest material 142 (the phosphorescent compound); thus, light emission is obtained (see Routes $E_8$ and $E_9$ in FIG. 11C).

Furthermore, the triplet excitation energy level ($T_{PE}$) of the excited complex is preferably higher than the triplet excitation energy level ($T_{PG}$) of the guest material 142. In this way, the singlet excitation energy and the triplet excitation energy of the formed excited complex can be transferred from the singlet excitation energy level ($S_{PE}$) and the triplet excitation energy level ($T_{PE}$) of the excited complex to the triplet excitation energy level ($T_{PG}$) of the guest material 142.

When the light-emitting layer 140 has the above-described structure, light emission from the guest material 142 (the phosphorescent compound) of the light-emitting layer 140 can be obtained efficiently.

Since an excited complex is called "an exciplex" in some cases, the above-described processes through Routes $E_7$, $E_8$, and $E_9$ may be referred to as exciplex-triplet energy transfer (ExTET) in this specification and the like. In other words, in the light-emitting layer 140, excitation energy is transferred from the excited complex to the guest material 142. In this case, the efficiency of reverse intersystem crossing from $T_{PE}$ to $S_{PE}$ and the luminescence quantum yield from the singlet excited state having energy of $S_{PE}$ are not necessarily high; thus, materials can be selected from a wide range of options.

Note that in order to efficiently transfer excitation energy from the excited complex to the guest material 142, the triplet excitation energy level ($T_{PE}$) of the excited complex formed by two molecules is preferably lower than the triplet excitation energy level ($T_{PH}$) of the single molecule of the host material 141 which forms the excited complex. Thus, quenching of the triplet excitation energy of the excited complex due to another one or more molecules in the host material 141 is less likely to occur, which causes efficient energy transfer to the guest material 142.

Furthermore, the mechanism of the energy transfer process between the molecules of the host material 141 and the guest material 142 can be described using two mechanisms, i.e., Forster mechanism (dipole-dipole interaction) and Dexter mechanism (electron exchange interaction), as in Embodiment 1. For Forster mechanism and Dexter mechanism, Embodiment 1 can be referred to.

<<Concept for Promoting Energy Transfer>>

In energy transfer by Forster mechanism, the energy transfer efficiency $\phi_{ET}$ is higher when the luminescence quantum yield $\phi$ (the fluorescence quantum yield when energy transfer from a singlet excited state is discussed) is higher. Furthermore, it is preferable that the emission spectrum (the fluorescent spectrum in the case where energy transfer from a singlet excited state is discussed) of the host material 141 largely overlap with the absorption spectrum (absorption corresponding to the transition from the singlet ground state to the triplet excited state) of the guest material 142. Moreover, it is preferable that the molar absorption coefficient of the guest material 142 be also high. This means that the emission spectrum of the host material 141 overlaps with the absorption band of the guest material 142 which is on the longest wavelength side.

In energy transfer by Dexter mechanism, in order to increase the rate constant $k_{h^* \to g}$, it is preferable that an emission spectrum of the host material 141 (a fluorescent spectrum in the case where energy transfer from a singlet excited state is discussed) largely overlap with an absorption spectrum of the guest material 142 (absorption corresponding to transition from a singlet ground state to a triplet excited state). Therefore, the energy transfer efficiency can be optimized by making the emission spectrum of the host material 141 overlap with the absorption band of the guest material 142 which is on the longest wavelength side.

In a manner similar to that of the energy transfer from the host material 141 to the guest material 142, the energy transfer by both Forster mechanism and Dexter mechanism also occurs in the energy transfer process from the excited complex to the guest material 142.

Accordingly, one embodiment of the present invention provides a light-emitting element including the host material 141 in which two molecules form an excited complex which functions as an energy donor capable of efficiently transferring energy to the guest material 142. The excited complex formed by the two molecules of the host material 141 has a singlet excitation energy level and a triplet excitation energy level which are close to each other; accordingly, the excited complex generated in the light-emitting layer 140 can be formed with lower excitation energy than the host material 141 alone. This can reduce the driving voltage of the light-emitting element 152. Furthermore, in order to facilitate energy transfer from the singlet excited state of the excited complex to the triplet excited state of the guest material 142 serving as an energy acceptor, it is preferable that the emission spectrum of the excited complex overlap with the absorption band of the guest material 142 which is on the longest wavelength side (lowest energy side). Thus, the efficiency of generating the triplet excited state of the guest material 142 can be increased.

<Material that can be Used in Light-Emitting Layers>

Next, materials that can be used in the light-emitting layer 140 will be described below.

In the light-emitting layer 140, the host material 141 is present in the largest proportion by weight, and the guest material 142 (the phosphorescent compound) is dispersed in the host material 141. The T1 level of the host material 141 in the light-emitting layer 140 is preferably higher than the T1 level of the guest material 142 (the phosphorescent compound) in the light-emitting layer 140.

The host material 141 in the light-emitting layer 140 is not particularly limited as long as two molecules of the host material 141 have a function of forming an excited complex; however, the host material 141 preferably includes a π-electron deficient heteroaromatic skeleton and at least one of a π-electron rich heteroaromatic skeleton and an aromatic amine skeleton. As the host material 141, any of the materials described in Embodiment 1 can be used.

Thus, in one embodiment of the present invention, it is preferable that, in the host material 141, the skeleton having a hole-transport property and the skeleton having an electron-transport property be bonded to each other through a structure including at least one of a m-phenylene group and an o-phenylene group. In particular, the structure including at least one of the m-phenylene group and the o-phenylene group is preferably a structure where an arylene group and at least one of the m-phenylene group and the o-phenylene group are bonded to each other. With such a structure, the HOMO and the LUMO in the molecule are physically apart (are distanced) from each other. As a result, the formation of the above excited complex (e.g., based on electron transition between the HOMO in the first molecule and the LUMO in the second molecule) is more dominant than the formation of the charge-transfer excited state in the molecule (based on HOMO-LUMO transition in the molecule); thus, the above structure is suitable for one embodiment of the present invention. For the same reason, it is particularly preferable that, in the host material 141, the skeleton having a hole-transport property and the skeleton having an electron-transport property be bonded to each other through a biphenyldiyl group.

At this time, as described in Embodiment 1, when the group including the m-phenylene group is used, the energy difference between the S1 level and the T1 level of the single molecule is small and thus the T1 level of the single molecule is high. When the T1 level of the single molecule is high, the T1 level of the excited complex is more stable than that of the single molecule; as a result, the diffusion of the triplet excitons can be prevented and the light emission efficiency and the lifetime of the light-emitting element can be increased by ExTET mechanism.

As the guest material 142 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1, 2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2, 6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl] pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes having a 4H-triazole skeleton have high reliability and high light emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato)

bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetyl acetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III)acetylacetonate (abbreviation: Ir(dpo)$_2$(acac)), bis {2-[4'-(perfluorophenyl)phenyl]pyridinato-N,C$^{2'}$}iridium(III)acetylacetonate (abbreviation: Ir(p-PF-ph)$_2$(acac)), and bis(2-phenylbenzothiazolato-N,C$^{2'}$)iridium(III)acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity.

As the light-emitting material included in the light-emitting layer 140, any material can be used as long as the material can convert the triplet excitation energy into light emission. As an example of the material that can convert the triplet excitation energy into light emission, a thermally activated delayed fluorescent (TADF) material can be given in addition to a phosphorescent compound. Therefore, it is acceptable that the "phosphorescent compound" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the material exhibiting thermally activated delayed fluorescence is formed of one kind of material, any of the thermally activated delayed fluorescent materials described in Embodiment 1 can be specifically used.

The light-emitting layer 140 can have a structure in which two or more layers are stacked. For example, in the case where the light-emitting layer 140 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

The light-emitting layer 140 may include a material other than the host material 141 and the guest material 142. Specifically, any of the materials described in Embodiment 1 can be used.

Note that the light-emitting layer 140 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

The structure described in this embodiment can be used in appropriate combination with any of the structures described in the other embodiments.

Embodiment 3

In this embodiment, light-emitting elements having structures different from those described in Embodiments 1 and 2 and light emission mechanisms of the light-emitting elements are described below with reference to FIGS. 12A to 12C and FIGS. 13A and 13B. In FIGS. 12A to 12C and FIGS. 13A and 13B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

<Structure Example 1 of Light-Emitting Element>

Figure 12A:
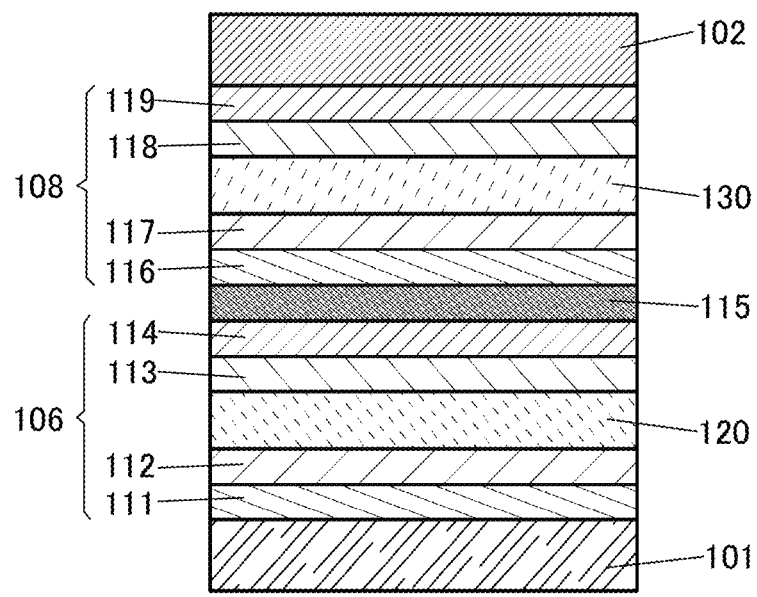
FIGS. 12A and 12B are schematic cross-sectional views of a light-emitting element of one embodiment of the present invention and FIG. 12C illustrates the correlation of energy levels in a light-emitting layer.

FIG. 12A is a schematic cross-sectional view of a light-emitting element 250.

The light-emitting element 250 illustrated in FIG. 12A includes a plurality of light-emitting units (a light-emitting unit 106 and a light-emitting unit 108 in FIG. 12A) between a pair of electrodes (the electrode 101 and the electrode 102). Any one of the plurality of light-emitting units preferably has the same structure as the EL layer 100 illustrated in FIG. 1A. That is, the light-emitting element 150 in FIG. 1A preferably includes one light-emitting unit, and the light-emitting element 250 preferably includes a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 12A, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable that the same structure as the EL layer 100 illustrated in FIG. 1A be used in the light-emitting unit 108.

The light-emitting element 250 includes a light-emitting layer 120 and the light-emitting layer 130. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, an electron-transport layer 118, and an electron-injection layer 119 in addition to the light-emitting layer 130.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A substance having a hole mobility of $1\times10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115 like the light-emitting unit 108, the charge-generation layer 115 can also serve as a hole-injection layer or a hole-transport layer of the light-emitting unit; thus, a hole-injection layer or a hole-transport layer need not be included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having a high electron-transport property. Furthermore, the charge-generation layer 115 may be formed using a combination of a layer containing the composite material of an organic compound and an acceptor substance with a layer including a transparent conductive film.

The charge-generation layer 115 provided between the light-emitting unit 106 and the light-emitting unit 108 may have any structure as long as electrons can be injected to the light-emitting unit on one side and holes can be injected into the light-emitting unit on the other side when a voltage is applied between the electrode 101 and the electrode 102. For example, in FIG. 12A, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of higher than or equal to 40%). The charge-generation layer 115 functions even if it has lower conductivity than the pair of electrodes (the electrodes 101 and 102).

Note that forming the charge-generation layer 115 by using any of the above materials can suppress an increase in drive voltage caused by the stack of the light-emitting layers.

The light-emitting element having two light-emitting units is described with reference to FIG. 12A; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. A light-emitting element with low power consumption can be provided.

When the same structure as the EL layer 100 illustrated in FIG. 1A is used for at least one of the plurality of units, a light-emitting element with high light emission efficiency can be provided.

It is preferable that the light-emitting layer 130 included in the light-emitting unit 108 have the structure described in Embodiment 1. Thus, the light-emitting element 250 contains a fluorescent compound as a light-emitting material and has high luminous efficiency, which is preferable.

Figure 12B:
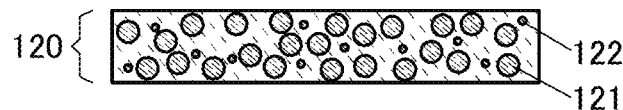

Furthermore, the light-emitting layer 120 included in the light-emitting unit 106 contains a host material 121 and a guest material 122 as illustrated in FIG. 12B. Note that the guest material 122 is described below as a fluorescent compound.

<Light Emission Mechanism of Light-Emitting Layer 120>

The light emission mechanism of the light-emitting layer 120 is described below.

By recombination of the electrons and holes injected from the pair of electrodes (the electrode 101 and the electrode 102) or the charge-generation layer in the light-emitting layer 120, excitons are formed. Because the amount of the host material 121 is larger than that of the guest material 122, the host material 121 is brought into an excited state by the exciton generation.

Note that the term "exciton" refers to a carrier (electron and hole) pair. Since excitons have energy, a material where excitons are generated is brought into an excited state.

In the case where the formed excited state of the host material 121 is a singlet excited state, singlet excitation energy transfers from the S1 level of the host material 121 to the S1 level of the guest material 122, thereby forming the singlet excited state of the guest material 122.

Since the guest material 122 is a fluorescent compound, when a singlet excited state is formed in the guest material 122, the guest material 122 immediately emits light. To obtain high light emission efficiency in this case, the fluorescence quantum yield of the guest material 122 is preferably high. The same can apply to a case where a singlet excited state is formed by recombination of carriers in the guest material 122.

Figure 12C:
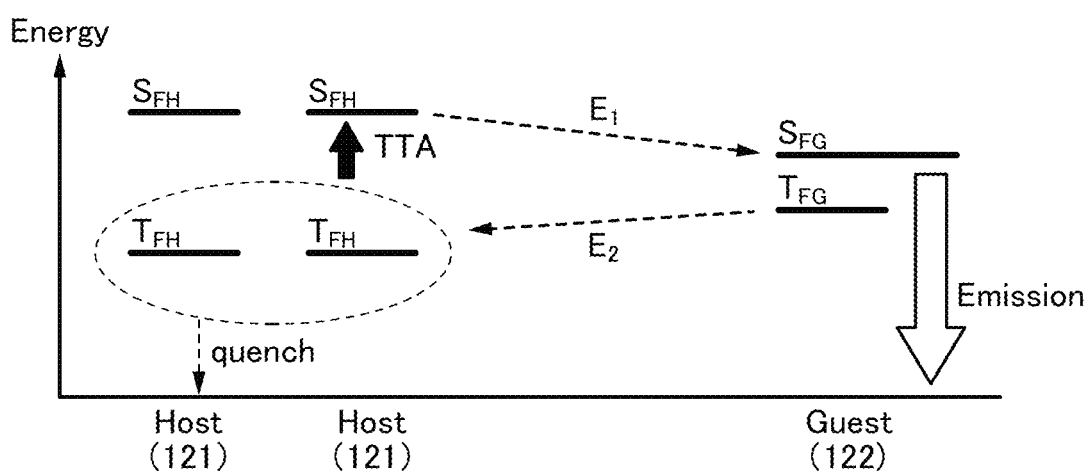

Next, a case where recombination of carriers forms a triplet excited state of the host material 121 is described. The correlation of energy levels of the host material 121 and the guest material 122 in this case is shown in FIG. 12C. The following explains what terms and signs in FIG. 12C represent. Note that because it is preferable that the T1 level of the host material 121 be lower than the T1 level of the guest material 122, FIG. 12C shows this preferable case. However, the T1 level of the host material 121 may be higher than the T1 level of the guest material 122.

Host (121): the host material 121;
Guest (122): the guest material 122 (the fluorescent compound);
$S_{FH}$: the S1 level the host material 121;
$T_{FH}$: the T1 level of the host material 121;
$S_{FG}$: the S1 level of the guest material 122 (the fluorescent compound); and
$T_{FG}$: the T1 level of the guest material 122 (the fluorescent compound).

As illustrated in FIG. 12C, triplet excitons formed by carrier recombination are close to each other, and excitation energy is transferred and spin angular momenta are exchanged; as a result, a reaction in which one of the triplet excitons is converted into a singlet exciton having energy of the S1 level of the host material 121 ($S_{FH}$), that is, triplet-triplet annihilation (TTA) occurs (see TTA in FIG. 12C). The singlet excitation energy of the host material 121 is transferred from $S_{FH}$ to the S1 level of the guest material 122 ($S_{FG}$) having a lower energy than $S_{FH}$ (see Route $E_1$ in FIG. 12C), and a singlet excited state of the guest material 122 is formed, whereby the guest material 122 emits light.

Note that in the case where the density of triplet excitons in the light-emitting layer 120 is sufficiently high (e.g., $1 \times 10^{-12}$ cm$^{-3}$ or higher), only the reaction of two triplet excitons close to each other can be considered whereas deactivation of a single triplet exciton can be ignored.

In the case where a triplet excited state of the guest material 122 is formed by carrier recombination, the triplet excited state of the guest material 122 is thermally deactivated and is difficult to use for light emission. However, in the case where the T1 level of the host material 121 ($T_{FH}$) is lower than the T1 level of the guest material 122 ($T_{FG}$), the triplet excitation energy of the guest material 122 can be transferred from the T1 level of the guest material 122 ($T_{FG}$) to the T1 level of the host material 121 ($T_{FH}$) (see Route $E_2$ in FIG. 12C) and then is utilized for TTA.

In other words, the host material 121 preferably has a function of converting triplet excitation energy into singlet excitation energy by causing TTA, so that the triplet excitation energy generated in the light-emitting layer 120 can be partly converted into singlet excitation energy by TTA in the host material 121. The singlet excitation energy can be transferred to the guest material 122 and extracted as fluorescence. In order to achieve this, the S1 level of the host material 121 ($S_{FH}$) is preferably higher than the S1 level of the guest material 122 ($S_{FG}$). In addition, the T1 level of the host material 121 ($T_{FH}$) is preferably lower than the T1 level of the guest material 122 ($T_{FG}$).

Note that particularly in the case where the T1 level of the guest material 122 ($T_{FG}$) is lower than the T1 level of the host material 121 ($T_{FH}$), the weight ratio of the guest material 122 to the host material 121 is preferably low. Specifically, the weight ratio of the guest material 122 to the host material 121 is preferably greater than 0 and less than or equal to 0.05, in which case the probability of carrier recombination in the guest material 122 can be reduced. In addition, the probability of energy transfer from the T1 level of the host material 121 ($T_{FH}$) to the T1 level of the guest material 122 ($T_{FG}$) can be reduced.

Note that the host material 121 may be composed of a single compound or a plurality of compounds.

Note that in each of the above-described structures, the guest materials (fluorescent compounds) used in the light-emitting unit 106 and the light-emitting unit 108 may be the same or different. In the case where the same guest material is used for the light-emitting unit 106 and the light-emitting unit 108, the light-emitting element 250 can exhibit high emission luminance at a small current value, which is preferable. In the case where different guest materials are used for the light-emitting unit 106 and the light-emitting unit 108, the light-emitting element 250 can exhibit multi-color light emission, which is preferable. It is particularly favorable to select the guest materials so that white light emission with high color rendering properties or light emission of at least red, green, and blue can be obtained.

In the case where the light-emitting units 106 and 108 contain different guest materials, light emitted from the light-emitting layer 120 preferably has a peak on the shorter wavelength side than light emitted from the light-emitting layer 130. Since the luminance of a light-emitting element using a material having a high triplet excited state tends to be degraded quickly, TTA is utilized in the light-emitting layer emitting light with a short wavelength so that a light-emitting element with less degradation of luminance can be provided.

<Structure Example 2 of Light-Emitting Element>

Figure 13A:
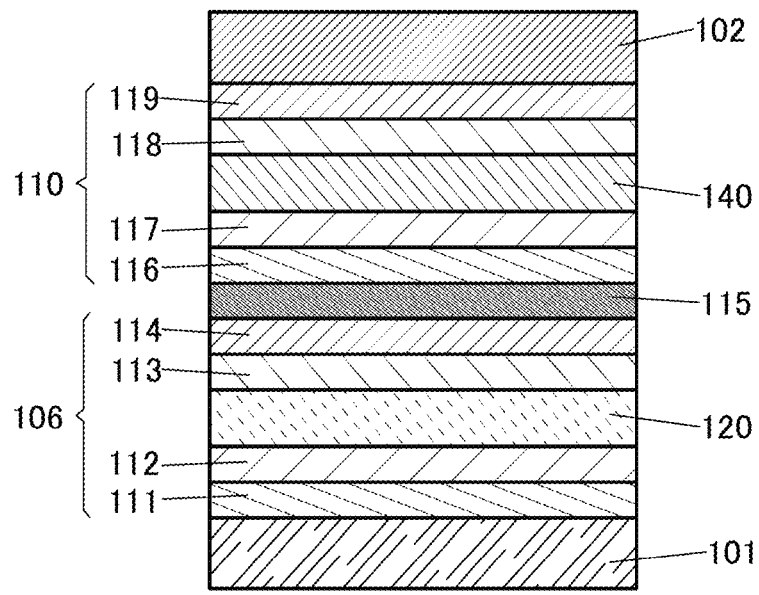
FIGS. 13A and 13B are each a schematic cross-sectional view of a light-emitting element of one embodiment of the present invention.

FIG. 13A is a schematic cross-sectional view of a light-emitting element 252.

The light-emitting element 252 illustrated in FIG. 13A includes, like the light-emitting element 250 described above, a plurality of light-emitting units (a light-emitting unit 106 and a light-emitting unit 110 in FIG. 13A) between a pair of electrodes (the electrode 101 and the electrode 102). One light-emitting unit preferably has the same structure as the EL layer 100 illustrated in FIG. 11A. Note that the light-emitting unit 106 and the light-emitting unit 110 may have the same structure or different structures.

In the light-emitting element 252 illustrated in FIG. 13A, the light-emitting unit 106 and the light-emitting unit 110 are stacked, and a charge-generation layer 115 is provided between the light-emitting unit 106 and the light-emitting unit 110. For example, it is preferable that the same structure as the EL layer 100 illustrated in FIG. 11A be used in the light-emitting unit 110.

The light-emitting element 252 includes the light-emitting layer 120 and a light-emitting layer 140. The light-emitting unit 106 includes the hole-injection layer 111, the hole-transport layer 112, the electron-transport layer 113, and the electron-injection layer 114 in addition to the light-emitting layer 120. The light-emitting unit 110 includes the hole-injection layer 116, the hole-transport layer 117, the electron-transport layer 118, and the electron-injection layer 119 in addition to the light-emitting layer 140.

In addition, the light-emitting layer of the light-emitting unit 110 preferably contains a phosphorescent compound. That is, it is preferable that the light-emitting layer 120 included in the light-emitting unit 106 have the structure described in the structure example 1 in Embodiment 3 and the light-emitting layer 140 included in the light-emitting unit 110 have the structure described in Embodiment 2.

Note that light emitted from the light-emitting layer 120 preferably has a peak on the shorter wavelength side than light emitted from the light-emitting layer 140. Since the luminance of a light-emitting element using a phosphorescent compound emitting light with a short wavelength tends to be degraded quickly, fluorescence with a short wavelength is employed so that a light-emitting element with less degradation of luminance can be provided.

Furthermore, the light-emitting layer 120 and the light-emitting layer 140 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 120 and the light-emitting layer 140 emit light of complementary colors, white light emission can be obtained.

In addition, white light emission with a high color rendering property that is formed of three primary colors or four or more colors can be obtained by using a plurality of light-emitting substances emitting light with different wavelengths for one of the light-emitting layers 120 and 140 or both. In that case, one of the light-emitting layers 120 and 140 or both may be divided into layers and each of the divided layers may contain a light-emitting material different from the others.

<Structure Example 3 of Light-Emitting Element>

Figure 13B:
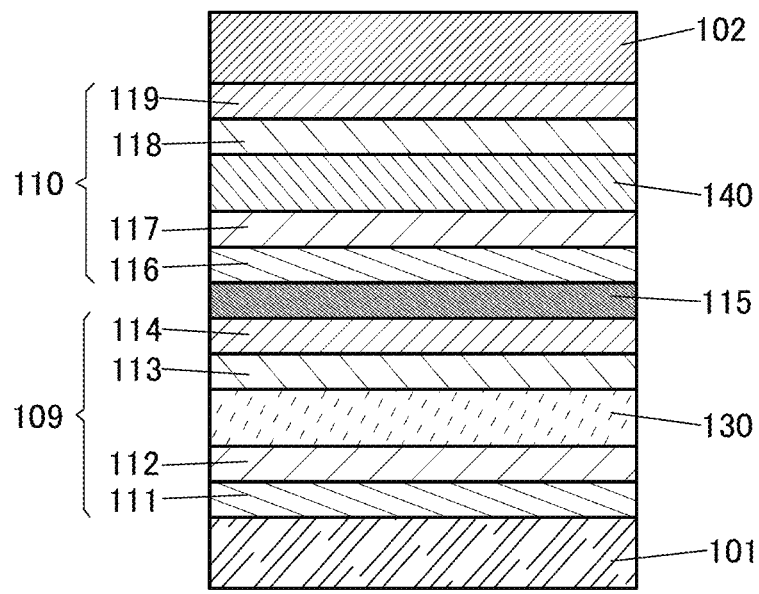

FIG. 13B is a schematic cross-sectional view of a light-emitting element 254.

The light-emitting element 254 illustrated in FIG. 13B includes, like the light-emitting element 250 described above, a plurality of light-emitting units (a light-emitting unit 109 and a light-emitting unit 110 in FIG. 13B) between a pair of electrodes (the electrode 101 and the electrode 102). It is preferable that at least one of the plurality of light-emitting units have the same structure as the EL layer 100 illustrated in FIG. 1A and the other light-emitting unit have the same structure as the EL layer 100 illustrated in FIG. 11A.

In the light-emitting element 254 illustrated in FIG. 13B, the light-emitting unit 109 and the light-emitting unit 110 are stacked, and a charge-generation layer 115 is provided between the light-emitting unit 109 and the light-emitting unit 110. For example, it is preferable that the same structure as the EL layer 100 illustrated in FIG. 1A be used in the light-emitting unit 109 and the same structure as the EL layer 100 illustrated in FIG. 11A be used in the light-emitting unit 110.

The light-emitting element 254 includes the light-emitting layer 130 and a light-emitting layer 140. The light-emitting unit 109 includes the hole-injection layer 111, the hole-transport layer 112, the electron-transport layer 113, and the electron-injection layer 114 in addition to the light-emitting layer 130. The light-emitting unit 110 includes the hole-injection layer 116, the hole-transport layer 117, the electron-transport layer 118, and the electron-injection layer 119 in addition to the light-emitting layer 140.

That is, it is preferable that the light-emitting layer 130 included in the light-emitting unit 109 have the structure described in Embodiment 1 and the light-emitting layer 140 included in the light-emitting unit 110 have the structure described in Embodiment 2.

Note that light emitted from the light-emitting layer 130 preferably has a peak on the shorter wavelength side than light emitted from the light-emitting layer 140. Since the luminance of a light-emitting element using a phosphorescent compound emitting light with a short wavelength tends to be degraded quickly, fluorescence with a short wavelength is employed so that a light-emitting element with less degradation of luminance can be provided.

Furthermore, the light-emitting layer 130 and the light-emitting layer 140 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 130 and the light-emitting layer 140 emit light of complementary colors, white light emission can be obtained.

In addition, white light emission with a high color rendering property that is formed of three primary colors or four or more colors can be obtained by using a plurality of light-emitting substances emitting light with different wavelengths for one of the light-emitting layers 130 and 140 or both. In that case, one of the light-emitting layers 130 and 140 or both may be divided into layers and each of the divided layers may contain a light-emitting material different from the others.

<Material that can be Used in Light-Emitting Layers>

Next, materials that can be used in the light-emitting layers 120, 130, and 140 are described.

<<Material that can be Used in Light-Emitting Layer 120>>

In the light-emitting layer 120, the host material 121 is present in the largest proportion by weight, and the guest material 122 (the fluorescent compound) is dispersed in the host material 121. The S1 level of the host material 121 is preferably higher than the S1 level of the guest material 122 (the fluorescent compound) while the T1 level of the host material 121 is preferably lower than the T1 level of the guest material 122 (the fluorescent compound).

In the light-emitting layer 120, although the guest material 122 is not particularly limited, for example, any of materials which are described as examples of the guest material 132 in Embodiment 1 can be used.

Although there is no particular limitation on a material that can be used as the host material 121 in the light-emitting layer 120, any of the following materials can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II)

(abbreviation: Znq), bis[2-(2-benzoxazolyl)phenolato]zinc (II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and the like. One or more substances having a wider energy gap than the guest material 122 is preferably selected from these substances and known substances.

The light-emitting layer 120 can have a structure in which two or more layers are stacked. For example, in the case where the light-emitting layer 120 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

In the light-emitting layer 120, the host material 121 may be composed of one kind of compound or a plurality of compounds. Alternatively, the light-emitting layer 120 may contain a material other than the host material 121 and the guest material 122.

<<Material that can be Used in Light-Emitting Layer 130>>

As a material that can be used in the light-emitting layer 130, a material that can be used in the light-emitting layer 130 in Embodiment 1 may be used. Thus, a light-emitting element with high generation efficiency of a singlet excited state and high light emission efficiency can be fabricated.

<<Material that can be Used in Light-Emitting Layer 140>>

As a material that can be used in the light-emitting layer 140, a material that can be used in the light-emitting layer 140 in Embodiment 2 may be used. Thus, a light-emitting element with low driving voltage can be fabricated.

There is no limitation on the emission colors of the light-emitting materials contained in the light-emitting layers 120, 130, and 140, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 120 is preferably shorter than those of the light-emitting materials contained in the light-emitting layers 130 and 140.

Note that the light-emitting units 106, 108, 109, and 110 and the charge-generation layer 115 can be formed by an evaporation method (including a vacuum evaporation method), an ink-jet method, a coating method, gravure printing, or the like.

The structures described in this embodiment can be used in appropriate combination with any of the structures described in the other embodiments.

Embodiment 4

In this embodiment, examples of light-emitting elements having structures different from those described in Embodiments 1 to 3 are described below with reference to FIGS. 14A and 14B, FIGS. 15A and 15B, FIGS. 16A to 16C, and FIGS. 17A to 17C.

<Structure Example 1 of Light-Emitting Element>

Figure 14A:
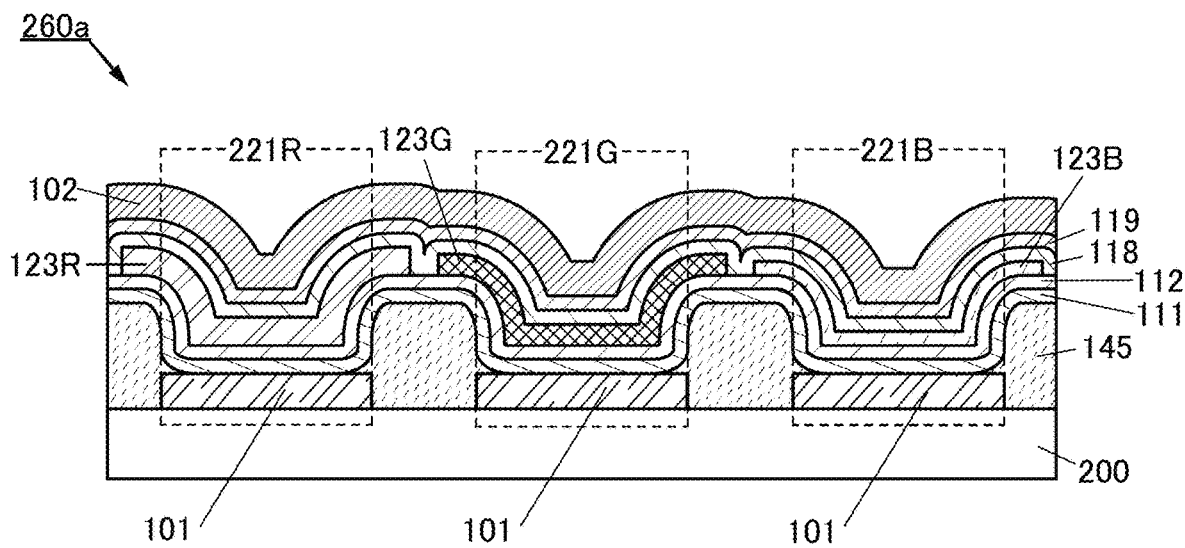
FIGS. 14A and 14B are each a schematic cross-sectional view of a light-emitting element of one embodiment of the present invention.
Figure 14B:
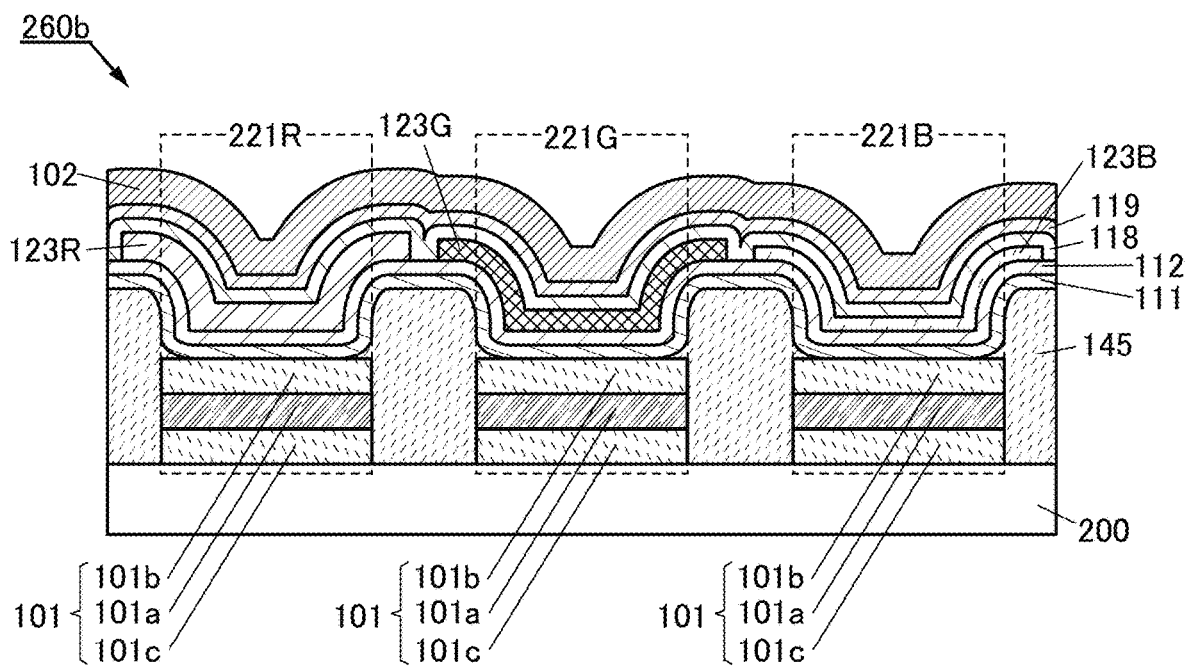

FIGS. 14A and 14B are cross-sectional views each illustrating a light-emitting element of one embodiment of the present invention. In FIGS. 14A and 14B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Light-emitting elements 260a and 260b in FIGS. 14A and 14B may have a bottom-emission structure in which light is extracted through the substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting elements 260a and 260b each have a bottom emission structure, the electrode 101 preferably has a function of transmitting light and the electrode 102 preferably has a function of reflecting light. Alternatively, in the case where the light-emitting elements 260a and 260b each have a top emission structure, the electrode 101 preferably has a function of reflecting light and the electrode 102 preferably has a function of transmitting light.

The light-emitting elements 260a and 260b each include the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

The light-emitting element 260b includes, as part of the electrode 101, a conductive layer 101a, a conductive layer 101b over the conductive layer 101a, and a conductive layer 101c under the conductive layer 101a. In other words, the light-emitting element 260b includes the electrode 101 having a structure in which the conductive layer 101a is sandwiched between the conductive layer 101b and the conductive layer 101c.

In the light-emitting element 260b, the conductive layer 101b and the conductive layer 101c may be formed with different materials or the same material. The electrode 101 preferably has a structure in which the conductive layer 101a is sandwiched by the layers formed of the same conductive material, in which case patterning by etching can be performed easily.

In the light-emitting element 260b, the electrode 101 may include one of the conductive layer 101b and the conductive layer 101c.

For each of the conductive layers 101a, 101b, and 101c, which are included in the electrode 101, the structure and materials of the electrode 101 or 102 described in Embodiment 1 can be used.

In FIGS. 14A and 14B, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. The light-emitting element 260a or 260b having such a structure is used in a pixel of a display device, whereby a full-color display device can be fabricated. The thicknesses of the light-emitting layers may be the same or different.

Any one or more of the light-emitting layers 123B, 123G, and 123R preferably include at least one of the light-emitting layer 130 described in Embodiment 1 and the light-emitting layer 140 described in Embodiment 2, in which case a light-emitting element with high light emission efficiency can be fabricated.

One or more of the light-emitting layers 123B, 123G, and 123R may include two or more stacked layers.

When at least one light-emitting layer includes the light-emitting layer described in Embodiment 1 or 2 as described above and the light-emitting element 260a or 260b including the light-emitting layer is used in pixels in a display device, a display device with high light emission efficiency can be fabricated. The display device including the light-emitting element 260a or 260b can thus have reduced power consumption.

By providing an optical element (e.g., a color filter, a polarizing plate, and an anti-reflection film) on the light extraction side of the electrode through which light is extracted, the color purity of each of the light-emitting elements 260a and 260b can be improved. Therefore, the color purity of a display device including the light-emitting element 260a or 260b can be improved. Alternatively, the reflection of external light by each of the light-emitting elements 260a and 260b can be reduced. Therefore, the contrast ratio of a display device including the light-emitting element 260a or 260b can be improved.

For the other components of the light-emitting elements 260a and 260b, the components of the light-emitting elements in Embodiments 1 to 3 may be referred to.

<Structure Example 2 of Light-Emitting Element>

Next, structure examples different from the light-emitting elements illustrated in FIGS. 14A and 14B will be described below with reference to FIGS. 15A and 15B.

Figure 15A:
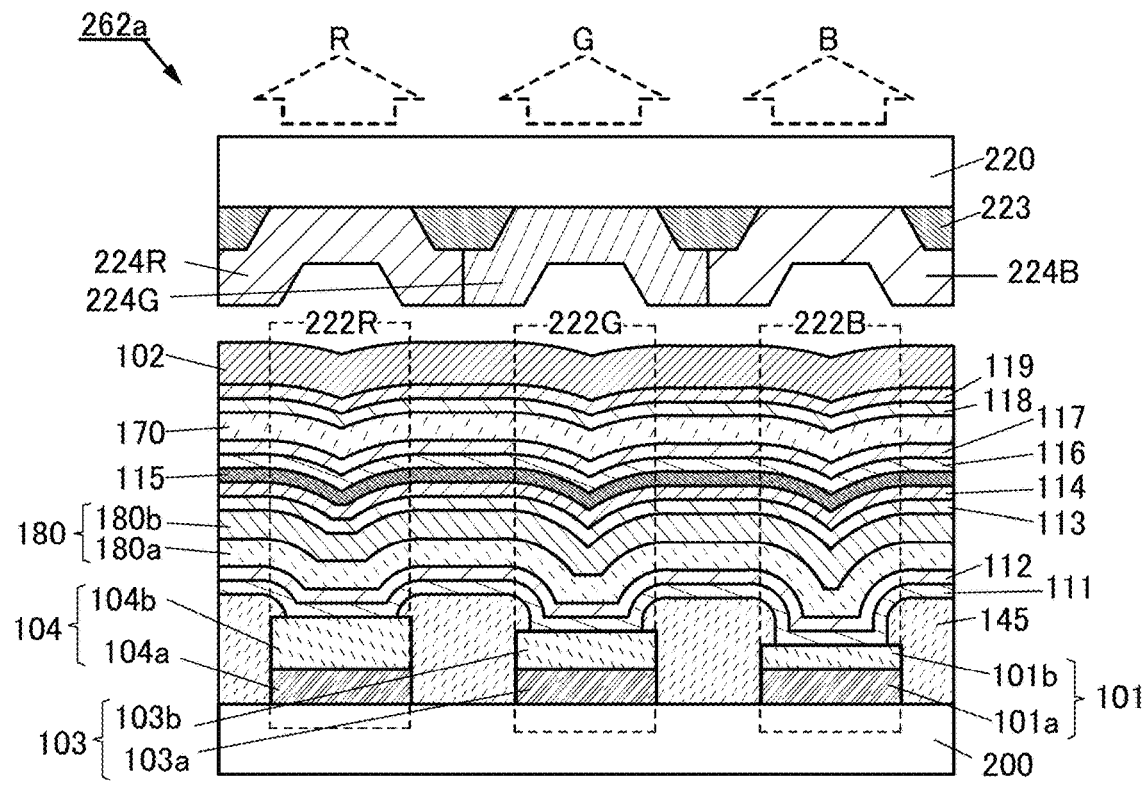
FIGS. 15A and 15B are each a schematic cross-sectional view of a light-emitting element of one embodiment of the present invention.
Figure 15B:
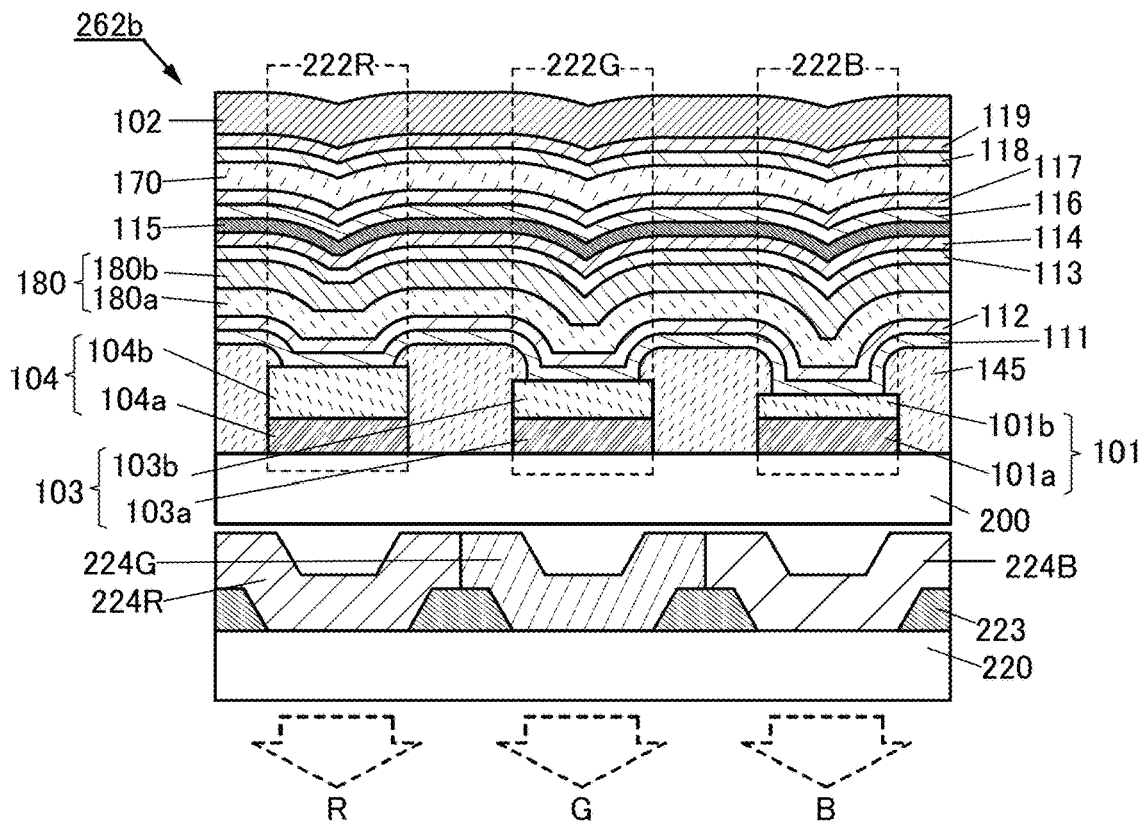

FIGS. 15A and 15B are cross-sectional views of a light-emitting element of one embodiment of the present invention. In FIGS. 15A and 15B, a portion having a function similar to that in FIGS. 14A and 14B is represented by the same hatch pattern as in FIGS. 14A and 14B and not especially denoted by a reference numeral in some cases. In addition, common reference numerals are used for portions having similar functions, and a detailed description of such portions is not repeated in some cases.

FIGS. 15A and 15B illustrate structure examples of a light-emitting element including the light-emitting layer between a pair of electrodes. A light-emitting element 262a illustrated in FIG. 15A has a top-emission structure in which light is extracted in a direction opposite to the substrate 200, and a light-emitting element 262b illustrated in FIG. 15B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least a light-emitting layer 170 and the charge-generation layer 115 are provided between the electrode 101 and the electrode 102, between the electrode 102 and the electrode 103, and between the electrode 102 and the electrode 104. The hole-injection layer 111, the hole-transport layer 112, a light-emitting layer 180, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101*a* and a conductive layer 101*b* over and in contact with the conductive layer 101*a*. The electrode 103 includes a conductive layer 103*a* and a conductive layer 103*b* over and in contact with the conductive layer 103*a*. The electrode 104 includes a conductive layer 104*a* and a conductive layer 104*b* over and in contact with the conductive layer 104*a*.

The light-emitting element 262*a* illustrated in FIG. 15A and the light-emitting element 262*b* illustrated in FIG. 15B each include a partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be separated into island shapes.

The light-emitting elements 262*a* and 262*b* each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum-dot type can increase color reproducibility of the display device.

One or more of optical elements may further be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 15A and 15B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. In addition, the optical element 224G and the optical element 224R may overlap with each other in a region where they overlap with the light-blocking layer 223. In addition, the optical element 224R and the optical element 224B may overlap with each other in a region where they overlap with the light-blocking layer 223.

For the substrate 200 and the substrate 220 provided with the optical elements, the substrate in Embodiment 1 may be referred to.

Furthermore, the light-emitting elements 262*a* and 262*b* have a microcavity structure.

<<Microcavity Structure>>

Light emitted from the light-emitting layer 170 and the light-emitting layer 180 resonates between a pair of electrodes (e.g., the electrode 101 and the electrode 102). The light-emitting layer 170 and the light-emitting layer 180 are formed at such a position as to intensify the light of a desired wavelength among light to be emitted. For example, by adjusting the optical length from a reflective region of the electrode 101 to the light-emitting region of the light-emitting layer 170 and the optical length from a reflective region of the electrode 102 to the light-emitting region of the light-emitting layer 170, the light of a desired wavelength among light emitted from the light-emitting layer 170 can be intensified. By adjusting the optical length from the reflective region of the electrode 101 to the light-emitting region of the light-emitting layer 180 and the optical length from the reflective region of the electrode 102 to the light-emitting region of the light-emitting layer 180, the light of a desired wavelength among light emitted from the light-emitting layer 180 can be intensified. In the case of a light-emitting element in which a plurality of light-emitting layers (here, the light-emitting layers 170 and 180) are stacked, the optical lengths of the light-emitting layers 170 and 180 are preferably optimized.

In each of the light-emitting elements 262*a* and 262*b*, by adjusting the thicknesses of the conductive layers (the conductive layer 101*b*, the conductive layer 103*b*, and the conductive layer 104*b*) in each region, the light of a desired wavelength among light emitted from the light-emitting layers 170 and 180 can be increased. Note that the thickness of at least one of the hole-injection layer 111 and the hole-transport layer 112 may differ between the regions to increase the light emitted from the light-emitting layers 170 and 180.

For example, in the case where the refractive index of the conductive material having a function of reflecting light in the electrodes 101 to 104 is lower than the refractive index of the light-emitting layer 170 or 180, the thickness of the conductive layer 101b of the electrode 101 is adjusted so that the optical length between the electrode 101 and the electrode 102 is $m_B \lambda_B/2$ ($m_B$ is a natural number and $\lambda_B$ is the wavelength of light intensified in the region 222B). Similarly, the thickness of the conductive layer 103b of the electrode 103 is adjusted so that the optical length between the electrode 103 and the electrode 102 is $m_G \lambda_G/2$ ($m_G$ is a natural number and $\lambda_G$ is the wavelength of light intensified in the region 222G). Furthermore, the thickness of the conductive layer 104b of the electrode 104 is adjusted so that the optical length between the electrode 104 and the electrode 102 is $m_R \lambda_R/2$ ($m_R$ is a natural number and $\lambda_R$ is the wavelength of light intensified in the region 222R).

In the case where it is difficult to precisely determine the reflective regions of the electrodes 101 to 104, the optical length for intensifying light emitted from the light-emitting layer 170 or the light-emitting layer 180 may be derived on the assumption that certain regions of the electrodes 101 to 104 are the reflective regions. In the case where it is difficult to precisely determine the light-emitting regions of the light-emitting layer 170 and the light-emitting layer 180, the optical length for intensifying light emitted from the light-emitting layer 170 and the light-emitting layer 180 may be derived on the assumption that certain regions of the light-emitting layer 170 and the light-emitting layer 180 are the light-emitting regions.

In the above manner, with the microcavity structure, in which the optical length between the pair of electrodes in the respective regions is adjusted, scattering and absorption of light in the vicinity of the electrodes can be suppressed, resulting in high light extraction efficiency. In the above structure, the conductive layers 101b, 103b, and 104b preferably have a function of transmitting light. The materials of the conductive layers 101b, 103b, and 104b may be the same or different. The conductive layers 101b, 103b, and 104b are preferably formed using the same materials, in which case patterning by etching can be performed easily. Each of the conductive layers 101b, 103b, and 104b may have a stacked structure of two or more layers.

Since the light-emitting element 262a illustrated in FIG. 15A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 262b illustrated in FIG. 15B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

In each of the light-emitting elements 262a and 262b, the conductive layers 101a, 103a, and 104a may be formed of different materials or the same material. When the conductive layers 101a, 103a, and 104a are formed of the same material, manufacturing cost of the light-emitting elements 262a and 262b can be reduced. Note that each of the conductive layers 101a, 103a, and 104a may have a stacked structure including two or more layers.

At least one of the light-emitting layers 170 and 180 in the light-emitting elements 262a and 262b preferably has the structure described in Embodiment 1 or 2, in which case light-emitting elements with high light emission efficiency can be fabricated.

Either or both of the light-emitting layers 170 and 180 may have a stacked structure of two layers, like a light-emitting layer 180a and a light-emitting layer 180b. The two light-emitting layers including two kinds of light-emitting materials (a first compound and a second compound) for emitting different colors of light enable light emission of a plurality of colors. It is particularly preferable to select the light-emitting materials of the light-emitting layers so that white light can be obtained by combining light emissions from the light-emitting layers 170 and 180.

Either or both of the light-emitting layers 170 and 180 may have a stacked structure of three or more layers, in which a layer not including a light-emitting material may be included.

In the above-described manner, the light-emitting element 262a or 262b including at least one of the light-emitting layers which have the structures described in Embodiments 1 and 2 is used in pixels in a display device, whereby a display device with high light emission efficiency can be fabricated. Accordingly, the display device including the light-emitting element 262a or 262b can have low power consumption.

For the other components of the light-emitting elements 262a and 262b, the components of the light-emitting elements 260a and 260b and the light-emitting elements in Embodiments 1 to 3 may be referred to.

<Fabrication Method of Light-Emitting Element>

Next, a method for fabricating a light-emitting element of one embodiment of the present invention is described below with reference to FIGS. 16A to 16C and FIGS. 17A to 17C. Here, a method for fabricating the light-emitting element 262a illustrated in FIG. 15A is described.

FIGS. 16A to 16C and FIGS. 17A to 17C are cross-sectional views illustrating a method for fabricating the light-emitting element of one embodiment of the present invention.

The method for manufacturing the light-emitting element 262a described below includes first to seventh steps.

<<First Step>>

Figure 16A:
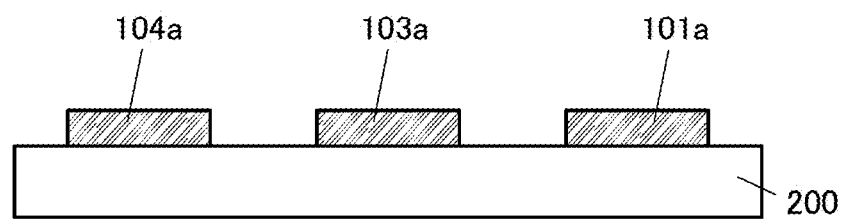
FIGS. 16A to 16C are schematic cross-sectional views illustrating a method for manufacturing a light-emitting element of one embodiment of the present invention.

In the first step, the electrodes (specifically the conductive layer 101a of the electrode 101, the conductive layer 103a of the electrode 103, and the conductive layer 104a of the electrode 104) of the light-emitting elements are formed over the substrate 200 (see FIG. 16A).

In this embodiment, a conductive layer having a function of reflecting light is formed over the substrate 200 and processed into a desired shape; whereby the conductive layers 101a, 103a, and 104a are formed. As the conductive layer having a function of reflecting light, an alloy film of silver, palladium, and copper (also referred to as an Ag—Pd—Cu film or APC) is used. The conductive layers 101a, 103a, and 104a are preferably formed through a step of processing the same conductive layer, because the manufacturing cost can be reduced.

Note that a plurality of transistors may be formed over the substrate 200 before the first step. The plurality of transistors may be electrically connected to the conductive layers 101a, 103a, and 104a.

<<Second Step>>

Figure 16B:
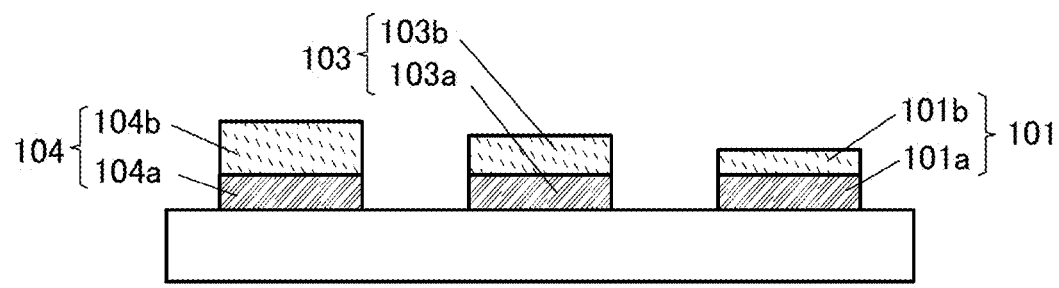

In the second step, the transparent conductive layer 101b having a function of transmitting light is formed over the conductive layer 101a of the electrode 101, the transparent conductive layer 103b having a function of transmitting light is formed over the conductive layer 103a of the electrode 103, and the transparent conductive layer 104*b* having a function of transmitting light is formed over the conductive layer 104*a* of the electrode 104 (see FIG. 16B).

In this embodiment, the conductive layers 101*b*, 103*b*, and 104*b* each having a function of transmitting light are formed over the conductive layers 101*a*, 103*a*, and 104*a* each having a function of reflecting light, respectively, whereby the electrode 101, the electrode 103, and the electrode 104 are formed. As the conductive layers 101*b*, 103*b*, and 104*b*, ITSO films are used.

The conductive layers 101*b*, 103*b*, and 104*b* having a function of transmitting light may be formed through a plurality of steps. When the conductive layers 101*b*, 103*b*, and 104*b* having a function of transmitting light are formed through a plurality of steps, they can be formed to have thicknesses which enable microcavity structures appropriate in the respective regions.

<<Third Step>>

Figure 16C:
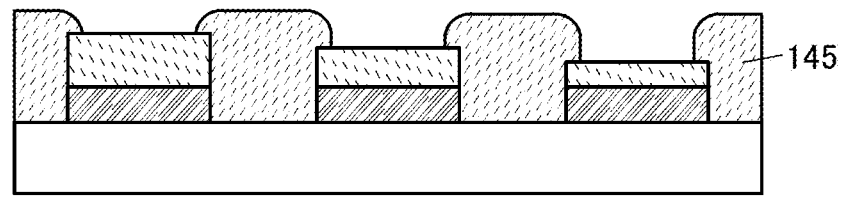

In the third step, the partition wall 145 that covers end portions of the electrodes of the light-emitting element is formed (see FIG. 16C).

The partition wall 145 includes an opening overlapping with the electrode. The conductive film exposed by the opening functions as the anode of the light-emitting element. As the partition wall 145, a polyimide-based resin is used in this embodiment.

In the first to third steps, since there is no possibility of damaging the EL layer (a layer containing an organic compound), a variety of film formation methods and fine processing technologies can be employed. In this embodiment, a reflective conductive layer is formed by a sputtering method, a pattern is formed over the conductive layer by a lithography method, and then the conductive layer is processed into an island shape by a dry etching method or a wet etching method to form the conductive layer 101*a* of the electrode 101, the conductive layer 103*a* of the electrode 103, and the conductive layer 104*a* of the electrode 104. Then, a transparent conductive film is formed by a sputtering method, a pattern is formed over the transparent conductive film by a lithography method, and then the transparent conductive film is processed into island shapes by a wet etching method to form the electrodes 101, 103, and 104.

<<Fourth Step>>

Figure 17A:
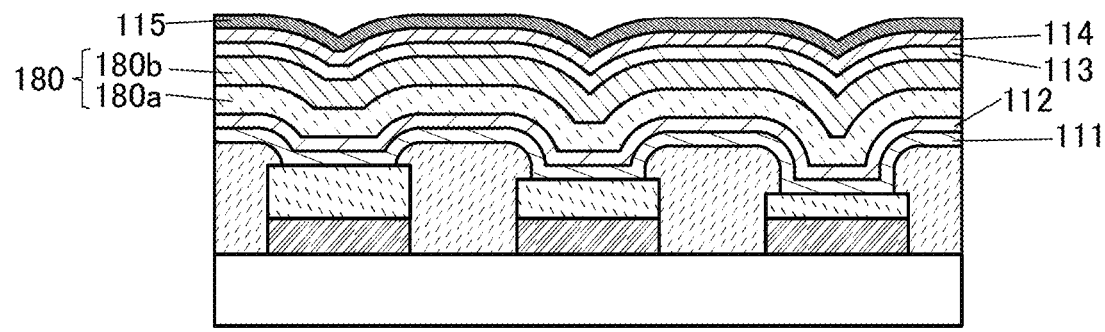
FIGS. 17A to 17C are schematic cross-sectional views illustrating a method for manufacturing a light-emitting element of one embodiment of the present invention.

In the fourth step, the hole-injection layer 111, the hole-transport layer 112, the light-emitting layer 180, the electron-transport layer 113, the electron-injection layer 114, and the charge-generation layer 115 are formed (see FIG. 17A).

The hole-injection layer 111 can be formed by co-evaporating a hole-transport material and a material containing an acceptor substance. Note that a co-evaporation method is an evaporation method in which a plurality of different substances is concurrently vaporized from respective different evaporation sources. The hole-transport layer 112 can be formed by evaporating a hole-transport material.

The light-emitting layer 180 can be formed by evaporating the guest material that emits light of at least one of violet, blue, blue green, green, yellow green, yellow, orange, and red. As the guest material, a fluorescent or phosphorescent organic compound can be used. The light-emitting organic compound may be evaporated alone or the light-emitting organic compound mixed with another material may be evaporated. In addition, the light-emitting layer having any of the structures described in Embodiments 1 to 3 is preferably used. The light-emitting layer 180 may have a two-layer structure. In that case, the two light-emitting layers preferably contain light-emitting substances that emit light of different colors.

The electron-transport layer 113 can be formed by evaporating a substance having a high electron-transport property. The electron-injection layer 114 can be formed by evaporating a substance having a high electron-injection property.

The charge-generation layer 115 can be formed by evaporating a material obtained by adding an electron acceptor (acceptor) to a hole-transport material or a material obtained by adding an electron donor (donor) to an electron-transport material.

<<Fifth Step>>

Figure 17B:
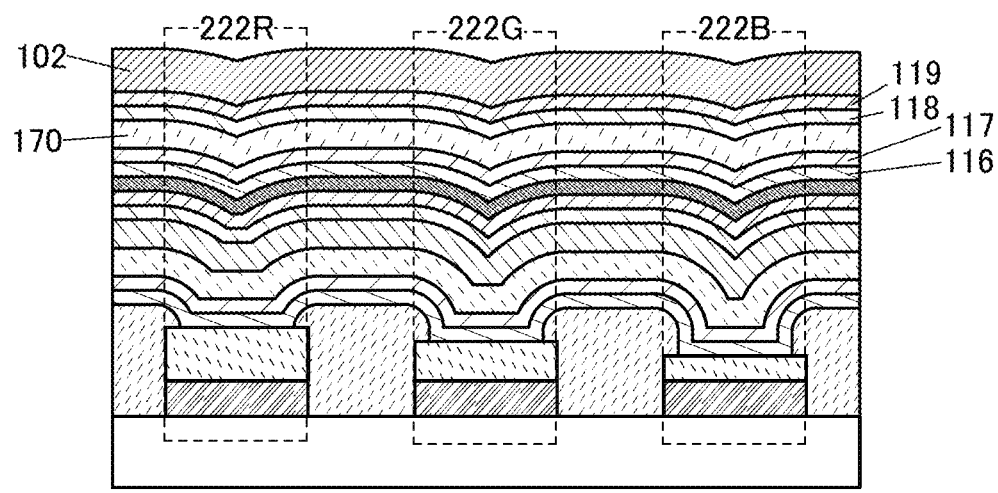

In the fifth step, the hole-injection layer 116, the hole-transport layer 117, the light-emitting layer 170, the electron-transport layer 118, the electron-injection layer 119, and the electrode 102 are formed (see FIG. 17B).

The hole-injection layer 116 can be formed by using a material and a method which are similar to those of the hole-injection layer 111. The hole-transport layer 117 can be formed by using a material and a method which are similar to those of the hole-transport layer 112.

The light-emitting layer 170 can be formed by evaporating the guest material that emits light of at least one color selected from violet, blue, blue green, green, yellow green, yellow, orange, and red. As the guest material, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having higher excitation energy than the guest material.

The electron-transport layer 118 can be formed by using a material and a method which are similar to those of the electron-transport layer 113. The electron-injection layer 119 can be formed by using a material and a method which are similar to those of the electron-injection layer 114.

The electrode 102 can be formed by stacking a reflective conductive film and a light-transmitting conductive film. The electrode 102 may have a single-layer structure or a stacked-layer structure.

Through the above-described steps, the light-emitting element including the region 222B, the region 222G, and the region 222R over the electrode 101, the electrode 103, and the electrode 104, respectively, are formed over the substrate 200.

<<Sixth Step>>

Figure 17C:
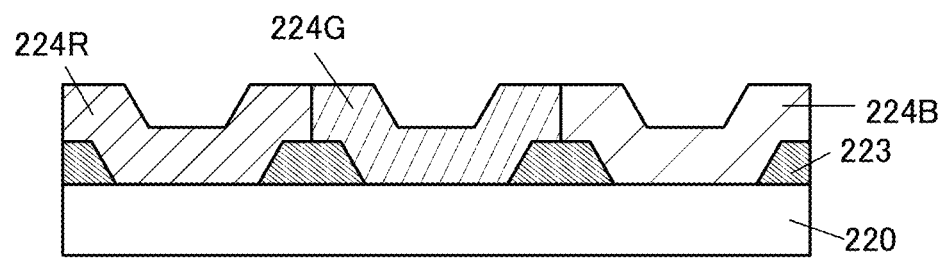

In the sixth step, the light-blocking layer 223, the optical element 224B, the optical element 224G, and the optical element 224R are formed over the substrate 220 (see FIG. 17C).

As the light-blocking layer 223, a resin film containing black pigment is formed in a desired region. Then, the optical element 224B, the optical element 224G, and the optical element 224R are formed over the substrate 220 and the light-blocking layer 223. As the optical element 224B, a resin film containing blue pigment is formed in a desired region. As the optical element 224G, a resin film containing green pigment is formed in a desired region. As the optical element 224R, a resin film containing red pigment is formed in a desired region.

<<Seventh Step>>

In the seventh step, the light-emitting element formed over the substrate 200 is attached to the light-blocking layer 223, the optical element 224B, the optical element 224G, and the optical element 224R formed over the substrate 220, and sealed with a sealant (not illustrated).

Through the above-described steps, the light-emitting element 262*a* illustrated in FIG. 15A can be formed.

Note that the structures described in this embodiment can be used in appropriate combination with any of the structures described in the other embodiments.

Embodiment 5

In this embodiment, a display device of one embodiment of the present invention will be described below with reference to FIGS. 18A and 18B, FIGS. 19A and 19B, FIG. 20, FIGS. 21A and 21B, FIGS. 22A and 22B, FIG. 23, FIGS. 24A and 24B, FIG. 25, FIGS. 26A and 26B, FIGS. 27A to 27D, and FIG. 28.

<Structure Example 1 of Display Device>

Figure 18A:
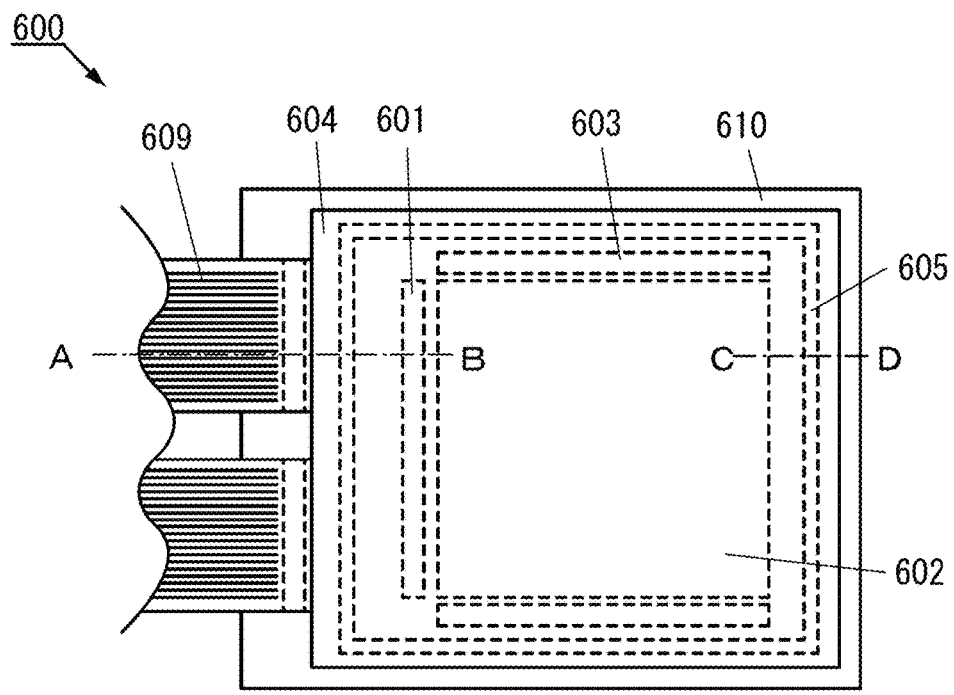
FIGS. 18A and 18B are a top view and a schematic cross-sectional view illustrating a display device of one embodiment of the present invention.
Figure 18B:
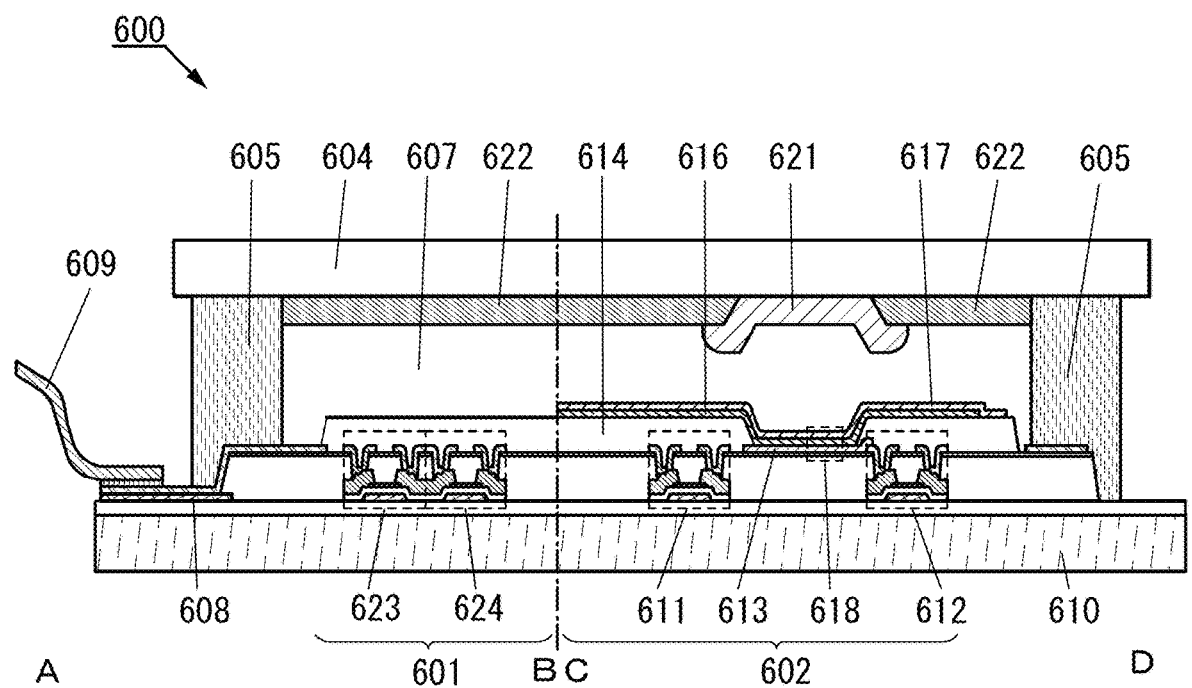

FIG. 18A is a top view illustrating a display device 600 and FIG. 18B is a cross-sectional view taken along the dashed-dotted line A-B and the dashed-dotted line C-D in FIG. 18A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission of a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage by a film which is formed over the partition wall 614, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for these transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is Al, Ga, Y, zirconium (Zr), La, cerium (Ce), Sn, hafnium (Hf), or Nd).

An EL layer 616 and an upper electrode 617 are formed over the lower electrode 613. Here, the lower electrode 613 functions as an anode and the upper electrode 617 functions as a cathode.

In addition, the EL layer 616 is formed by various methods such as an evaporation method with an evaporation mask, an ink-jet method, or a spin coating method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and the desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

Here, a method for forming the EL layer 616 by a droplet discharge method is described with reference to FIGS. 27A to 27D. FIGS. 27A to 27D are cross-sectional views illustrating the method for forming the EL layer 616.

Figure 27A:
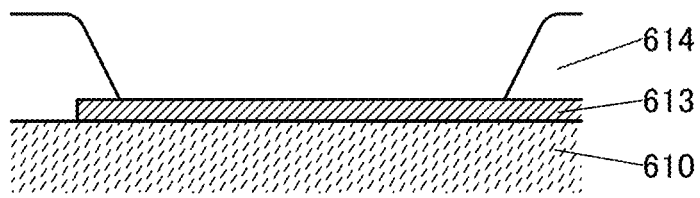
FIGS. 27A to 27D are schematic cross-sectional views illustrating a method for forming an EL layer.
Figure 27B:
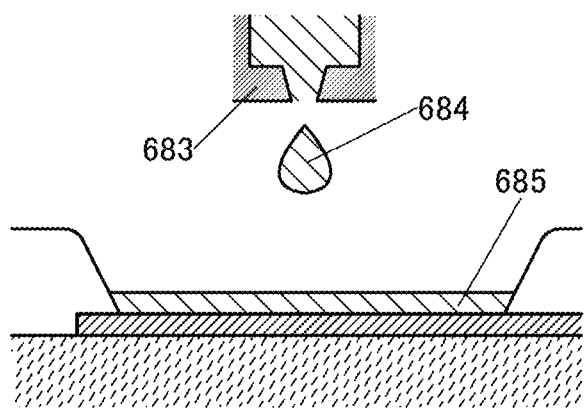

First, the element substrate 610 over which the lower electrode 613 and the partition wall 614 are formed is illustrated in FIG. 27A. However, as in FIG. 18B, the lower electrode 613 and the partition wall 614 may be formed over an insulating film over a substrate.

Next, in a portion where the lower electrode 613 is exposed, which is an opening portion of the partition wall 614, a droplet 684 is discharged from a droplet discharge apparatus 683 to form a layer 685 containing a composition. The droplet 684 is a composition containing a solvent and is attached to the lower electrode 613 (see FIG. 27B).

Note that the method for discharging the droplet 684 may be performed under reduced pressure.

Figure 27C:
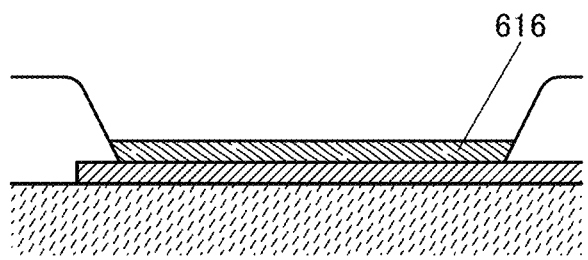

Then, the solvent is removed from the layer 685 containing the composition, and the resulting layer is solidified to form the EL layer 616 (see FIG. 27C).

The solvent may be removed by drying or heating.

Figure 27D:
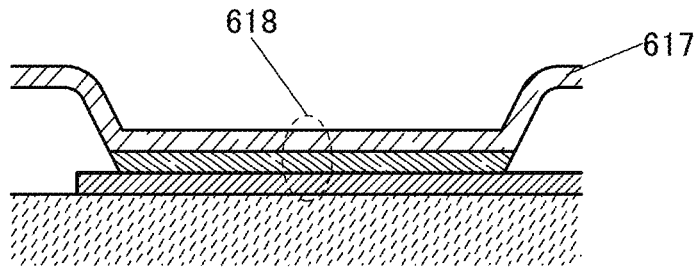

Next, the upper electrode 617 is formed over the EL layer 616, and the light-emitting element 618 is formed (see FIG. 27D).

When the EL layer 616 is formed by a droplet discharge method as described above, the composition can be selectively discharged, and accordingly, loss of materials can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 28:
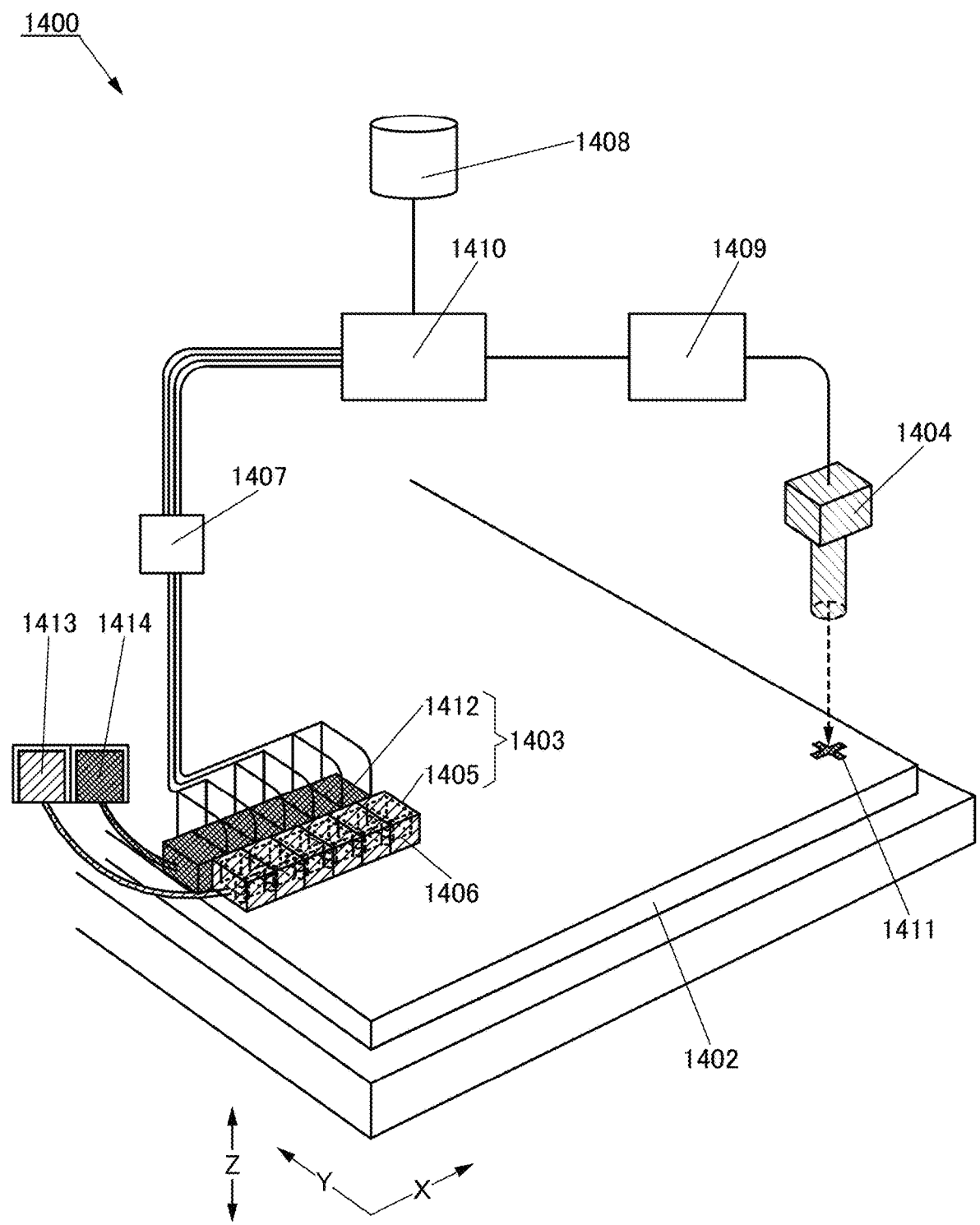
FIG. 28 is a conceptual diagram illustrating a droplet discharge apparatus.

Next, a droplet discharge apparatus used for the droplet discharge method is described with reference to FIG. 28. FIG. 28 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used for the imaging means 1404. Note that information on a pattern to be formed over the substrate 1402 is stored in a storage medium 1408, and the control signal is transmitted to the control means 1407 on the basis of the information, whereby the head 1405 and the head 1412 of the droplet discharge means 1403 can be separately controlled. A material to be discharged is supplied to the head 1405 and the head 1412 from a material source 1413 and a material source 1414, respectively, through pipes.

Inside the head 1405, a space 1406 filled with a liquid material as indicated by a dotted line and a nozzle serving as a discharge opening are provided. Although not illustrated, an internal structure of the head 1412 is similar to that of the head 1405. When the nozzle sizes of the heads 1405 and 1412 are different from each other, patterns of different materials can be drawn with different widths simultaneously. Alternatively, one head can discharge plural kinds of light-emitting materials or the like and draw a pattern. When a pattern is drawn in a large area, the same material can be simultaneously discharged from a plurality of nozzles and the pattern can be drawn to improve throughput. When a large substrate is used, the heads 1405 and 1412 can freely scan the substrate in directions indicated by arrows X, Y, and Z in FIG. 28, and a region in which a pattern is drawn can be freely set. Thus, a plurality of the same patterns can be drawn over one substrate.

In addition, the step of discharging the composition may be performed under reduced pressure. The substrate may be heated when the composition is discharged. After the composition is discharged, either or both steps of drying and baking are performed. Both the drying and baking steps are heat treatment steps but different in purpose, temperature, and time period. The steps of drying and baking are each performed under normal pressure or reduced pressure, by laser light irradiation, rapid thermal annealing, heating using a heating furnace, or the like. Note that there is no particular limitation on the timing and the number of steps of this heat treatment. The temperature for performing each of the steps of drying and baking in a favorable manner depends on the materials of the substrate and the properties of the composition.

In the above-described manner, the display device including any of the light-emitting elements and the optical elements which are described in Embodiments 1 to 3 can be obtained.

<Structure Example 2 of Display Device>

Next, another example of the display device is described with reference to FIGS. 19A and 19B and FIG. 20. Note that FIGS. 19A and 19B and FIG. 20 are each a cross-sectional view of a display device of one embodiment of the present invention.

Figure 19A:
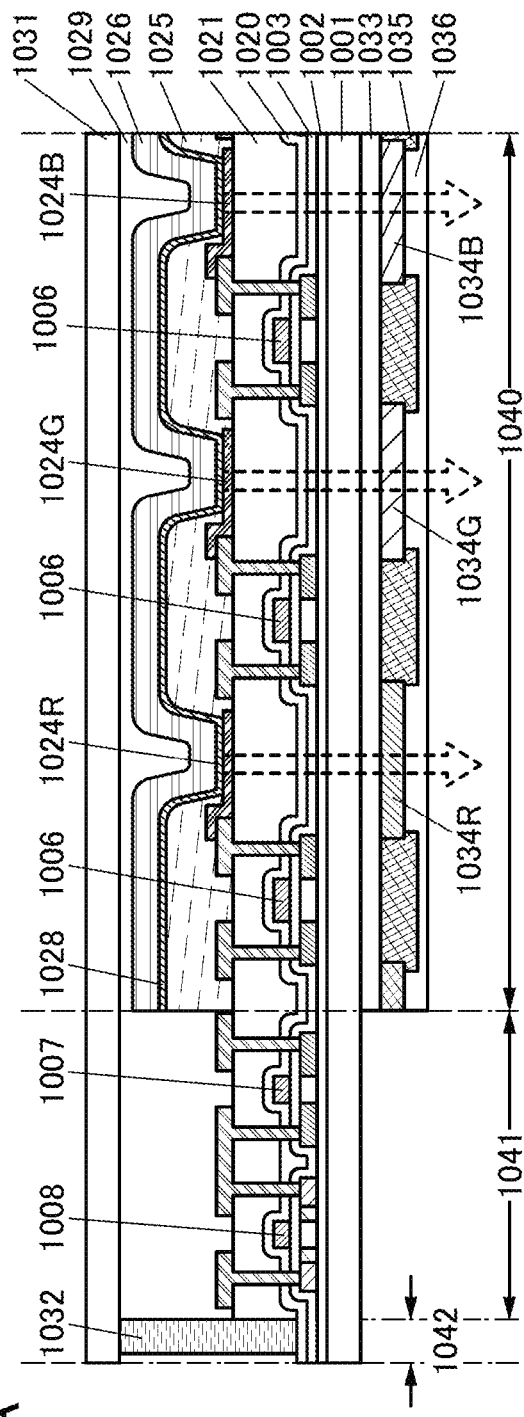
FIGS. 19A and 19B are schematic cross-sectional views each illustrating a display device of one embodiment of the present invention.
Figure 20:
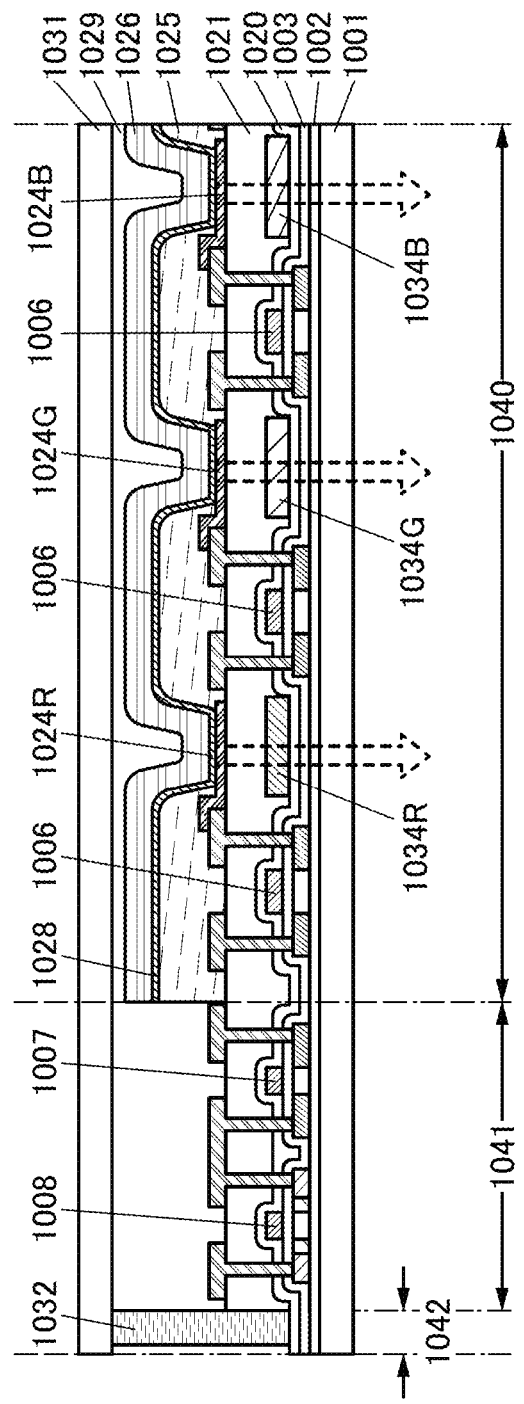
FIG. 20 is a schematic cross-sectional view illustrating a display device of one embodiment of the present invention.

In FIG. 19A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 19A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 19A, red light, green light, and blue light transmit the coloring layers, and thus an image can be displayed with the use of pixels of three colors.

Figure 19B:
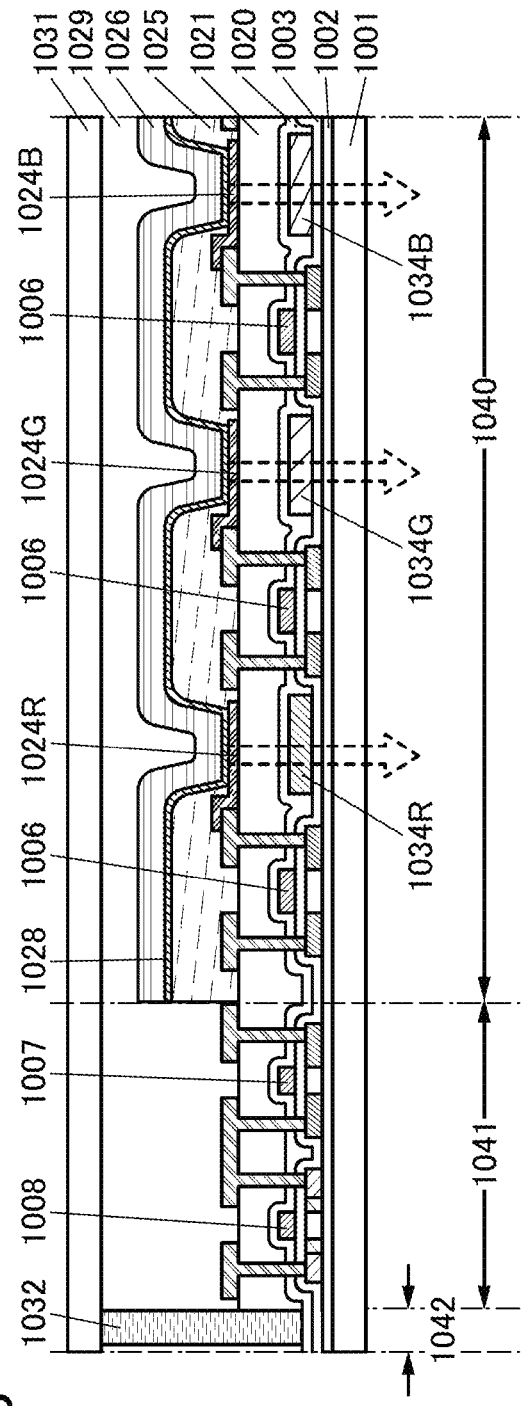

FIG. 19B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020.

As in this structure, the coloring layers may be provided between the substrate 1001 and the sealing substrate 1031.

FIG. 20 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

<Structure Example 3 of Display Device>

Figure 21A:
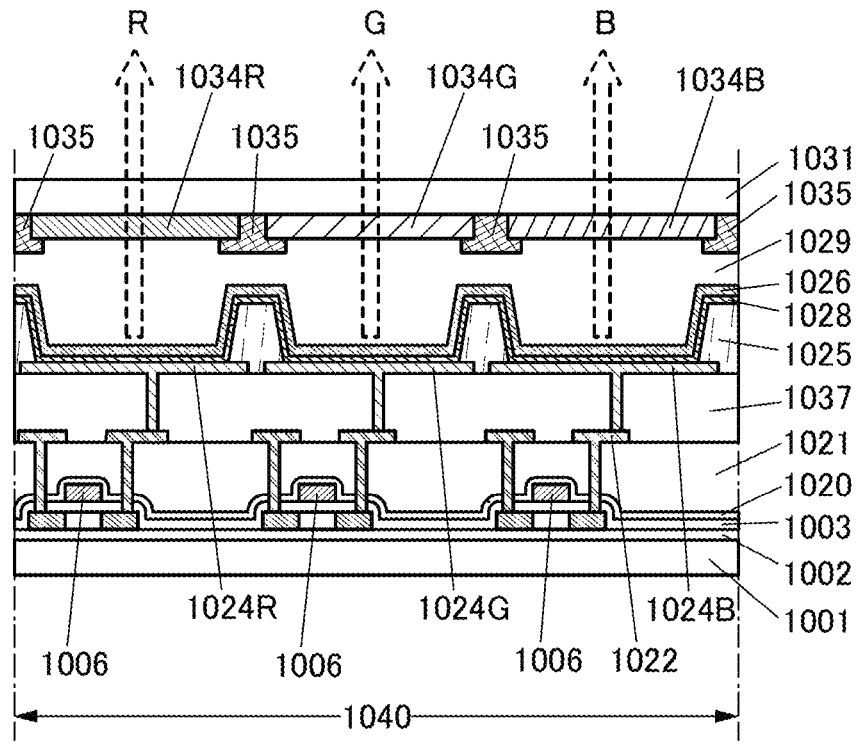
FIGS. 21A and 21B are schematic cross-sectional views each illustrating a display device of one embodiment of the present invention.
Figure 21B:
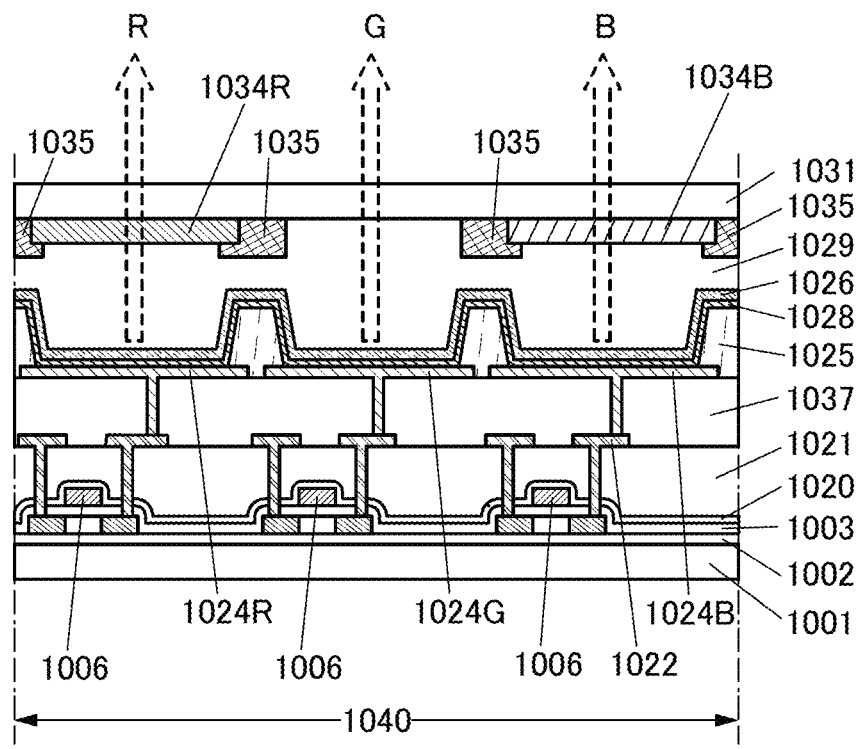

FIGS. 21A and 21B are each an example of a cross-sectional view of a display device having a top emission structure. Note that FIGS. 21A and 21B are each a cross-sectional view illustrating the display device of one embodiment of the present invention, and the driver circuit portion 1041, the peripheral portion 1042, and the like, which are illustrated in FIGS. 19A and 19B and FIG. 20, are not illustrated therein.

In this case, as the substrate 1001, a substrate that does not transmit light can be used. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed by using a material similar to that of the second interlayer insulating film, or can be formed by using any other known materials.

The lower electrodes 1024R, 1024G, and 1024B of the light-emitting elements each function as an anode here, but may function as a cathode. Further, in the case of a display device having a top-emission structure as illustrated in FIGS. 21A and 21B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 21A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 21A illustrates the structure provided with the light-emitting elements and the coloring layers for the light-emitting elements as an example; however, the structure is not limited thereto. For example, as shown in FIG. 21B, a structure including the red coloring layer 1034R and the blue coloring layer 1034B but not including a green coloring layer may be employed to achieve full color display with the three colors of red, green, and blue. The structure as illustrated in FIG. 21A where the light-emitting elements are provided with the coloring layers is effective to suppress reflection of external light. In contrast, the structure as illustrated in FIG. 21B where the light-emitting elements are provided with the red coloring layer and the blue coloring layer and without the green coloring layer is effective to reduce power consumption because of small energy loss of light emitted from the green light-emitting element.

<Structure Example 4 of Display Device>

Figure 23:
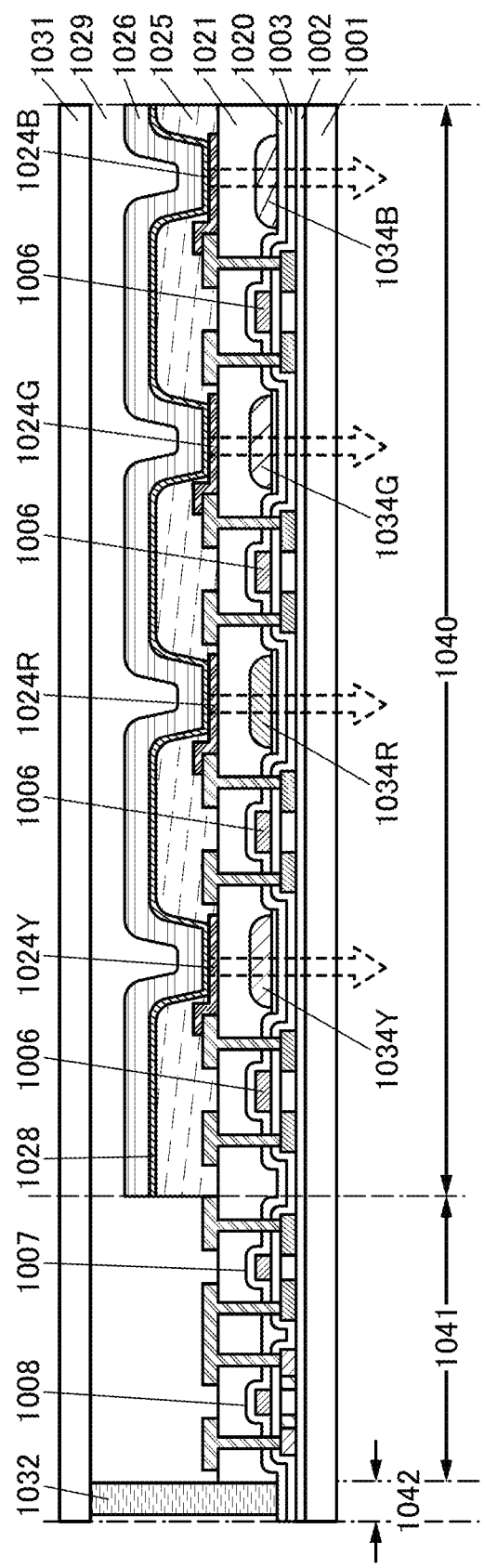
FIG. 23 is a schematic cross-sectional view illustrating a display device of one embodiment of the present invention.

Although a display device including sub-pixels of three colors (red, green, and blue) is described above, the number of colors of sub-pixels may be four (red, green, blue, and yellow, or red, green, blue, and white). FIGS. 22A and 22B, FIG. 23, and FIGS. 24A and 24B illustrate structures of display devices each including the lower electrodes 1024R, 1024G, 1024B, and 1024Y. FIGS. 22A and 22B and FIG. 23 each illustrate a display device having a structure in which light is extracted from the substrate 1001 side on which transistors are formed (bottom-emission structure), and FIGS. 24A and 24B each illustrate a display device having a structure in which light is extracted from the sealing substrate 1031 side (top-emission structure).

FIG. 22A illustrates an example of a display device in which optical elements (the coloring layer 1034R, the coloring layer 1034G, the coloring layer 1034B, and a coloring layer 1034Y) are provided on the transparent base material 1033. FIG. 22B illustrates an example of a display device in which optical elements (the coloring layer 1034R, the coloring layer 1034G, the coloring layer 1034B, and the coloring layer 1034Y) are provided between the gate insulating film 1003 and the first interlayer insulating film 1020. FIG. 23 illustrates an example of a display device in which optical elements (the coloring layer 1034R, the coloring layer 1034G, the coloring layer 1034B, and the coloring layer 1034Y) are provided between the first interlayer insulating film 1020 and the second interlayer insulating film 1021.

The coloring layer 1034R transmits red light, the coloring layer 1034G transmits green light, and the coloring layer 1034B transmits blue light. The coloring layer 1034Y transmits yellow light or transmits light of a plurality of colors selected from blue, green, yellow, and red. When the coloring layer 1034Y can transmit light of a plurality of colors selected from blue, green, yellow, and red, light released from the coloring layer 1034Y may be white light. Since the light-emitting element which transmits yellow or white light has high light emission efficiency, the display device including the coloring layer 1034Y can have lower power consumption.

Figure 24A:
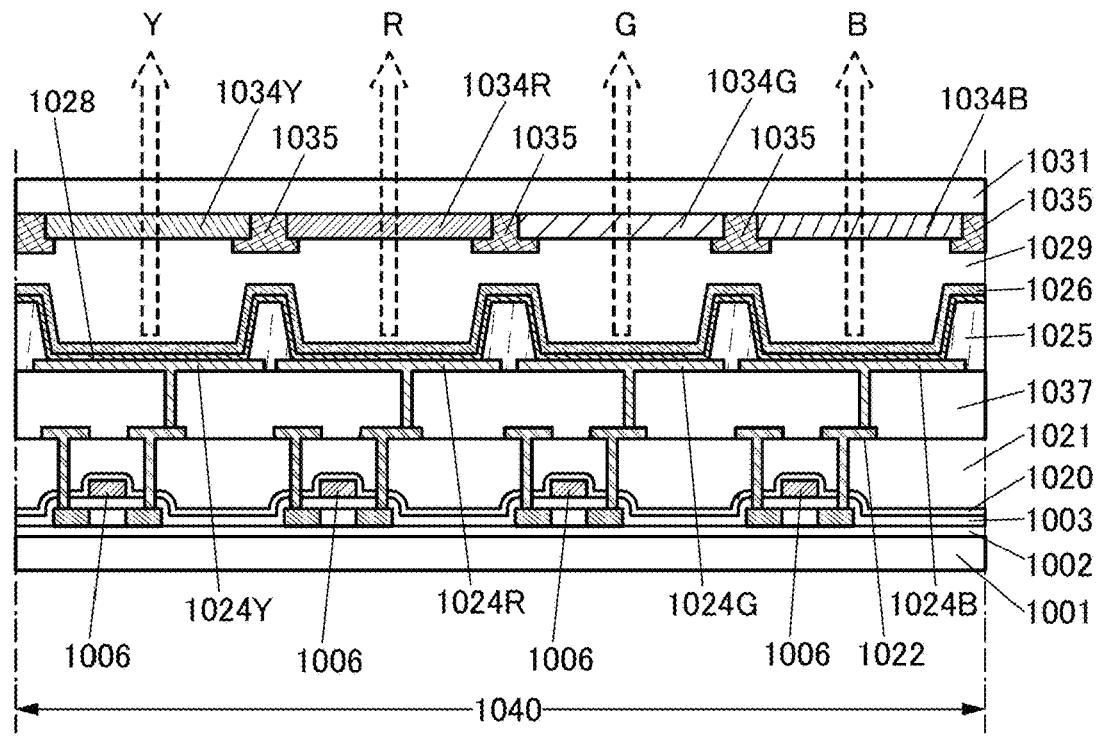
FIGS. 24A and 24B are schematic cross-sectional views each illustrating a display device of one embodiment of the present invention.
Figure 24B:
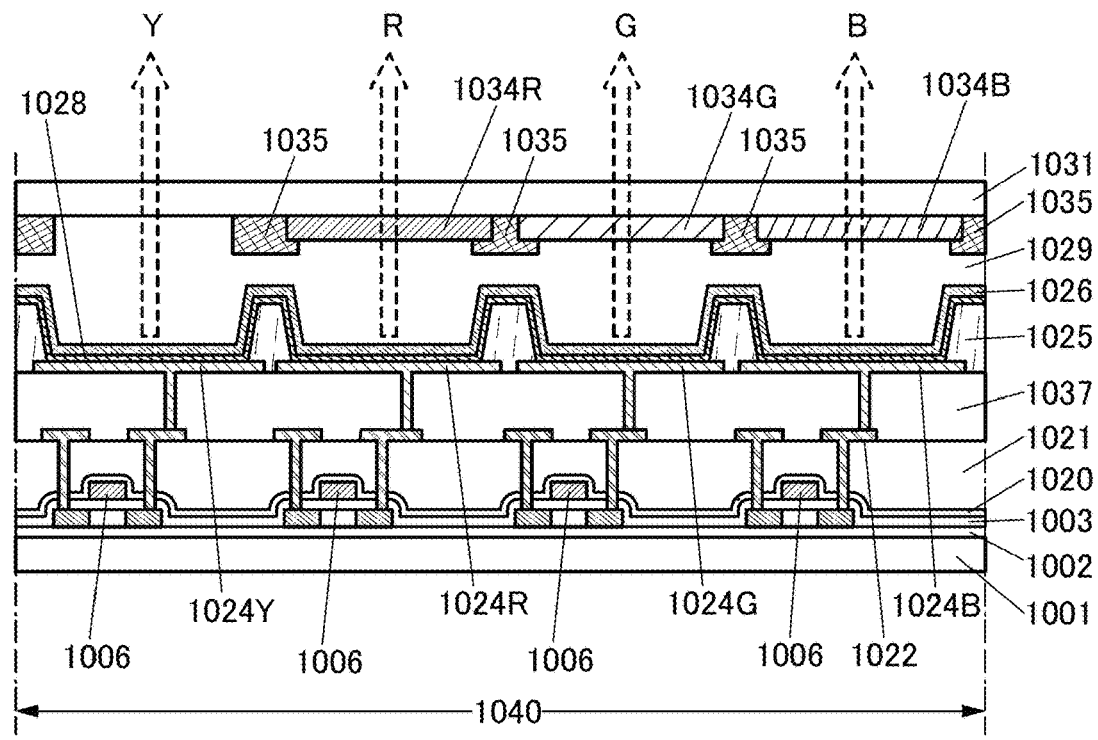

In the top-emission display devices illustrated in FIGS. 24A and 24B, a light-emitting element including the lower electrode 1024Y preferably has a microcavity structure between the upper electrode 1026 and the lower electrodes 1024R, 1024G, 1024B, and 1024Y as in the display device illustrated in FIG. 21A. In the display device illustrated in FIG. 24A, sealing can be performed with the sealing substrate 1031 on which the coloring layers (the red coloring layer 1034R, the green coloring layer 1034G, the blue coloring layer 1034B, and the yellow coloring layer 1034Y) are provided.

Light emitted through the microcavity and the yellow coloring layer 1034Y has an emission spectrum in a yellow region. Since yellow is a color with a high luminosity factor, a light-emitting element emitting yellow light has high light emission efficiency. Therefore, the display device of FIG. 24A can reduce power consumption.

FIG. 24A illustrates the structure provided with the light-emitting elements and the coloring layers for the light-emitting elements as an example; however, the structure is not limited thereto. For example, as shown in FIG. 24B, a structure including the red coloring layer 1034R, the green coloring layer 1034G, and the blue coloring layer 1034B but not including a yellow coloring layer may be employed to achieve full color display with the four colors of red, green, blue, and yellow or of red, green, blue, and white. The structure as illustrated in FIG. 24A where the light-emitting elements are provided with the coloring layers is effective to suppress reflection of external light. In contrast, the structure as illustrated in FIG. 24B where the light-emitting elements are provided with the red coloring layer, the green coloring layer, and the blue coloring layer and without the yellow coloring layer is effective to reduce power consumption because of small energy loss of light emitted from the yellow or white light-emitting element.

<Structure Example 5 of Display Device>

Figure 25:
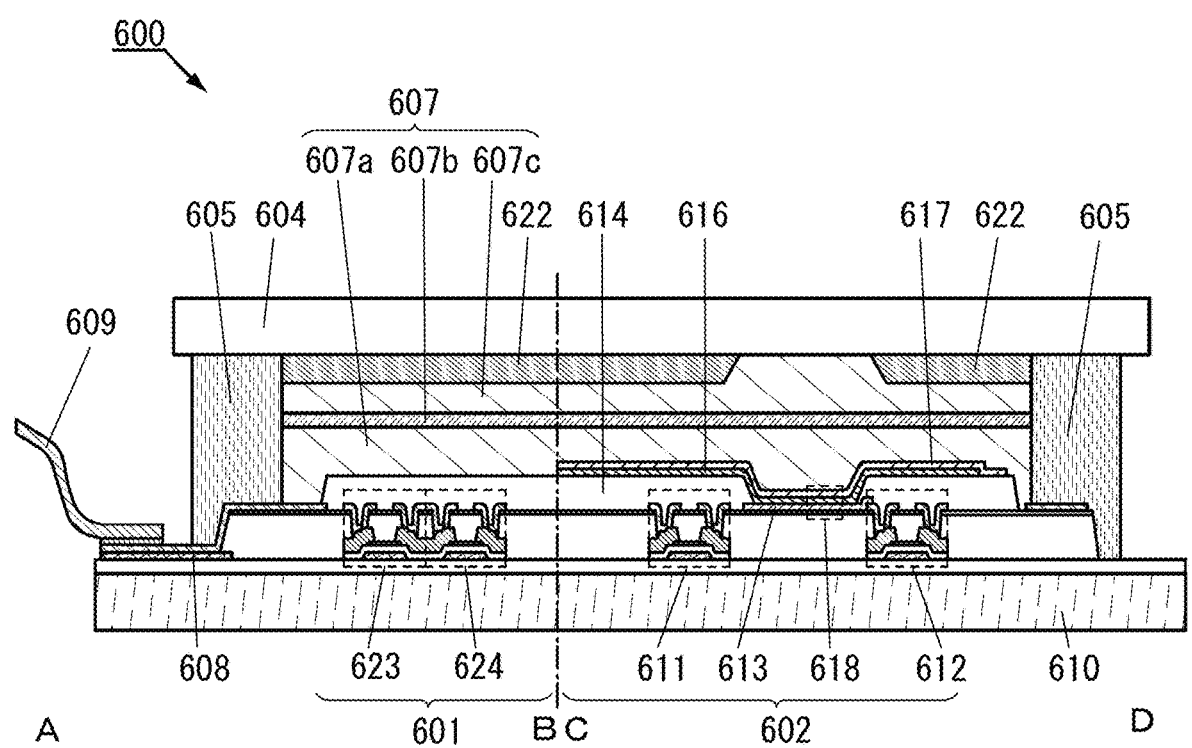
FIG. 25 is a schematic cross-sectional view illustrating a display device of one embodiment of the present invention.

Next, a display device of another embodiment of the present invention is described with reference to FIG. 25. FIG. 25 is a cross-sectional view taken along the dashed-dotted line A-B and the dashed-dotted line C-D in FIG. 18A. Note that in FIG. 25, portions having functions similar to those of portions in FIG. 18B are given the same reference numerals as in FIG. 18B, and a detailed description of the portions is omitted.

The display device 600 in FIG. 25 includes a sealing layer 607a, a sealing layer 607b, and a sealing layer 607c in a region 607 surrounded by the element substrate 610, the sealing substrate 604, and the sealant 605. For one or more of the sealing layer 607a, the sealing layer 607b, and the sealing layer 607c, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layers 607a, 607b, and 607c can prevent deterioration of the light-emitting element 618 due to impurities such as water, which is preferable. In the case where the sealing layers 607a, 607b, and 607c are formed, the sealant 605 is not necessarily provided.

Alternatively, any one or two of the sealing layers 607a, 607b, and 607c may be provided or four or more sealing layers may be formed. When the sealing layer has a multilayer structure, the impurities such as water can be effectively prevented from entering the light-emitting element 618 which is inside the display device from the outside of the display device 600. In the case where the sealing layer has a multilayer structure, a resin and an organic material are preferably stacked.

<Structure Example 6 of Display Device>

Although the display devices in the structure examples 1 to 4 in this embodiment each have a structure including optical elements, one embodiment of the present invention does not necessarily include an optical element.

Figure 26A:
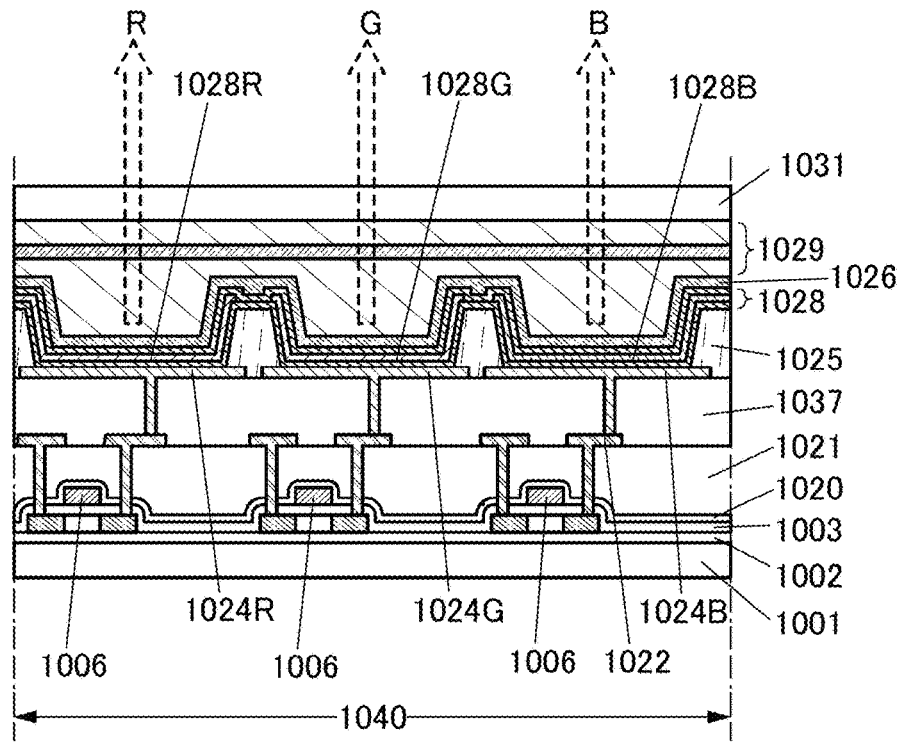
FIGS. 26A and 26B are schematic cross-sectional views each illustrating a display device of one embodiment of the present invention.
Figure 26B:
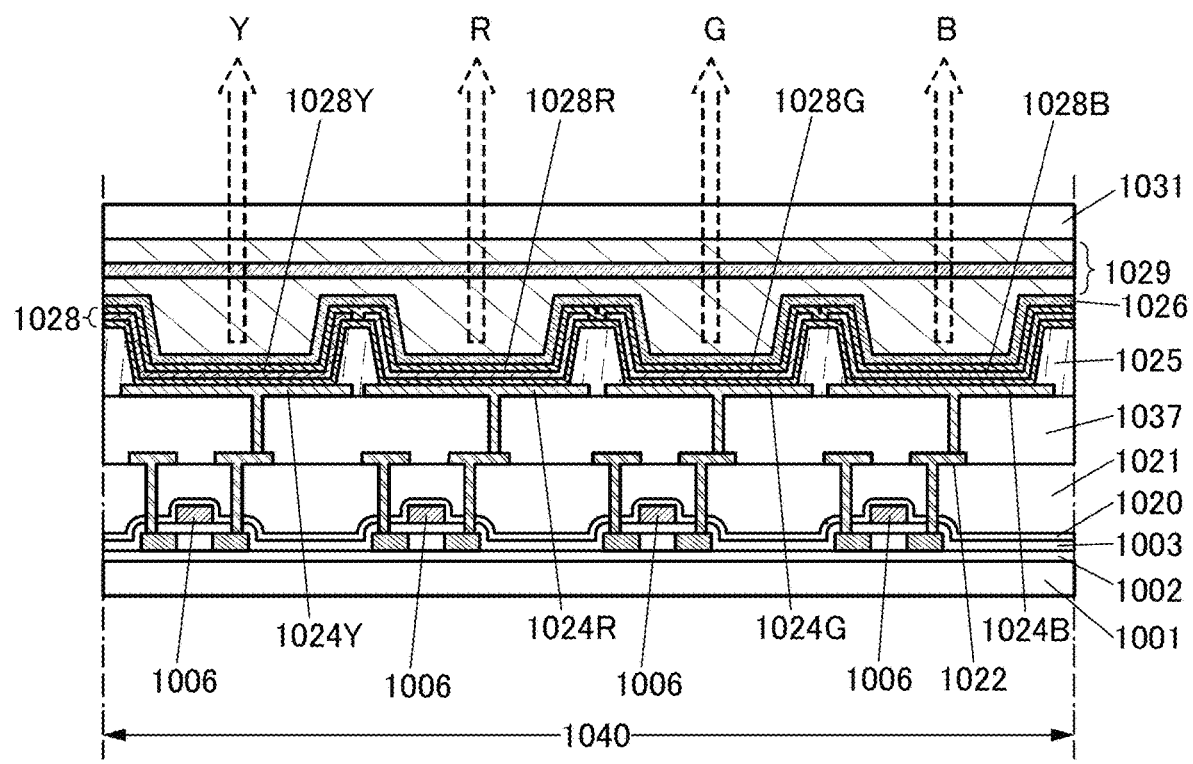

FIGS. 26A and 26B each illustrate a display device having a structure in which light is extracted from the sealing substrate 1031 side (a top-emission display device). FIG. 26A illustrates an example of a display device including a light-emitting layer 1028R, a light-emitting layer 1028G, and a light-emitting layer 1028B. FIG. 26B illustrates an example of a display device including a light-emitting layer 1028R, a light-emitting layer 1028G, a light-emitting layer 1028B, and a light-emitting layer 1028Y.

The light-emitting layer 1028R has a function of exhibiting red light, the light-emitting layer 1028G has a function of exhibiting green light, and the light-emitting layer 1028B has a function of exhibiting blue light. The light-emitting layer 1028Y has a function of exhibiting yellow light or a function of exhibiting light of a plurality of colors selected from blue, green, and red. The light-emitting layer 1028Y may exhibit whit light. Since the light-emitting element which exhibits yellow or white light has high light emission efficiency, the display device including the light-emitting layer 1028Y can have lower power consumption.

Each of the display devices in FIGS. 26A and 26B does not necessarily include coloring layers serving as optical elements because EL layers exhibiting lights of different colors are included in sub-pixels.

For the sealing layer 1029, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer 1029 can prevent deterioration of the light-emitting element due to impurities such as water, which is preferable.

Alternatively, the sealing layer 1029 may have a single-layer or two-layer structure, or four or more sealing layers may be formed as the sealing layer 1029. When the sealing layer has a multilayer structure, the impurities such as water can be effectively prevented from entering the inside of the display device from the outside of the display device. In the case where the sealing layer has a multilayer structure, a resin and an organic material are preferably stacked.

Note that the sealing substrate 1031 has a function of protecting the light-emitting element. Thus, for the sealing substrate 1031, a flexible substrate or a film can be used.

Note that the structures described in this embodiment can be combined as appropriate with any of the other structures in this embodiment and the other embodiments.

Embodiment 6

In this embodiment, a display device including a light-emitting element of one embodiment of the present invention will be described with reference to FIGS. 29A and 29B, FIGS. 30A and 30B, and FIGS. 31A and 31B.

Figure 29A:
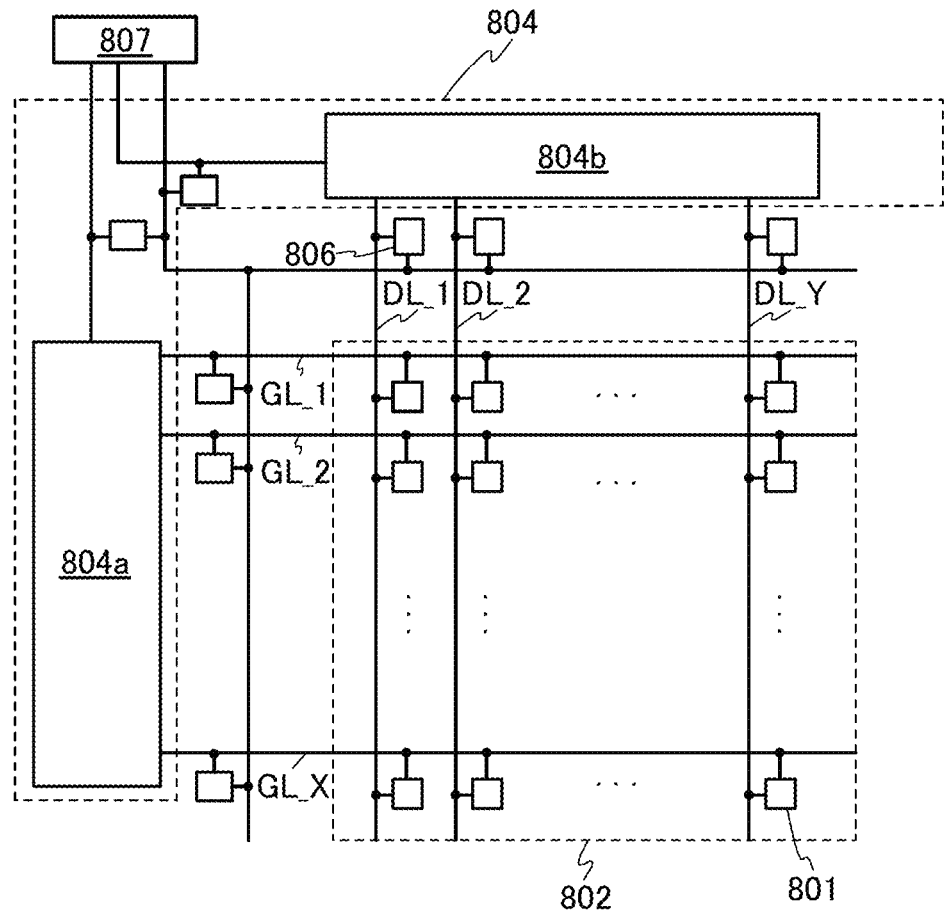
FIGS. 29A and 29B are a block diagram and a circuit diagram illustrating a display device of one embodiment of the present invention.
Figure 29B:
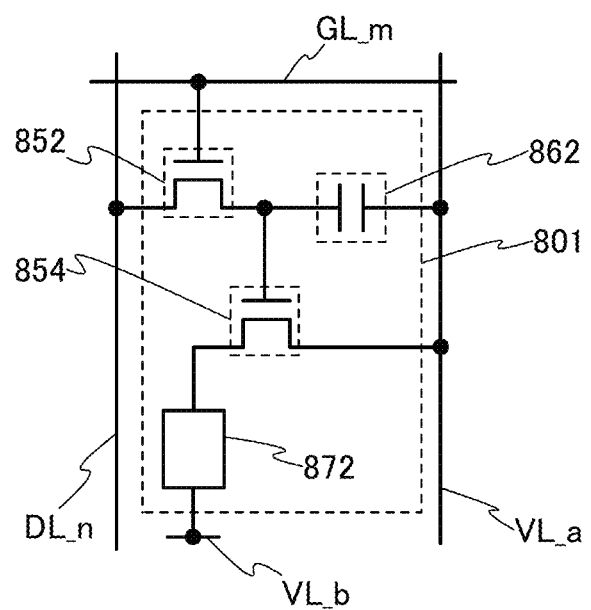

FIG. 29A is a block diagram illustrating the display device of one embodiment of the present invention, and FIG. 29B is a circuit diagram illustrating a pixel circuit of the display device of one embodiment of the present invention.

<Description of Display Device>

The display device illustrated in FIG. 29A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804b includes a shift register or the like. The signal line driver circuit 804b receives a signal (image signal) from which a data signal is derived, as well as a signal for driving the shift register, through the terminal portion 807. The signal line driver circuit 804b has a function of generating a data signal to be written to the pixel circuit 801 which is based on the image signal. In addition, the signal line driver circuit 804b has a function of controlling output of a data signal in response to a pulse signal produced by input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply another signal.

The signal line driver circuit 804b includes a plurality of analog switches or the like, for example. The signal line driver circuit 804b can output, as the data signals, signals obtained by time-dividing the image signal by sequentially turning on the plurality of analog switches. The signal line driver circuit 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804a. For example, to the pixel circuit 801 in the m-th row and the n-th column (m is a natural number of less than or equal to X, and n is a natural number of less than or equal to IT), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 29A is connected to, for example, the scan line GL between the scan line driver circuit 804a and the pixel circuit 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be connected to a wiring between the signal line driver circuit 804b and the terminal portion 807. Note that the terminal portion 807 means a portion having terminals for inputting power, control signals, and image signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 29A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804a or a configuration in which the protection circuits 806 are connected to the signal line driver circuit 804b may be employed. Alternatively, the protection circuits 806 may be configured to be connected to the terminal portion 807.

In FIG. 29A, an example in which the driver circuit portion 804 includes the scan line driver circuit 804a and the signal line driver circuit 804b is shown; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structure Example of Pixel Circuit>

Each of the plurality of pixel circuits 801 in FIG. 29A can have a structure illustrated in FIG. 29B, for example.

The pixel circuit 801 illustrated in FIG. 29B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 29B, the pixel circuits 801 are sequentially selected row by row by the scan line driver circuit 804a in FIG. 29A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 30A and 30B and FIGS. 31A and 31B illustrate examples of the pixel circuit.

Figure 30A:
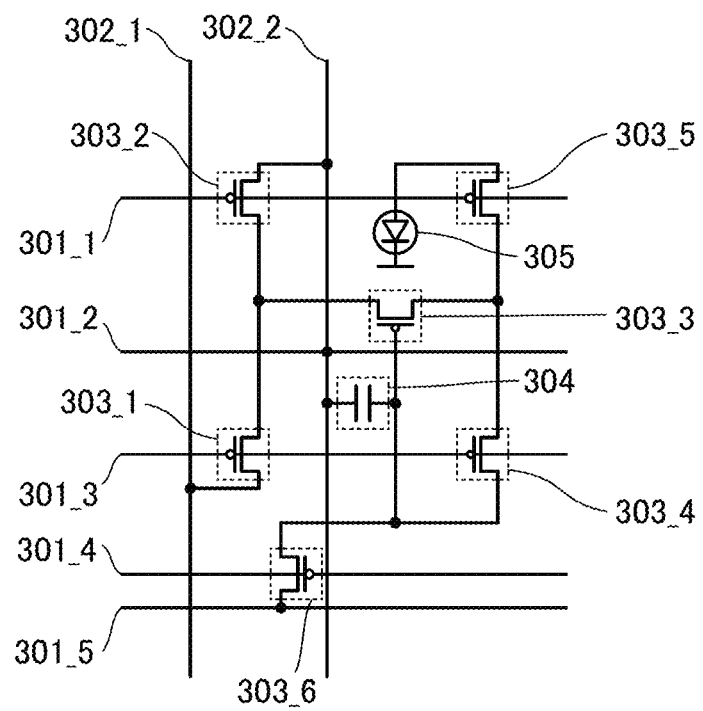
FIGS. 30A and 30B are circuit diagrams each illustrating a pixel circuit of a display device of one embodiment of the present invention.

The pixel circuit illustrated in FIG. 30A includes six transistors (transistors 303_1 to 303_6), a capacitor 304, and a light-emitting element 305. The pixel circuit illustrated in FIG. 30A is electrically connected to wirings 301_1 to 301_5 and wirings 302_1 and 302_2. Note that as the transistors 303_1 to 303_6, for example, p-channel transistors can be used.

Figure 30B:
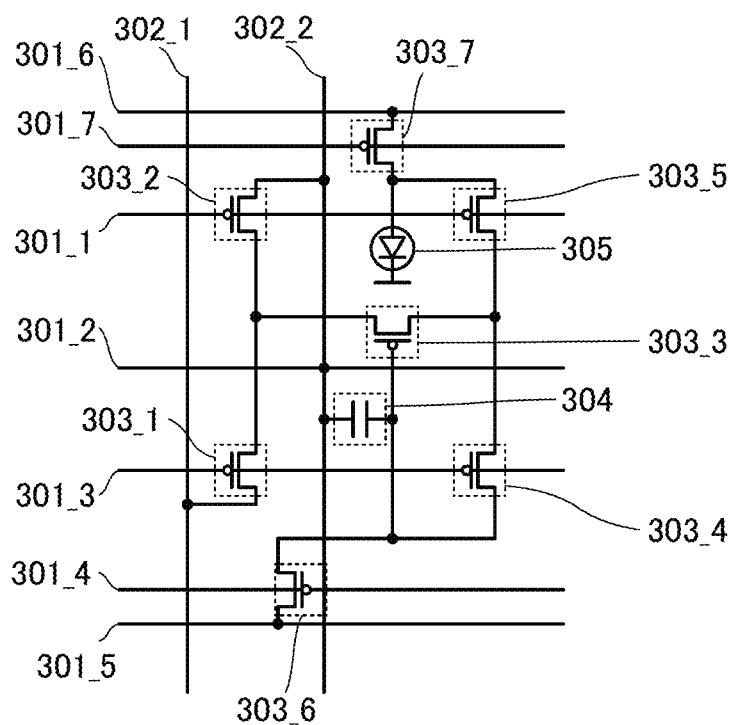

The pixel circuit shown in FIG. 30B has a configuration in which a transistor 303_7 is added to the pixel circuit shown in FIG. 30A. The pixel circuit illustrated in FIG. 30B is electrically connected to wirings 301_6 and 301_7. The wirings 301_5 and 301_6 may be electrically connected to each other. Note that as the transistor 303_7, for example, a p-channel transistor can be used.

Figure 31A:
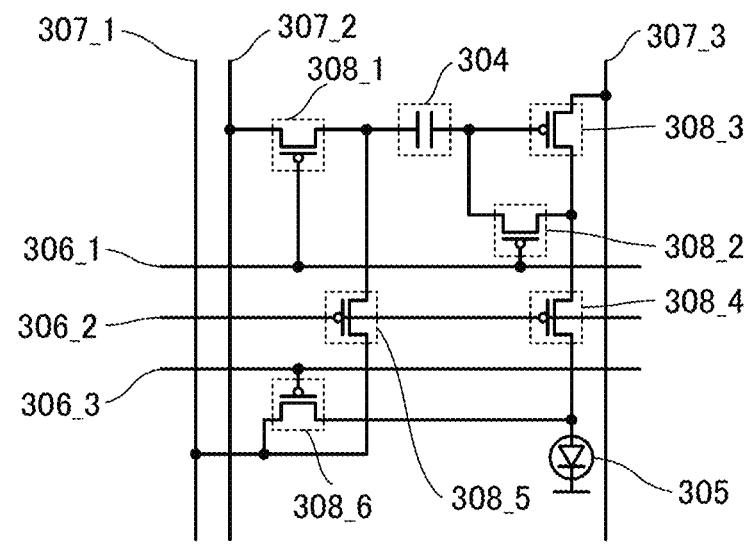
FIGS. 31A and 31B are circuit diagrams each illustrating a pixel circuit of a display device of one embodiment of the present invention.

The pixel circuit shown in FIG. 31A includes six transistors (transistors 308_1 to 308_6), the capacitor 304, and the light-emitting element 305. The pixel circuit illustrated in FIG. 31A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 31B:
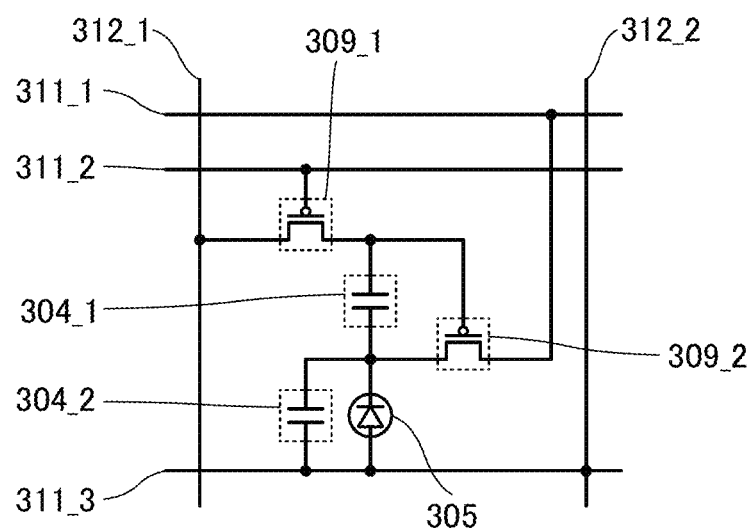

The pixel circuit illustrated in FIG. 31B includes two transistors (transistors 309_1 and 309_2), two capacitors (capacitors 304_1 and 304_2), and the light-emitting element 305. The pixel circuit illustrated in FIG. 31B is electrically connected to wirings 311_1 to 311_3 and wirings 312_1 and 312_2. With the configuration of the pixel circuit illustrated in FIG. 31B, the pixel circuit can be driven by a voltage inputting current driving method (also referred to as CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in appropriate combination with the structure described in any of the other embodiments.

Embodiment 7

In this embodiment, a display device including a light-emitting element of one embodiment of the present invention and an electronic device in which the display device is provided with an input device will be described with reference to FIGS. 32A and 32B, FIGS. 33A to 33C, FIGS. 34A and 34B, FIGS. 35A and 35B, and FIG. 36.

<Description 1 of Touch Panel>

In this embodiment, a touch panel 2000 including a display device and an input device will be described as an example of an electronic device. In addition, an example in which a touch sensor is used as an input device will be described.

Figure 32A:
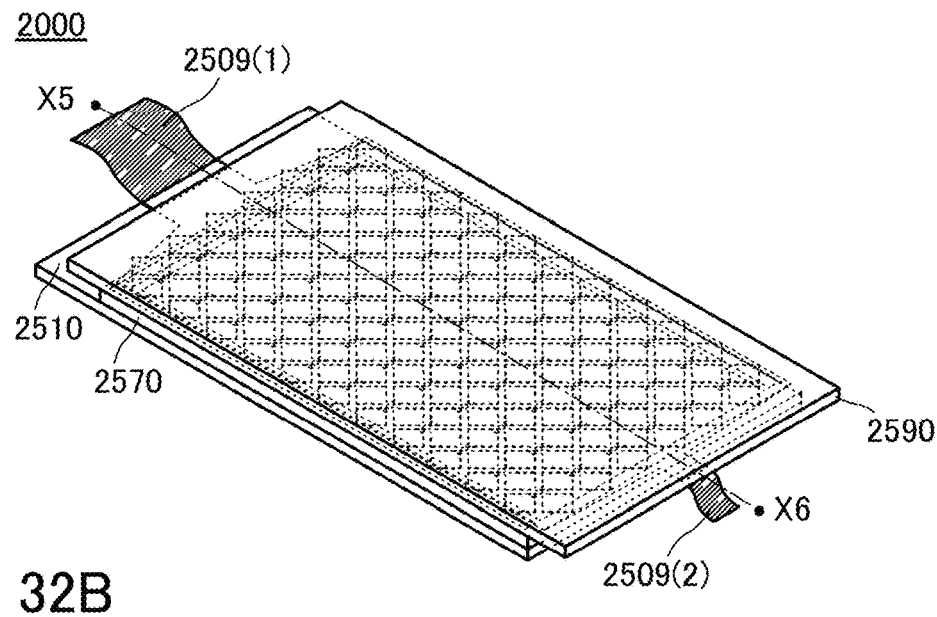
FIGS. 32A and 32B are perspective views of an example of a touch panel of one embodiment of the present invention.
Figure 32B:
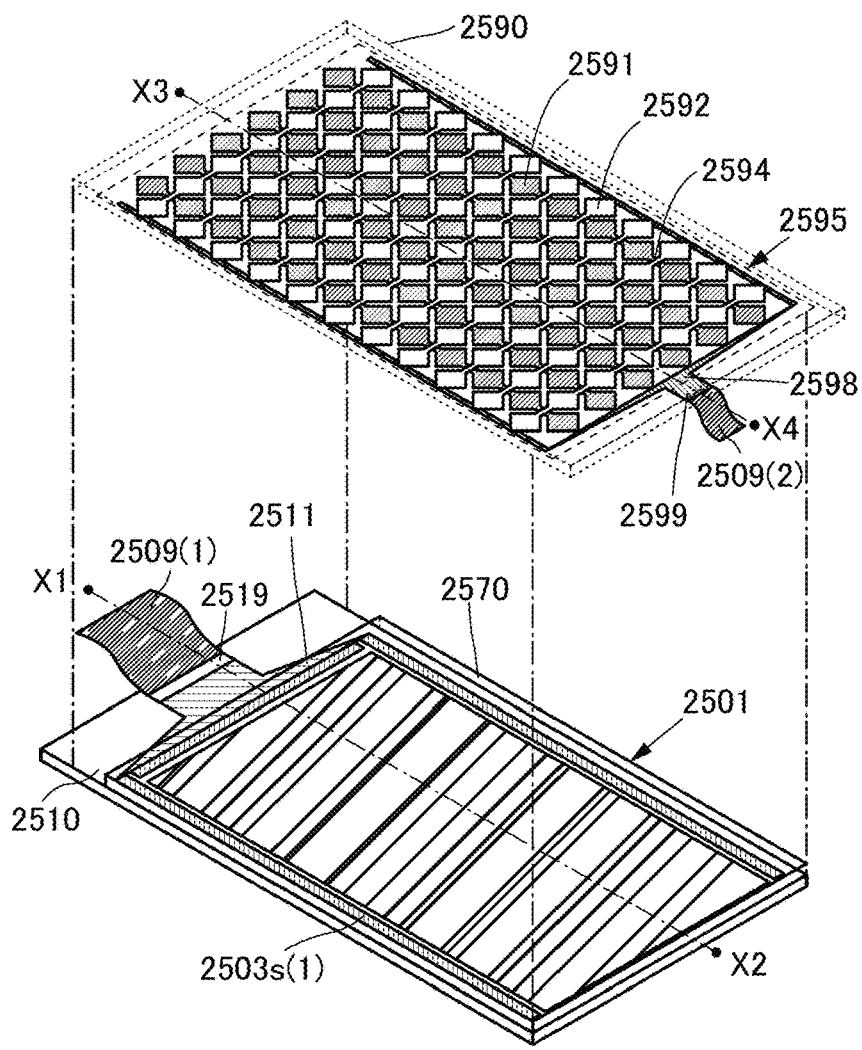

FIGS. 32A and 32B are perspective views of the touch panel 2000. Note that FIGS. 32A and 32B illustrate only main components of the touch panel 2000 for simplicity.

The touch panel 2000 includes a display device 2501 and a touch sensor 2595 (see FIG. 32B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 32B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 32B is an example of using a projected capacitive touch sensor.

Note that a variety of sensors that can sense approach or contact of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 32A and 32B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Figure 33A:
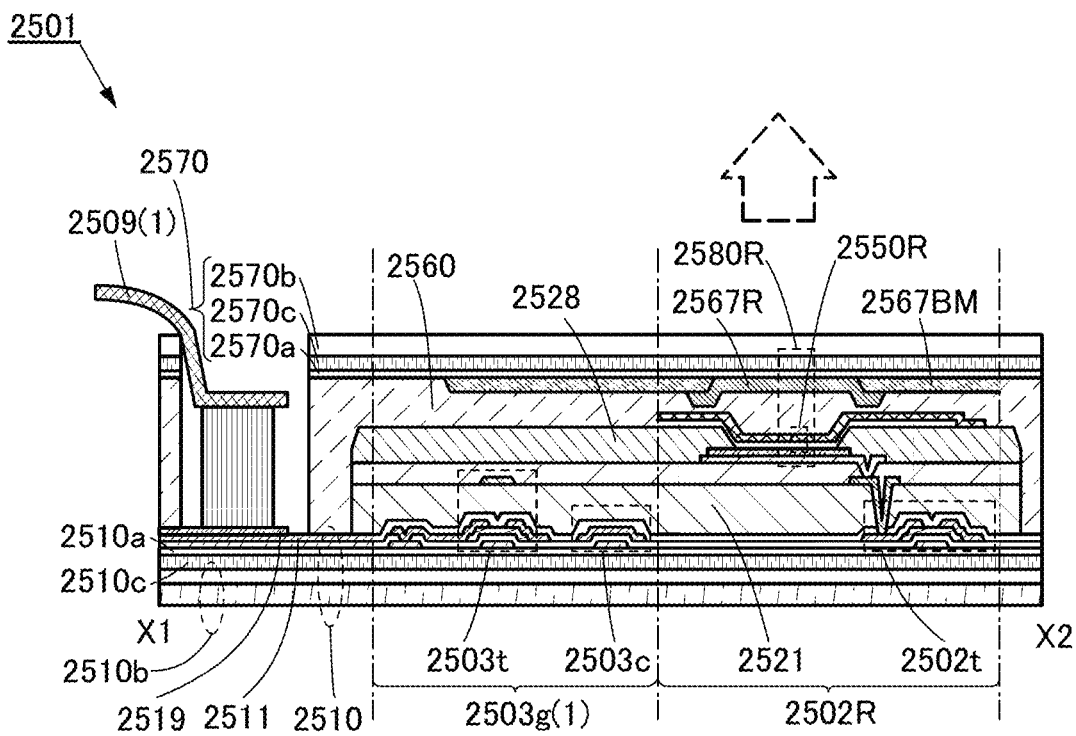
FIGS. 33A to 33C are cross-sectional views of examples of a display device and a touch sensor of one embodiment of the present invention.

Next, the display device 2501 will be described in detail with reference to FIG. 33A. FIG. 33A corresponds to a cross-sectional view taken along dashed-dotted line X1-X2 in FIG. 32B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1 \times 10^{-5}$ g·m$^{-2}$·day$^{-1}$, preferably lower than or equal to $1 \times 10^{-6}$ g·m$^2$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

Note that the substrate 2510 is a stacked body including an insulating layer 2510*a* for preventing impurity diffusion into the light-emitting element, a flexible substrate 2510*b*, and an adhesive layer 2510*c* for attaching the insulating layer 2510*a* and the flexible substrate 2510*b* to each other. The substrate 2570 is a stacked body including an insulating layer 2570*a* for preventing impurity diffusion into the light-emitting element, a flexible substrate 2570*b*, and an adhesive layer 2570*c* for attaching the insulating layer 2570*a* and the flexible substrate 2570*b* to each other.

For the adhesive layer 2510*c* and the adhesive layer 2570*c*, for example, polyester, polyolefin, polyamide (e.g., nylon, aramid), polyimide, polycarbonate, or acrylic, urethane, or epoxy can be used. Alternatively, a material that includes a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 33A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen and argon) may be used instead of the sealing layer 2560. A drying agent may be provided in the inert gas so as to adsorb moisture or the like. Alternatively, a resin such as acrylic or epoxy may be used instead of the sealing layer 2560. An epoxy-based resin or a glass frit is preferably used as the sealant. As a material used for the sealant, a material which is impermeable to moisture and oxygen is preferably used.

The display device 2501 includes a pixel 2502R. The pixel 2502R includes a light-emitting module 2580R.

The pixel 2502R includes the light-emitting element 2550R and a transistor 2502*t* that can supply electric power to the light-emitting element 2550R. Note that the transistor 2502*t* functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 33A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of covering unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a PWB.

Figure 33B:
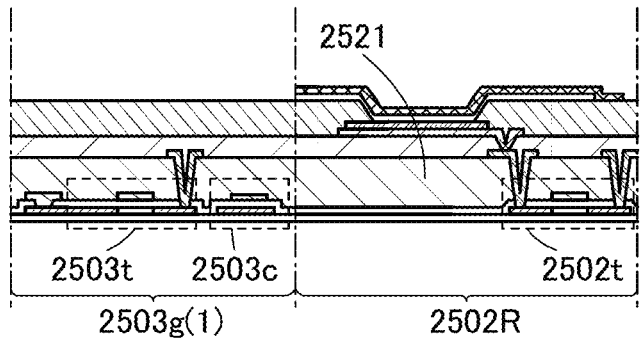

In the display device 2501, transistors with any of a variety of structures can be used. FIG. 33A illustrates an example of using bottom-gate transistors; however, the present invention is not limited to this example, and top-gate transistors may be used in the display device 2501 as illustrated in FIG. 33B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 33C:
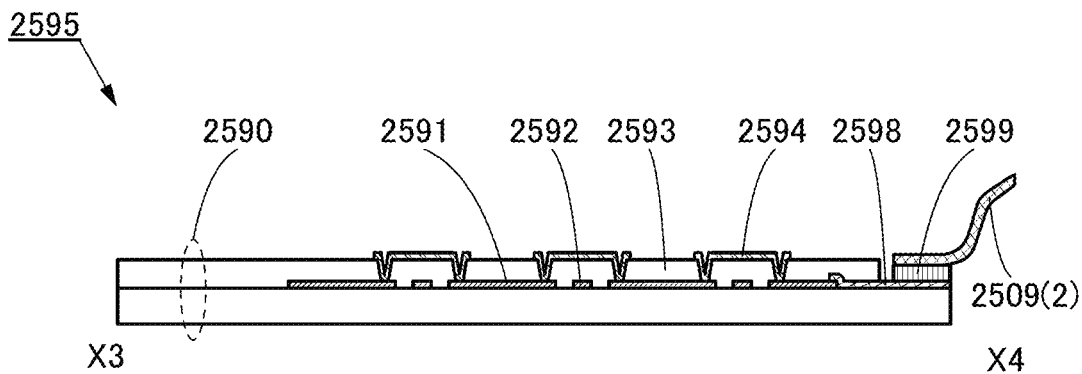

Next, the touch sensor 2595 will be described in detail with reference to FIG. 33C. FIG. 33C corresponds to a cross-sectional view taken along dashed-dotted line X3-X4 in FIG. 32B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), and the like can be used.

<Description 2 of Touch Panel>

Figure 34A:
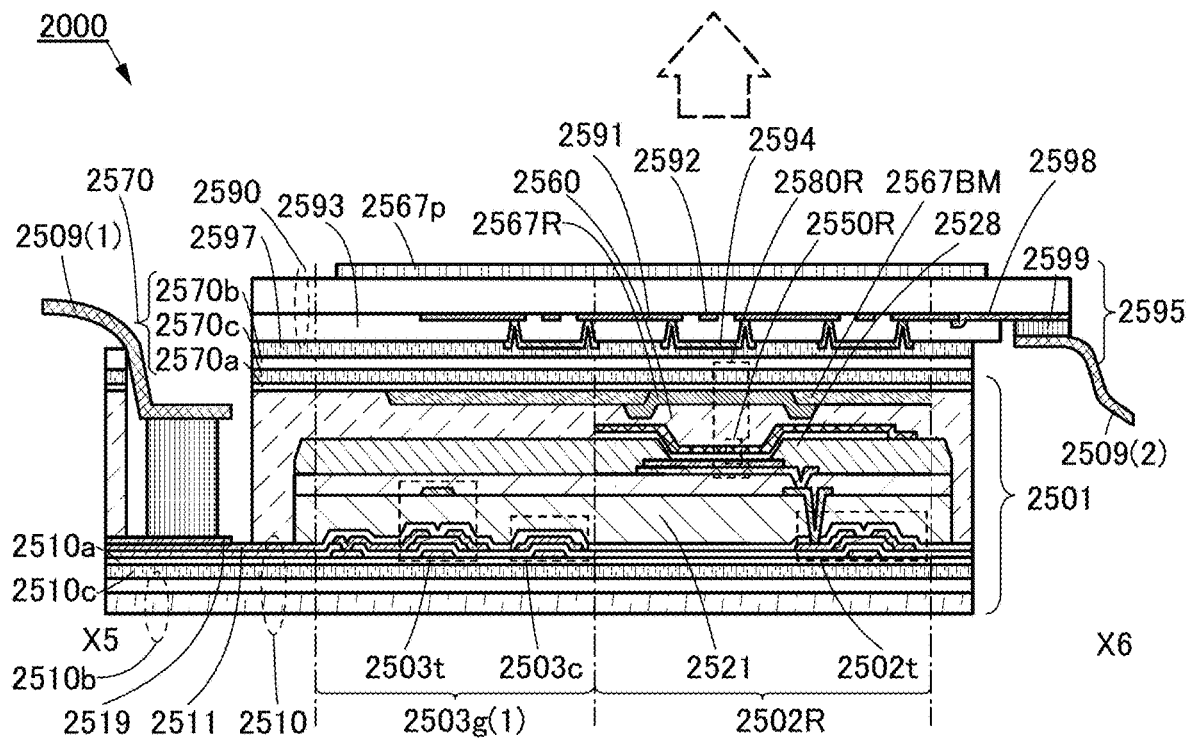
FIGS. 34A and 34B are cross-sectional views of examples of a touch panel of one embodiment of the present invention.

Next, the touch panel 2000 will be described in detail with reference to FIG. 34A. FIG. 34A corresponds to a cross-sectional view taken along dashed-dotted line X5-X6 in FIG. 32A.

In the touch panel 2000 illustrated in FIG. 34A, the display device 2501 described with reference to FIG. 33A and the touch sensor 2595 described with reference to FIG. 33C are attached to each other.

The touch panel 2000 illustrated in FIG. 34A includes an adhesive layer 2597 and an anti-reflective layer 2567p in addition to the components described with reference to FIGS. 33A and 33C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 34A will be described with reference to FIG. 34B.

Figure 34B:
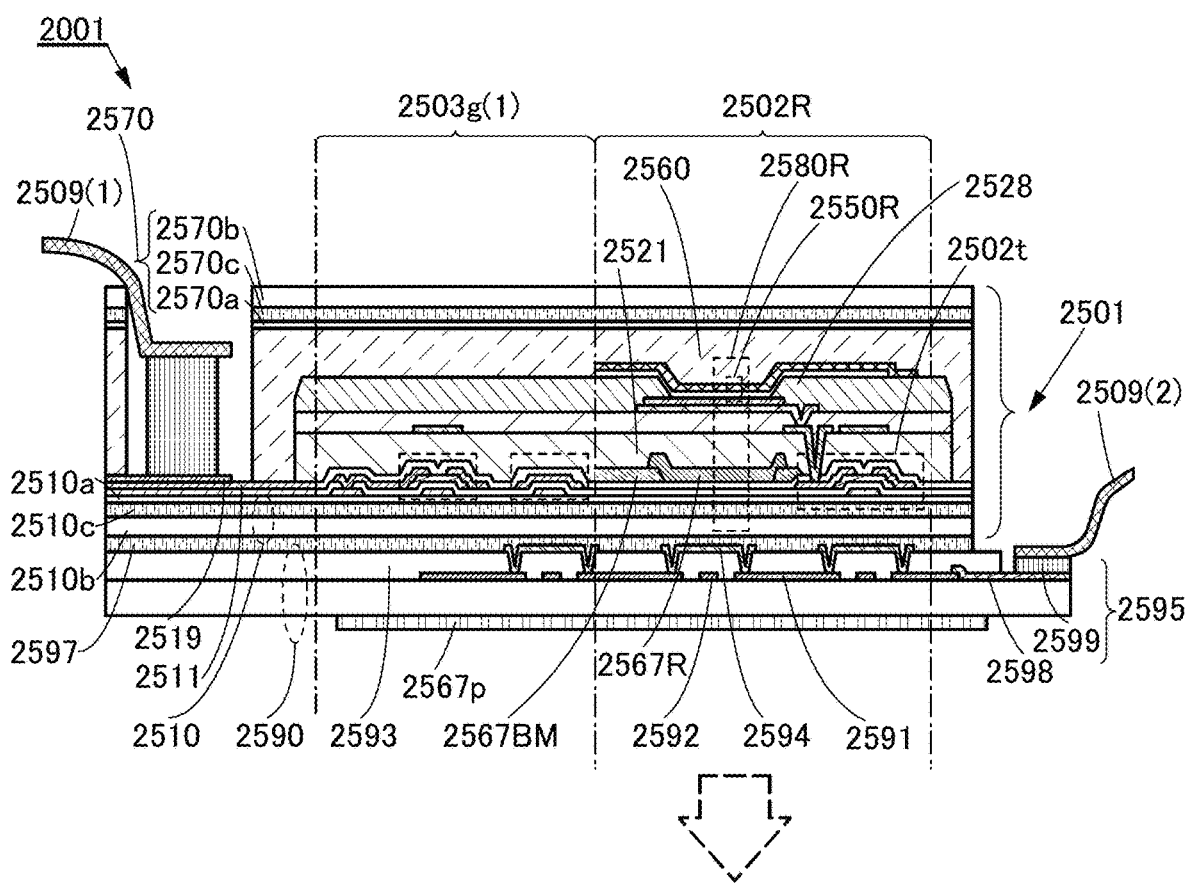

FIG. 34B is a cross-sectional view of a touch panel 2001. The touch panel 2001 illustrated in FIG. 34B differs from the touch panel 2000 illustrated in FIG. 34A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 34B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 34B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 34A or 34B, light may be emitted from the light-emitting element through one or both of the substrate 2510 and the substrate 2570.

<Description of Method for Driving Touch Panel>

Next, an example of a method for driving a touch panel will be described with reference to FIGS. 35A and 35B.

Figure 35A:
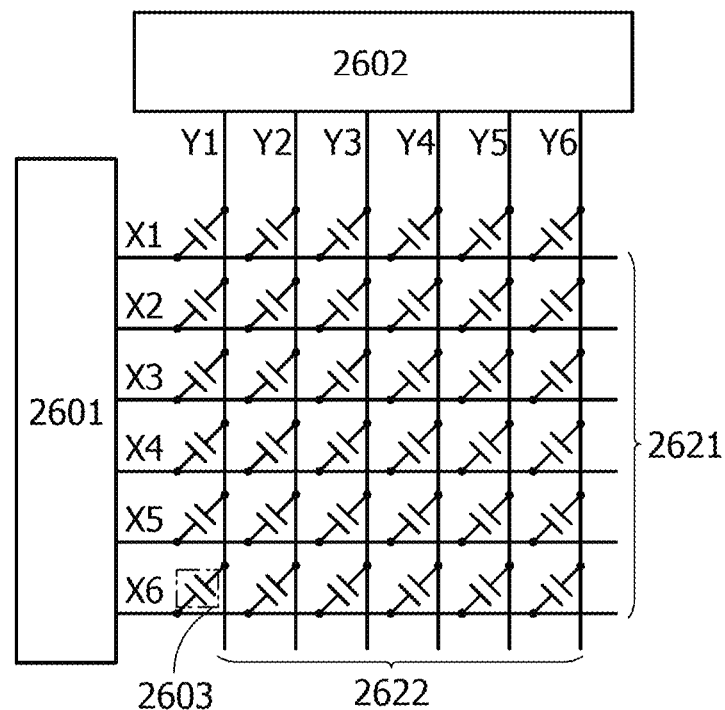
FIGS. 35A and 35B are a block diagram and a timing chart of a touch sensor of one embodiment of the present invention.

FIG. 35A is a block diagram illustrating the structure of a mutual capacitive touch sensor. FIG. 35A illustrates a pulse voltage output circuit 2601 and a current sensing circuit 2602. Note that in FIG. 35A, six wirings X1 to X6 represent the electrodes 2621 to which a pulse voltage is applied, and six wirings Y1 to Y6 represent the electrodes 2622 that detect changes in current. FIG. 35A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 35B:
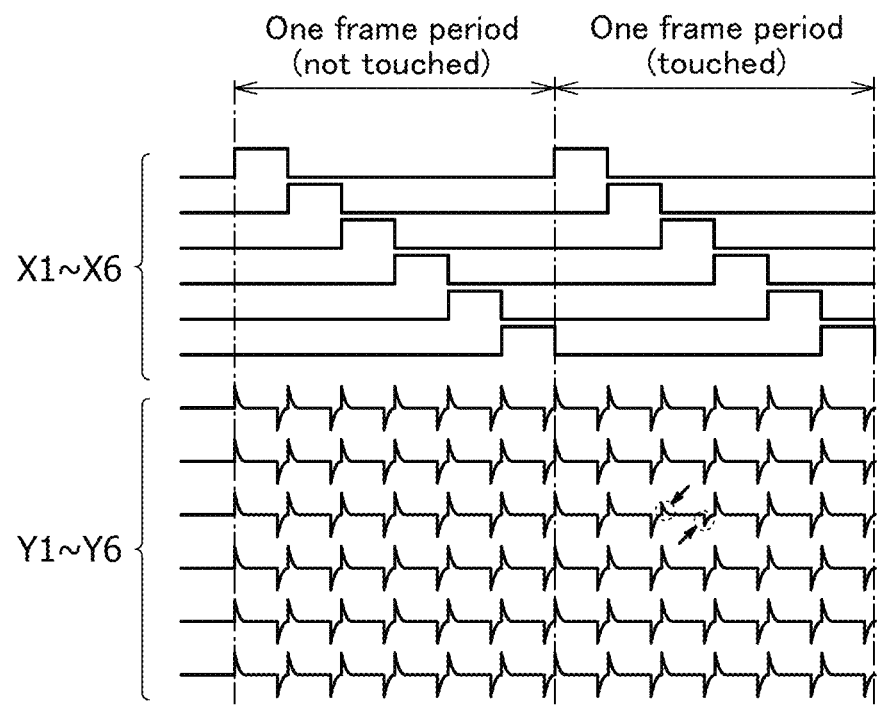

FIG. 35B is a timing chart showing input and output waveforms in the mutual capacitive touch sensor illustrated in FIG. 35A. In FIG. 35B, sensing of a sensing target is performed in all the rows and columns in one frame period. FIG. 35B shows a period when a sensing target is not sensed (not touched) and a period when a sensing target is sensed (touched). In FIG. 35B, sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Description of Sensor Circuit>

Figure 36:
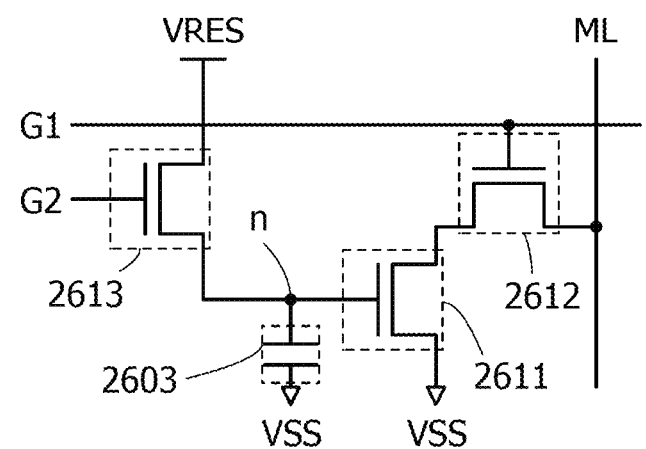
FIG. 36 is a circuit diagram of a touch sensor of one embodiment of the present invention.

Although FIG. 35A illustrates a passive matrix type touch sensor in which only the capacitor 2603 is provided at the intersection of wirings as a touch sensor, an active matrix type touch sensor including a transistor and a capacitor may be used. FIG. 36 illustrates an example of a sensor circuit included in an active matrix type touch sensor.

The sensor circuit in FIG. 36 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 36 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structures described in this embodiment can be used in appropriate combination with any of the structures described in the other embodiments.

Embodiment 8

In this embodiment, a display module and electronic devices including a light-emitting element of one embodiment of the present invention will be described with reference to FIG. 37, FIGS. 38A to 38G, FIGS. 39A to 39D, and FIGS. 40A and 40B.

<Description of Display Module>

Figure 37:
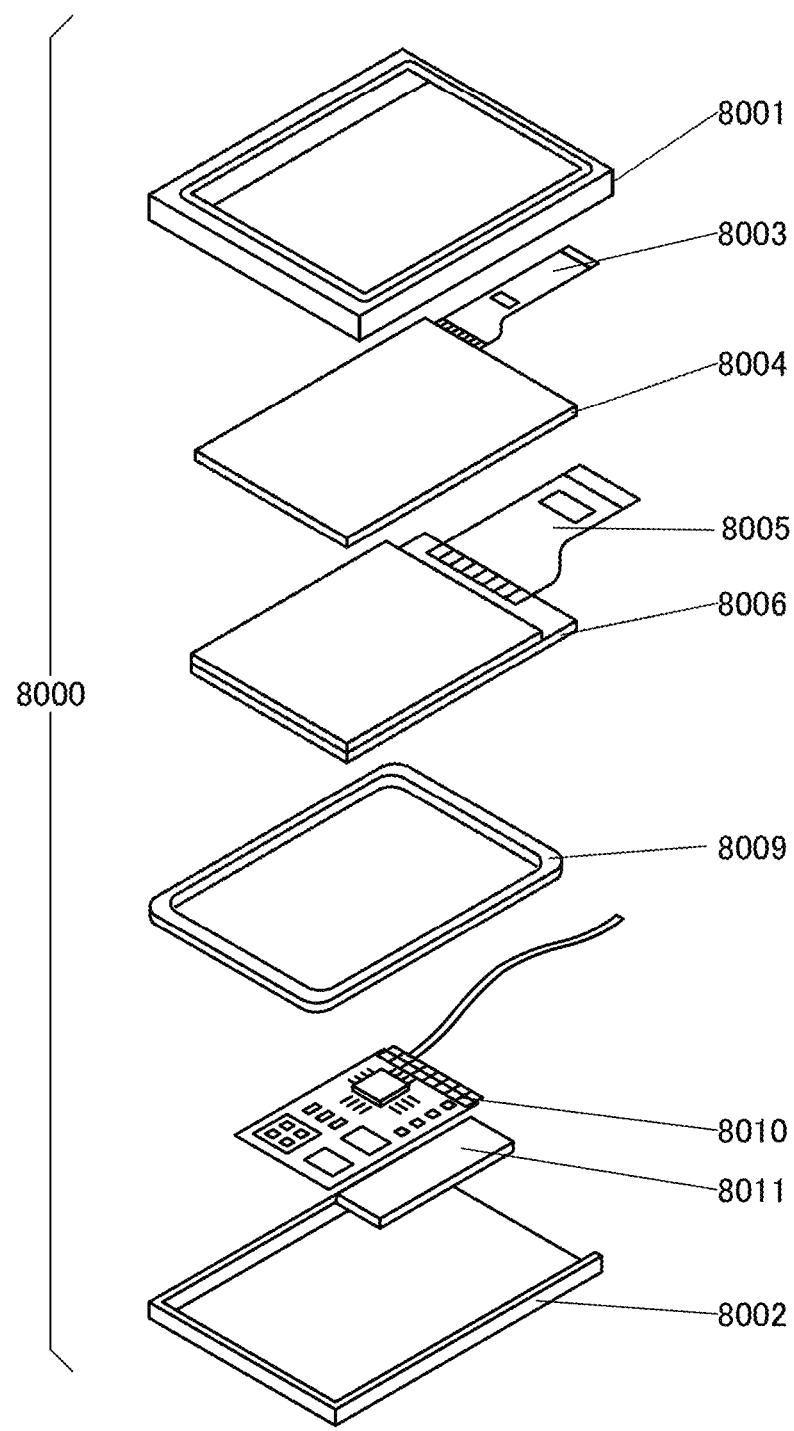
FIG. 37 is a perspective view illustrating a display module of one embodiment of the present invention.

In a display module 8000 in FIG. 37, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Description of Electronic Device>

FIGS. 38A to 38G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 38A to 38G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 38A to 38G are not limited to those described above, and the electronic devices can have a variety of functions. Although not illustrated in FIGS. 38A to 38G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 38A to 38G will be described in detail below.

Figure 38A:
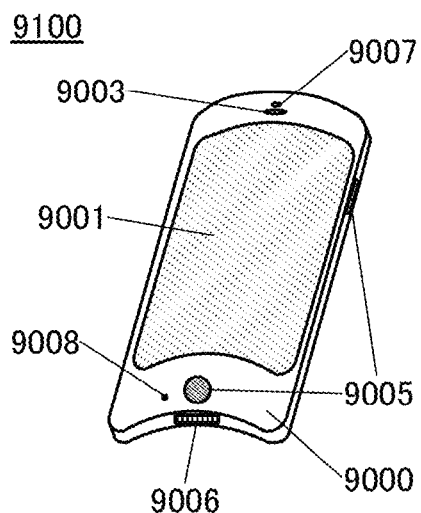
FIGS. 38A to 38G illustrate electronic devices of one embodiment of the present invention.

FIG. 38A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 38D:
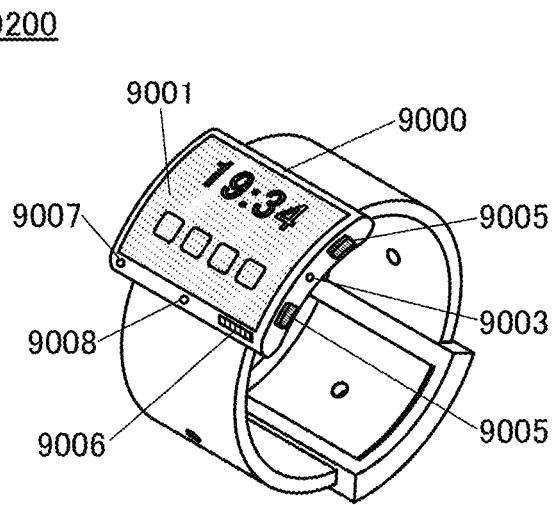
Figure 38B:
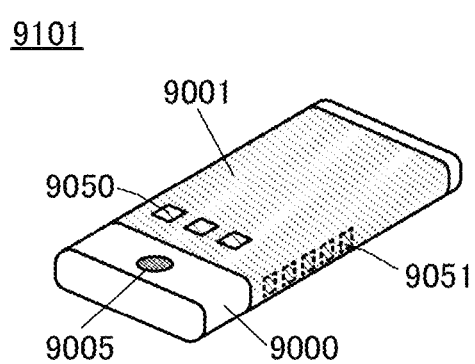

FIG. 38B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 38B, can be positioned in the portable information terminal 9101 as in the portable information terminal 9100 shown in FIG. 38A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 38E:
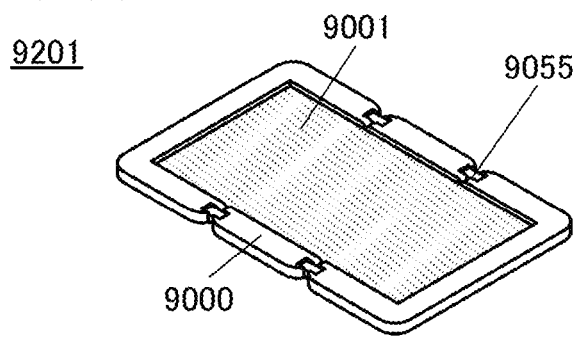
Figure 38C:
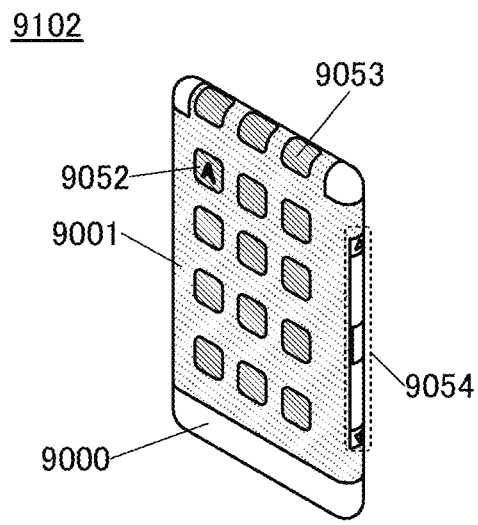

FIG. 38C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 38D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus handsfree calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 38F:
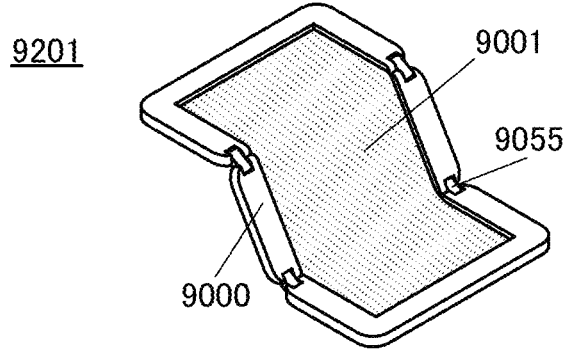
Figure 38G:
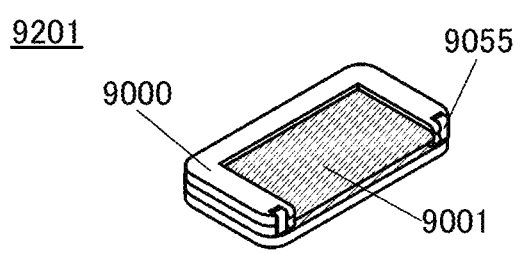

FIGS. 38E, 38F, and 38G are perspective views of a foldable portable information terminal 9201. FIG. 38E is a perspective view illustrating the portable information terminal 9201 that is opened. FIG. 38F is a perspective view illustrating the portable information terminal 9201 that is being opened or being folded. FIG. 38G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Figure 39A:
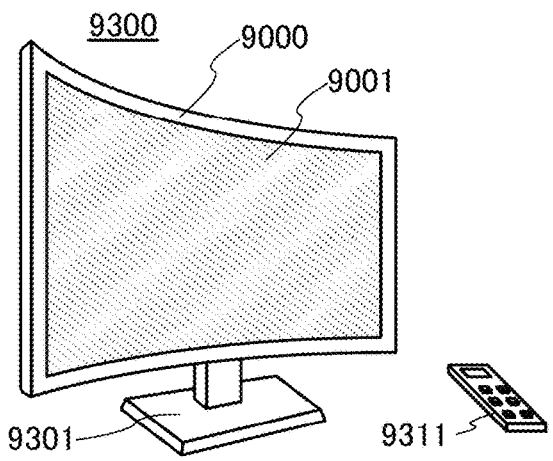
FIGS. 39A to 39D illustrate electronic devices of one embodiment of the present invention.

FIG. 39A illustrates an example of a television set. In the television set 9300, the display portion 9001 is incorporated into the housing 9000. Here, the housing 9000 is supported by a stand 9301.

The television set 9300 illustrated in FIG. 39A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. A general television broadcast can be received with the receiver. When the television set is connected to a communication network with or without wires via the modem, one-way (from a transmitter to a receiver) or two-way (between a transmitter and a receiver or between receivers) data communication can be performed.

The electronic device or the lighting device of one embodiment of the present invention has flexibility and therefore can be incorporated along a curved inside/outside wall surface of a house or a building or a curved interior/exterior surface of a car.

Figure 39B:
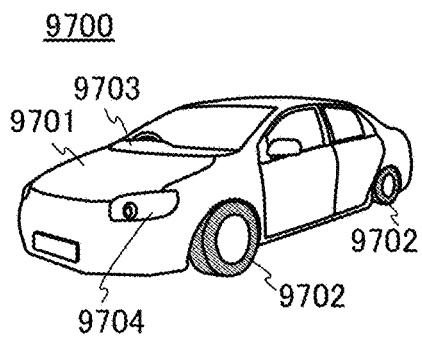
Figure 39C:
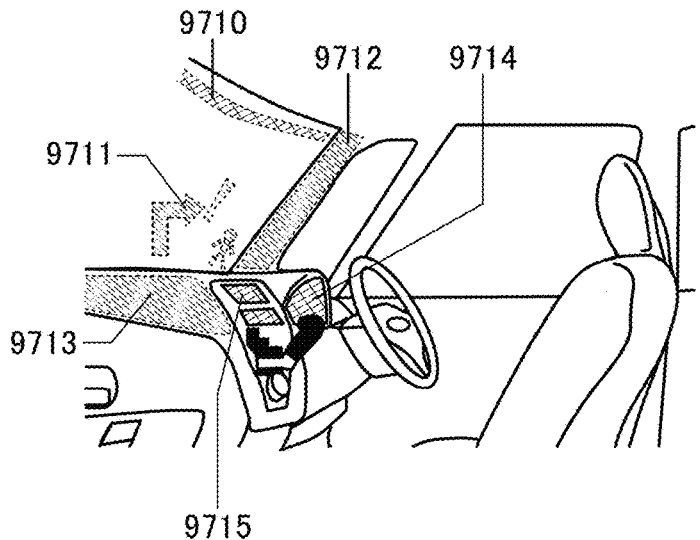

FIG. 39B is an external view of an automobile 9700. FIG. 39C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 39C.

The display portion 9710 and the display portion 9711 are each a display device provided in an automobile windshield. The display device, the light-emitting device, or the like of one embodiment of the present invention can be a seethrough display device, through which the opposite side can be seen, using a light-transmitting conductive material for its electrodes and wirings. Such a see-through display portion 9710 or 9711 does not hinder driver's vision during driving the automobile 9700. Thus, the display device, the lightemitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 39D:
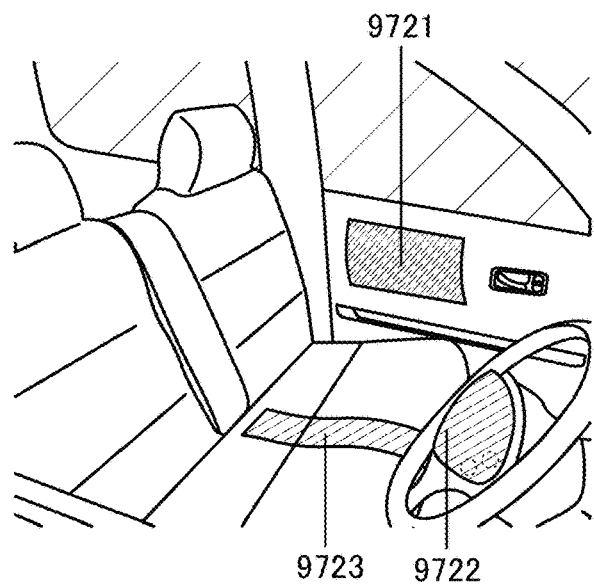

FIG. 39D illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 40A:
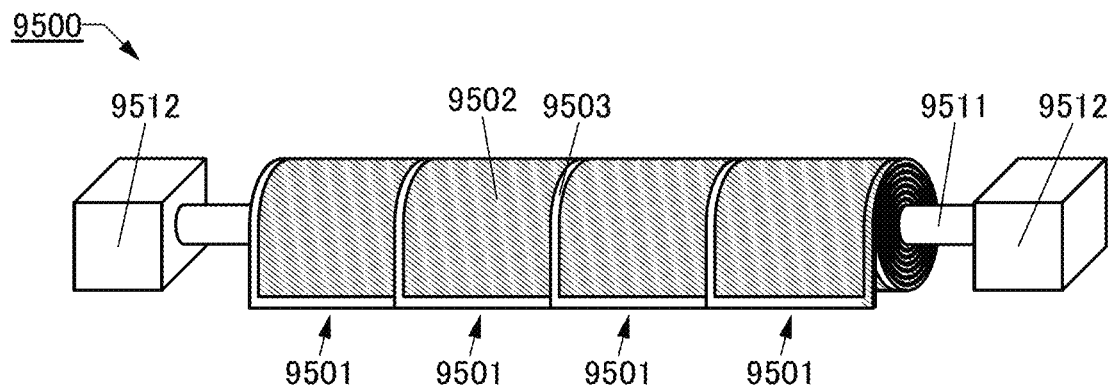
FIGS. 40A and 40B are perspective views illustrating a display device of one embodiment of the present invention.
Figure 40B:
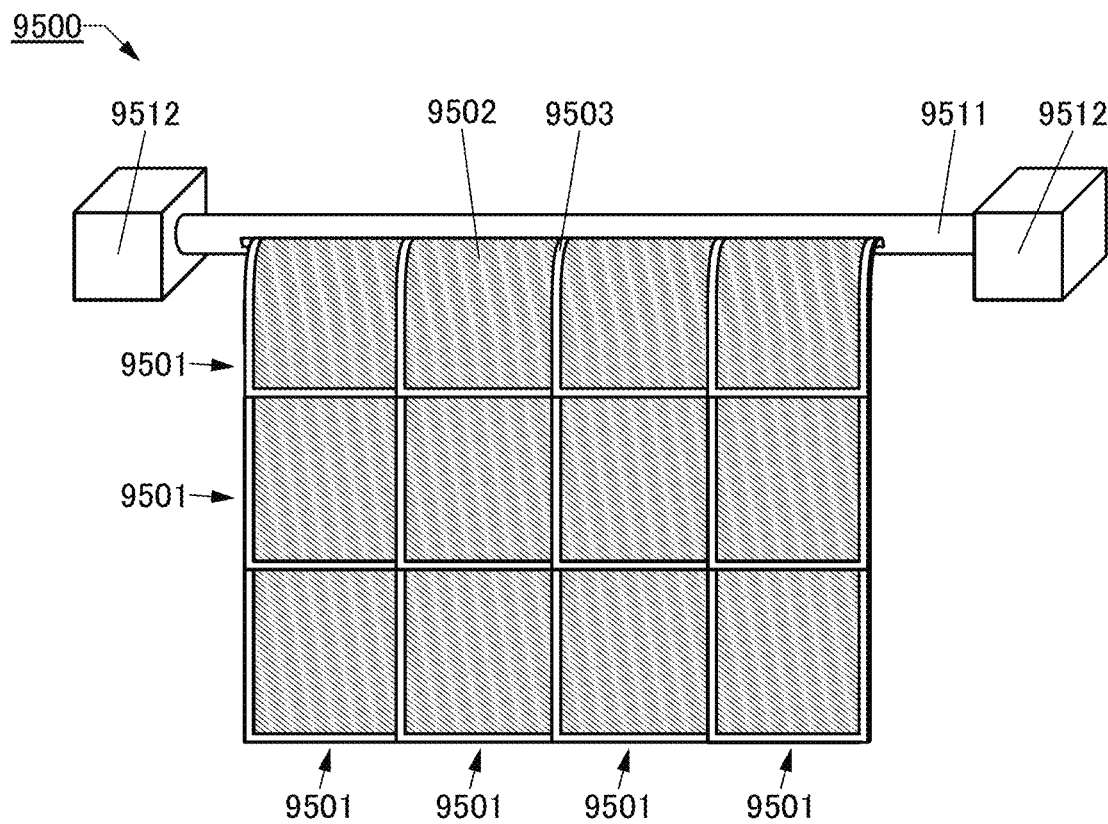

A display device 9500 illustrated in FIGS. 40A and 40B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 40A and 40B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with the structure described in any of the other embodiments.

Embodiment 9

In this embodiment, a light-emitting device including the light-emitting element of one embodiment of the present invention will be described with reference to FIGS. 41A to 41C and FIGS. 42A to 42D.

Figure 41A:
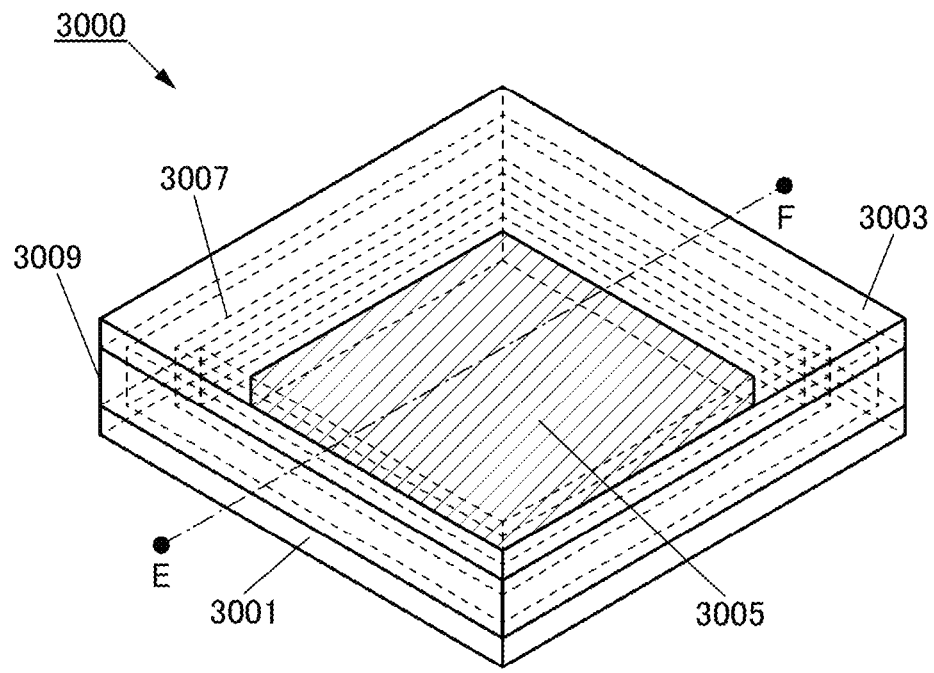
FIGS. 41A to 41C are a perspective view and cross-sectional views illustrating light-emitting devices of one embodiment of the present invention.
Figure 41B:
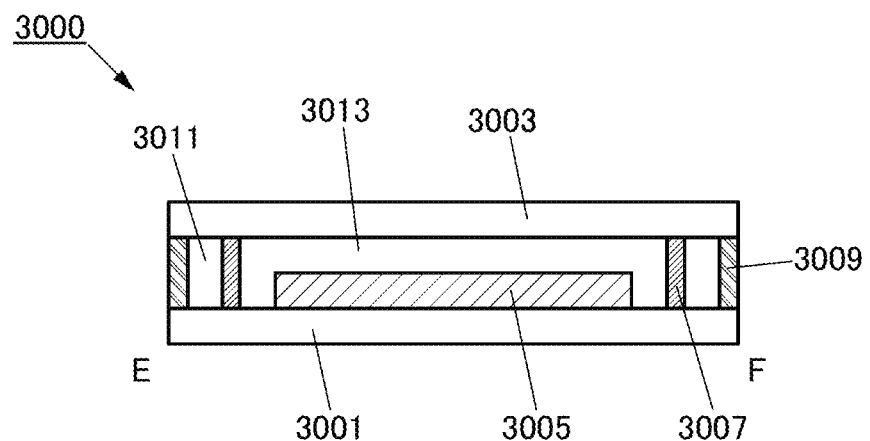

FIG. 41A is a perspective view of a light-emitting device 3000 shown in this embodiment, and FIG. 41B is a cross-sectional view along dashed-dotted line E-F in FIG. 41A. Note that in FIG. 41A, some components are illustrated by broken lines in order to avoid complexity of the drawing.

The light-emitting device 3000 illustrated in FIGS. 41A and 41B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 41A and 41B, a structure in which light is emitted from the light-emitting element 3005 to the lower side (the substrate 3001 side) is illustrated.

As illustrated in FIGS. 41A and 41B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 41B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in Embodiment 3, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon, aramid), polyimide, polycarbonate, an acrylic resin, urethane, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 41B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with an inert gas such as a rare gas or a nitrogen gas, a resin such as acrylic or epoxy, or the like. Note that for the first region 3011 and the second region 3013, a reduced pressure state is preferred to an atmospheric pressure state.

Figure 41C:
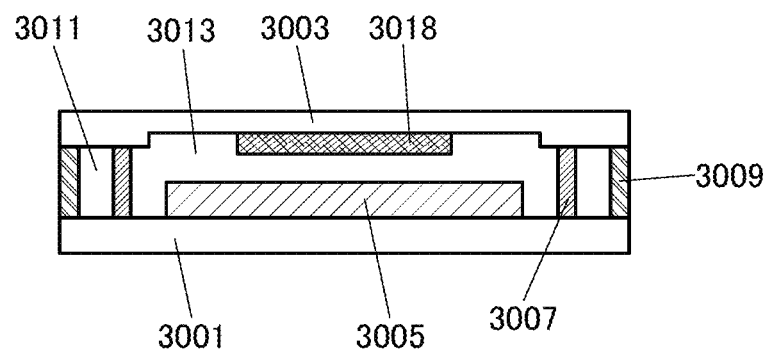

FIG. 41C illustrates a modification example of the structure in FIG. 41B. FIG. 41C is a cross-sectional view illustrating the modification example of the light-emitting device 3000.

FIG. 41C illustrates a structure in which a desiccant 3018 is provided in a recessed portion provided in part of the substrate 3003. The other components are the same as those of the structure illustrated in FIG. 41B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 41B are described with reference to FIGS. 42A to 42D. Note that FIGS. 42A to 42D are cross-sectional views illustrating the modification examples of the light-emitting device 3000 illustrated in FIG. 41B.

In each of the light-emitting devices illustrated in FIGS. 42A to 42D, the second sealing region 3009 is not provided but only the first sealing region 3007 is provided. Moreover, in each of the light-emitting devices illustrated in FIGS. 42A to 42D, a region 3014 is provided instead of the second region 3013 illustrated in FIG. 41B.

For the region 3014, for example, materials that include polyester, polyolefin, polyamide (e.g., nylon or aramid), polyimide, polycarbonate, an acrylic resin, an epoxy resin, urethane, an epoxy resin, or a resin having a siloxane bond can be used.

When the above-described material is used for the region 3014, what is called a solid-sealing light-emitting device can be obtained.

Figure 42A:
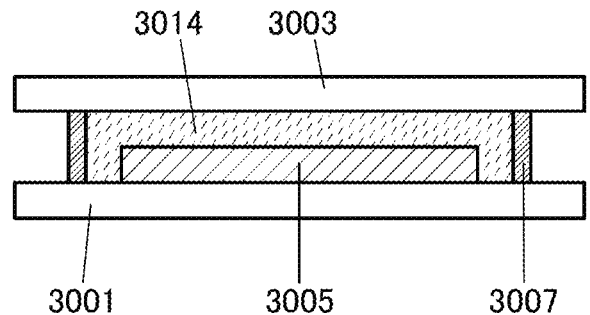
FIGS. 42A to 42D are cross-sectional views each illustrating a light-emitting device of one embodiment of the present invention.
Figure 42B:
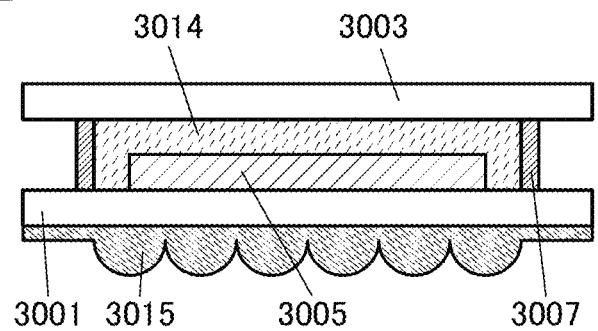

In the light-emitting device illustrated in FIG. 42B, a substrate 3015 is provided on the substrate 3001 side of the light-emitting device illustrated in FIG. 42A.

The substrate 3015 has unevenness as illustrated in FIG. 42B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 42B, a substrate having a function as a diffusion plate may be provided.

Figure 42C:
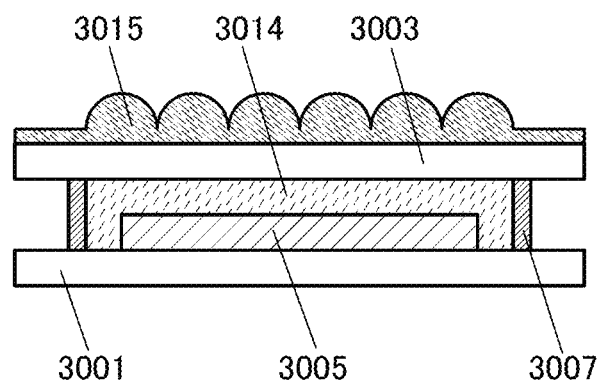

In the light-emitting device illustrated in FIG. 42C, light is extracted through the substrate 3003 side, unlike in the light-emitting device illustrated in FIG. 42A, in which light is extracted through the substrate 3001 side.

The light-emitting device illustrated in FIG. 42C includes the substrate 3015 on the substrate 3003 side. The other components are the same as those of the light-emitting device illustrated in FIG. 42B.

Figure 42D:
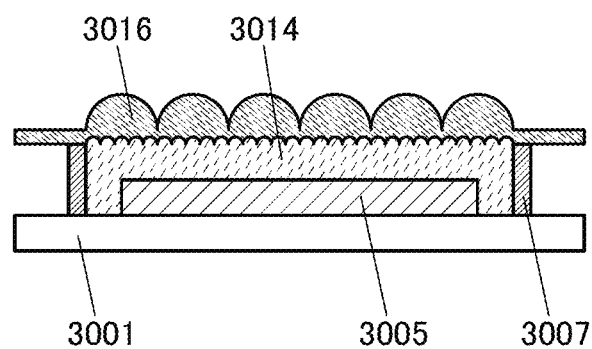

In the light-emitting device illustrated in FIG. 42D, the substrate 3003 and the substrate 3015 included in the light-emitting device illustrated in FIG. 42C are not provided but a substrate 3016 is provided.

The substrate 3016 includes first unevenness positioned closer to the light-emitting element 3005 and second unevenness positioned farther from the light-emitting element 3005. With the structure illustrated in FIG. 42D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined with the structure described in any of the other embodiments as appropriate.

Embodiment 10

In this embodiment, examples in which the light-emitting element of one embodiment of the present invention is used for various lighting devices and electronic devices will be described with reference to FIGS. 43A to 43C and FIG. 44.

An electronic device or a lighting device that has a light-emitting region with a curved surface can be obtained with the use of the light-emitting element of one embodiment of the present invention which is manufactured over a substrate having flexibility.

Furthermore, a light-emitting device to which one embodiment of the present invention is applied can also be used for lighting for motor vehicles, examples of which are lighting for a dashboard, a windshield, a ceiling, and the like.

Figure 43A:
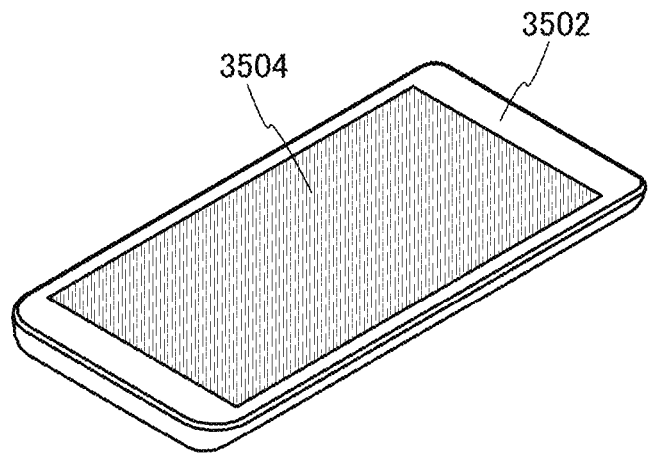
FIGS. 43A to 43C illustrate an electronic device and a lighting device of one embodiment of the present invention.
Figure 43B:
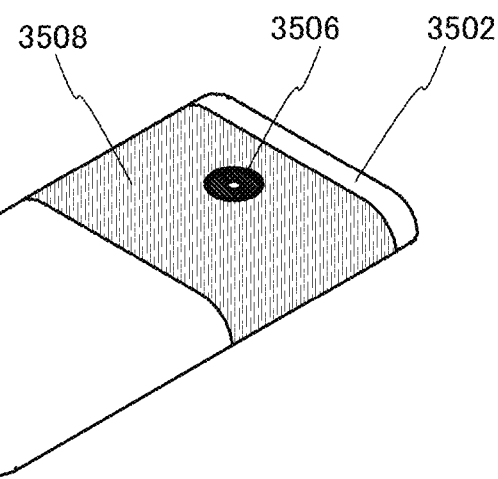

FIG. 43A is a perspective view illustrating one surface of a multifunction terminal 3500, and FIG. 43B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 43A and 43B can have a variety of functions as in the electronic devices illustrated in FIGS. 38A to 38G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 43C:
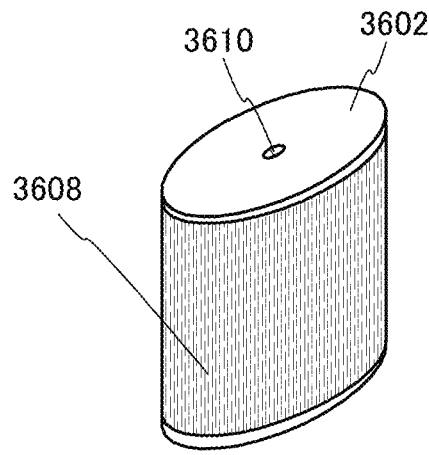

FIG. 43C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 44:
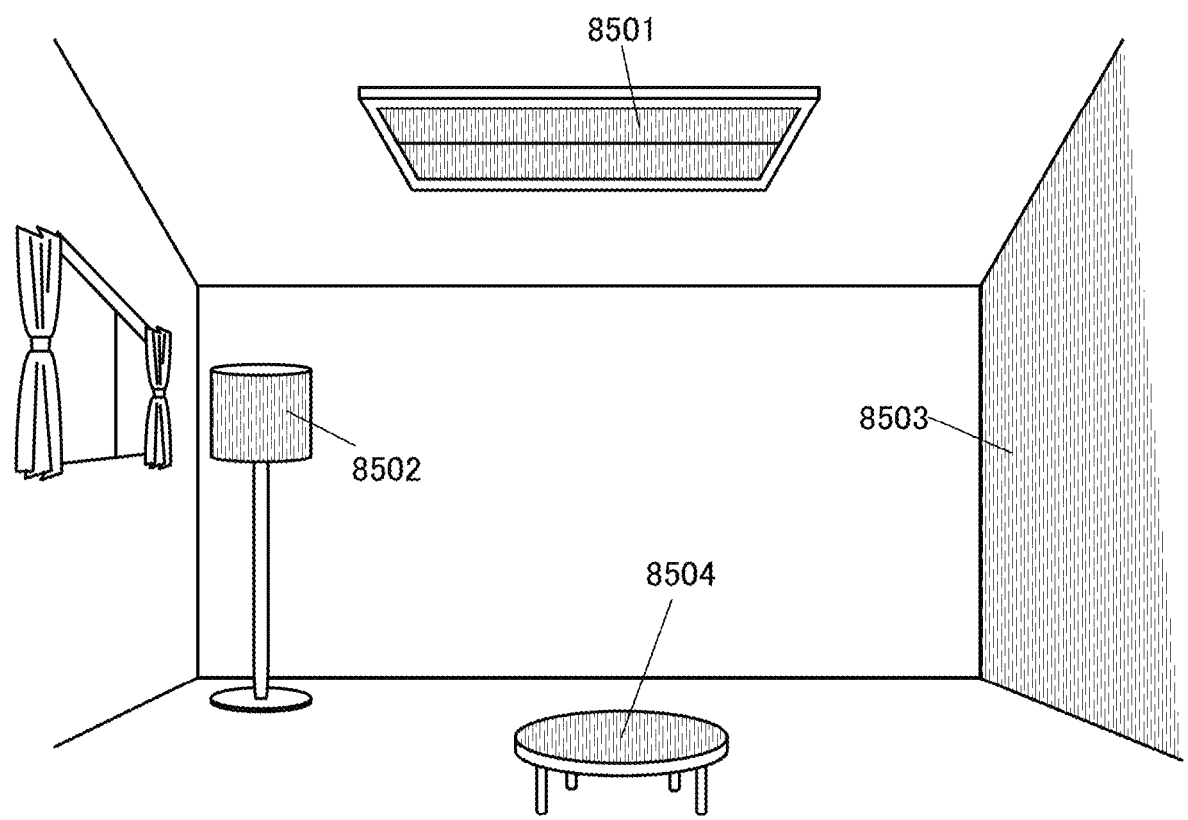
FIG. 44 illustrates lighting devices of one embodiment of the present invention.

FIG. 44 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

Note that the structures described in this embodiment can be used in appropriate combination with any of the structures described in the other embodiments.

Example 1

In this example, measurement results of emission characteristics of compounds which can be used for the lightemitting element of one embodiment of the present invention are shown. Structures and abbreviations of compounds used in this example are given below.

Note that the absorption spectra and the emission spectra were measured at room temperature (in an atmosphere kept at 23° C.).

[Chemical Formulae 10]

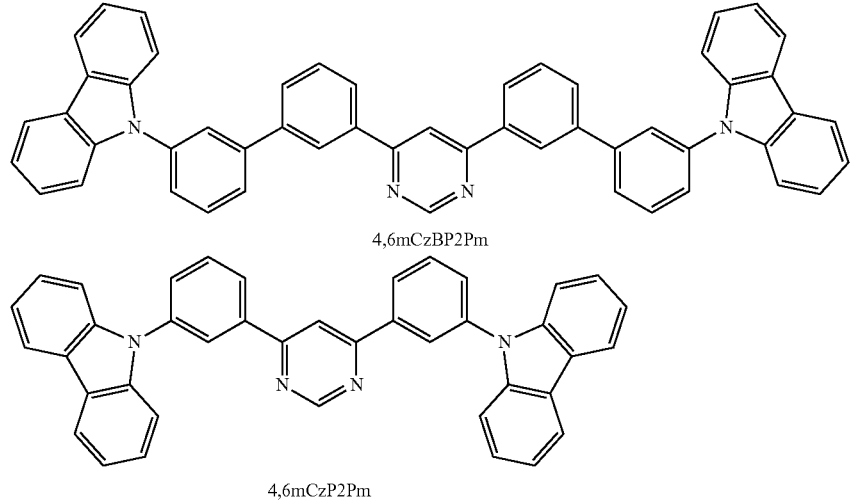

4,6mCzBP2Pm 4,6mCzP2Pm

<Fabrication of Measurement Samples>

To measure absorption characteristics and emission characteristics of compounds, thin film samples were each fabricated on a quartz substrate by a vacuum evaporation method. In addition, solution samples were each fabricated in a quartz cell.

As a thin film sample 1, 9,9'-[pyrimidine-4,6-diylbis (biphenyl-3,3'-diyl)]bis(9H-carbazole) (abbreviation: 4,6mCzBP2Pm) was vapor-deposited to a thickness of 50 nm.

As a thin film sample 2, 4,6-bis[3-(9H-carbazol-9-yl)phenyl]pyrimidine (abbreviation: 4,6mCzP2Pm) was vapor-deposited to a thickness of 50 nm.

As a solution sample 1, 4,6mCzBP2Pm was dissolved in toluene. As a solution sample 2, 4,6mCzP2Pm was dissolved in toluene.

<Measurement Results of Absorption Spectra and Emission Spectra>

Figure 45:
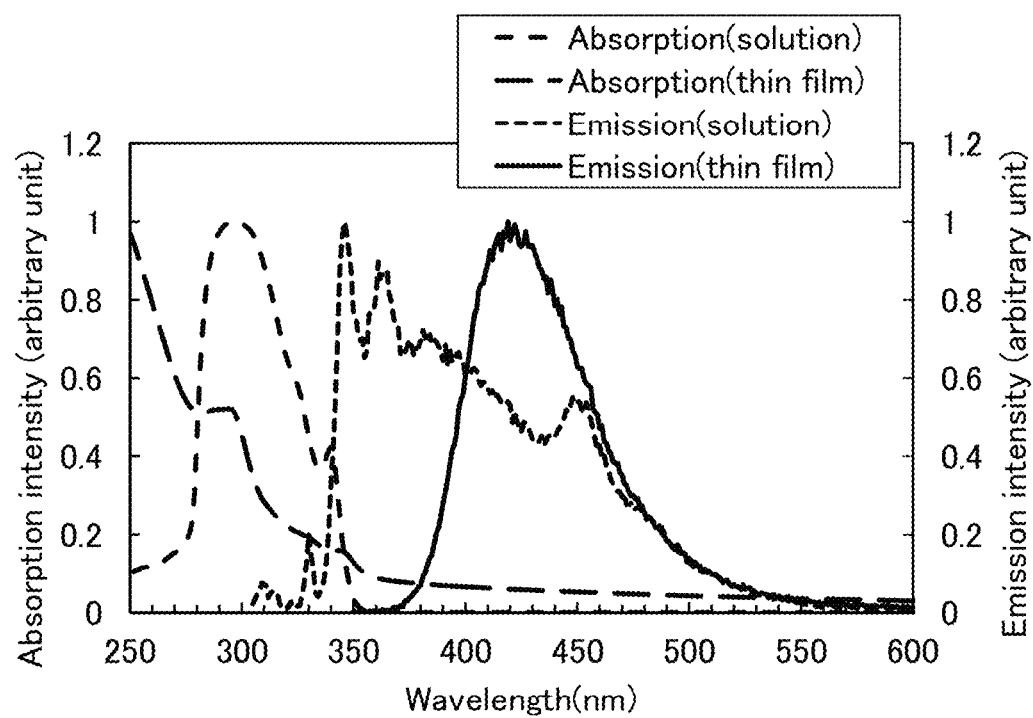
FIG. 45 is a graph showing absorption spectra and emission spectra of a solution and a thin film in Example.
Figure 46:
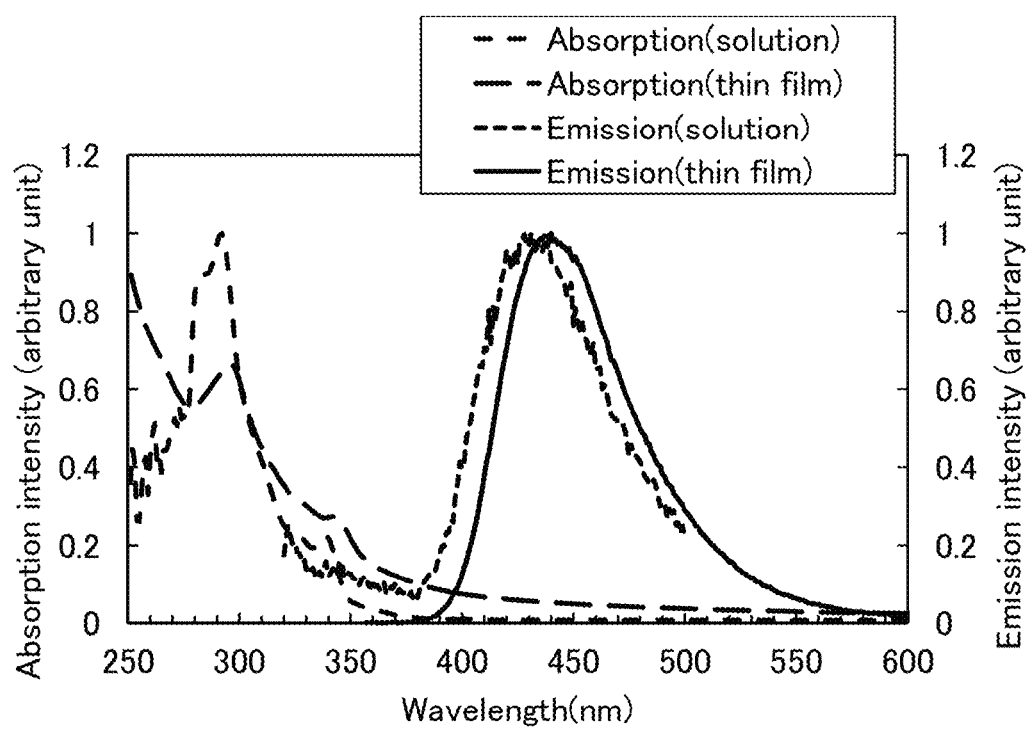
FIG. 46 is a graph showing absorption spectra and emission spectra of a solution and a thin film in Example.

FIG. 45 shows absorption and emission spectra of a thin film of 4,6mCzBP2Pm and 4,6mCzBP2Pm in a toluene solution, and FIG. 46 shows absorption and emission spectra of a thin film of 4,6mCzP2Pm and 4,6mCzP2Pm in a toluene solution.

The absorption spectra were measured with an ultraviolet-visible spectrophotometer (V-550, manufactured by JASCO Corporation). The absorption spectrum of a compound in a toluene solution was obtained by subtracting absorption spectra of toluene and a quartz cell from an absorption spectrum of the compound in the toluene solution in the quartz cell.

In addition, the absorption spectrum of a thin film of a compound was obtained by subtracting an absorption spectrum of a quartz substrate from an absorption spectrum of the thin film sample on the quartz substrate.

The emission spectra were measured with a PL-EL measurement apparatus (manufactured by Hamamatsu Photonics K.K.). The emission spectrum of the compound in the toluene solution was measured with a toluene solution put in a quartz cell. The emission spectrum of the thin film of the compound was measured with a thin film sample on a quartz substrate.

As shown in FIG. 45, peak wavelengths of an absorption spectrum of 4,6mCzBP2Pm in the toluene solution are 340 nm and 297 nm, and peak wavelengths of an absorption spectrum of the thin film of 4,6mCzBP2Pm are 343 nm and 294 nm. That is, the peak wavelengths of the absorption spectrum of 4,6mCzBP2Pm in the toluene solution and the peak wavelengths of the absorption spectrum of the thin film of 4,6mCzBP2Pm are almost the same.

On the other hand, peak wavelengths of an emission spectrum of 4,6mCzBP2Pm in the toluene solution are 346 nm, 361 nm, and around 448 nm, and a peak wavelength of an emission spectrum of the thin film of 4,6mCzBP2Pm is around 419 nm. That is, the shapes and the peak wavelengths of the emission spectra of 4,6mCzBP2Pm in the toluene solution and the thin film of 4,6mCzBP2Pm are largely different from each other. In the emission spectrum of the thin film of 4,6mCzBP2Pm, no emission peak is observed at around 340 nm to 370 nm.

In the solution, since molecules of 4,6mCzBP2Pm are dispersed into a toluene solvent, interaction between the molecules of 4,6mCzBP2Pm is low. In contrast, in the thin film, since a distance between the molecules of 4,6mCzBP2Pm is small, interaction between the molecules of 4,6mCzBP2Pm is higher than that in the solution. That is, the emission spectra of 4,6mCzBP2Pm in the solution and the thin film of 4,6mCzBP2Pm are largely different from each other because light emitted from an excited complex formed by two molecules of 4,6mCzBP2Pm is observed in the thin film of 4,6mCzBP2Pm due to the interaction between the molecules.

As shown in FIG. 46, peak wavelengths of an absorption spectrum of 4,6mCzP2Pm in the toluene solution are 339 nm and 292 nm, and peak wavelengths of an absorption spectrum of the thin film of 4,6mCzP2Pm are 342 nm and 296 nm. That is, the peak wavelengths of the absorption spectrum of 4,6mCzP2Pm in the toluene solution and the peak wavelengths of the absorption spectrum of the thin film of 4,6mCzP2Pm are almost the same.

In addition, a peak wavelength of an emission spectrum of 4,6mCzP2Pm in the toluene solution is around 431 nm, and a peak wavelength of an emission spectrum of the thin film of 4,6mCzP2Pm is around 440 nm. That is, the peak wavelength of the emission spectrum of 4,6mCzP2Pm in the toluene solution and the peak wavelength of the emission spectrum of the thin film of 4,6mCzP2Pm are almost the same.

Although a distance between the molecules of 4,6mCzP2Pm is small also in the thin film of 4,6mCzP2Pm, a difference between the emission spectra of 4,6mCzP2Pm in the solution and the thin film of 4,6mCzP2Pm is small. Thus, interaction between the molecules of 4,6mCzP2Pm is small, and no excited complex is formed.

In this manner, the compound in one embodiment of the present invention has a function of forming an excited complex by interaction between two molecules. Note that a difference between the peak of the emission spectrum of the compound in the solution and the peak of the emission spectrum of the thin film of the compound is 30 nm or more in some cases.

As described above, it is found that when the carbazole skeleton, which is the π-electron rich heteroaromatic skeleton, and the pyrimidine skeleton, which is the π-electron deficient heteroaromatic skeleton, are bonded to each other through the biphenyldiyl group including the m-phenylene group, the excited complex is easily formed by the two molecules of one kind of compound, that is, having the same molecular structure. However, in one embodiment of the present invention, the molecular structure is not limited thereto, and another compound can be used as long as the excited complex is formed by two molecules of one kind of compound.

The structure described above in this example can be combined with any of the structures described in the other embodiments and example as appropriate.

Example 2

In this example, measurement results of emission characteristics of compounds which can be used for the light-emitting element of one embodiment of the present invention are shown. Structures and abbreviations of compounds used in this example are given below.

As a thin film sample 3, 9,9'-[(2-phenyl-pyrimidine-4,6-diyl)bis(biphenyl-3,3'-diyl)]bis(9H-carbazole) (abbreviation: 2Ph-4,6mCzBP2Pm) was vapor-deposited to a thickness of 50 nm.

As a solution sample 3, 2Ph-4,6mCzBP2Pm was dissolved in toluene.

<Measurement Results of Absorption Spectra and Emission Spectra>

Figure 47:
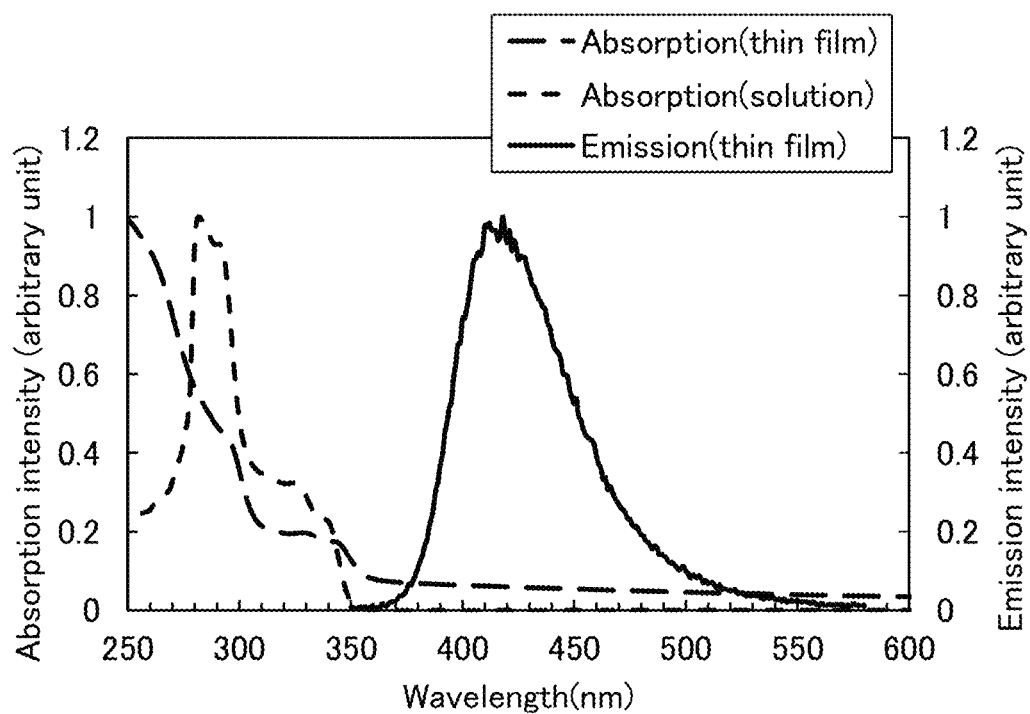
FIG. 47 is a graph showing absorption spectra and emission spectra of a solution and a thin film in Example.

FIG. 47 shows absorption and emission spectra of a thin film of 2Ph-4,6mCzBP2Pm and 2Ph-4,6mCzBP2Pm in a toluene solution. Note that the measurement methods of the absorption and emission spectra were similar to those in Example 1.

As shown in FIG. 47, peak wavelengths of an absorption spectrum of 2Ph-4,6mCzBP2Pm in the toluene solution are 344 nm and 330 nm, and peak wavelengths of an absorption spectrum of the thin film of 2Ph-4,6mCzBP2Pm are 340 nm and 328 nm. That is, the peak wavelengths of the absorption spectrum of 2Ph-4,6mCzBP2Pm in the toluene solution and the peak wavelengths of the absorption spectrum of the thin film of 2Ph-4,6mCzBP2Pm are almost the same.

On the other hand, a peak wavelength of an emission spectrum of 2Ph-4,6mCzBP2Pm in the toluene solution was too weak to be measured, while a peak wavelength of an emission spectrum of the thin film of 2Ph-4,6mCzBP2Pm was able to be measured and is around 418 nm. That is, the emission characteristics of 2Ph-4,6mCzBP2Pm in the toluene solution and the emission characteristics of the thin film of 2Ph-4,6mCzBP2Pm are largely different from each other.

In the solution, since molecules of 2Ph-4,6mCzBP2Pm are dispersed into a toluene solvent, interaction between the molecules of 2Ph-4,6mCzBP2Pm is low. In contrast, in the thin film, since a distance between the molecules of 2Ph-4,6mCzBP2Pm is small, interaction between the molecules of 2Ph-4,6mCzBP2Pm is higher than that in the solution. That is, the emission characteristics of 2Ph-4,6mCzBP2Pm in the solution and the thin film of 2Ph-4,6mCzBP2Pm are largely different from each other because light emitted from an excited complex formed between two molecules of 2Ph-4,6mCzBP2Pm is observed in the thin film of 2Ph-4,6mCzBP2Pm due to the interaction between the molecules.

[Chemical Formula 11]

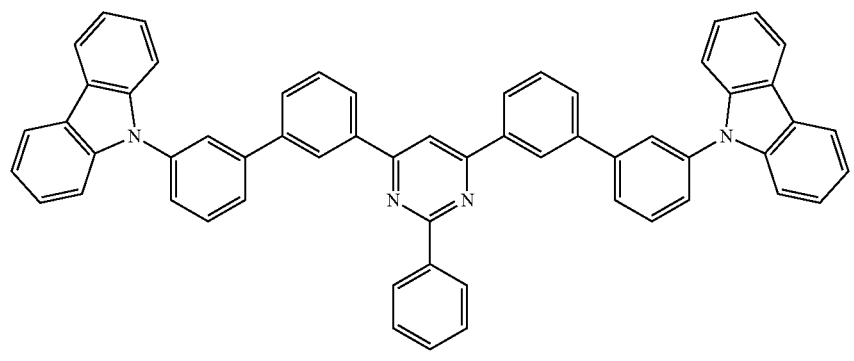

2Ph-4,6mCzBP2Pm

<Fabrication of Measurement Samples>

To measure absorption characteristics and emission characteristics of a compound, a thin film sample was fabricated on a quartz substrate by a vacuum evaporation method. In addition, a solution sample was fabricated in a quartz cell.

As described above, it is found that when the carbazole skeleton, which is the π-electron rich heteroaromatic skeleton, and the pyrimidine skeleton, which is the π-electron deficient heteroaromatic skeleton, are bonded to each other through the biphenyldiyl group including the m-phenylene group, the excited complex is easily formed by the two molecules of one kind of compound, that is, having the same molecular structure. However, in one embodiment of the present invention, the molecular structure is not limited thereto, and another compound can be used as long as the excited complex is formed by two molecules of one kind of compound.

The structure described above in this example can be combined with any of the structures described in the other embodiments and example as appropriate.

This application is based on Japanese Patent Application serial no. 2015-103903 filed with Japan Patent Office on May 21, 2015, the entire contents of which are hereby incorporated by reference.

What is claimed is:

1. A light-emitting device comprising:
    a light-emitting layer, the light-emitting layer comprising:
        a host material comprising at least a first molecule and a second molecule, the first molecule and the second molecule having the same molecular structure; and
        a phosphorescent material as a guest material,
    wherein each of the first molecule and the second molecule comprises:
        a first skeleton comprising at least one of a π-electron rich heteroaromatic skeleton and an aromatic amine skeleton;
        a second skeleton comprising a π-electron deficient heteroaromatic skeleton which is not a benzofuropyrimidine skeleton; and
        a third skeleton,
    wherein the first skeleton and the second skeleton are bonded to each other through the third skeleton, and
    wherein the first molecule and the second molecule are configured to form an excited complex with the first skeleton in the first molecule and the second skeleton in the second molecule.

2. The light-emitting device according to claim 1, wherein the π-electron deficient heteroaromatic skeleton comprises at least one of a pyridine skeleton, a diazine skeleton, and a triazine skeleton.

3. The light-emitting device according to claim 1, wherein the π-electron rich heteroaromatic skeleton comprises at least one of a thiophene skeleton, a furan skeleton, and a pyrrole skeleton.

4. The light-emitting device according to claim 1, wherein the third skeleton comprises at least one of a m-phenylene group and an o-phenylene group.

5. The light-emitting device according to claim 1, wherein the third skeleton has a structure where an arylene group and at least one of a m-phenylene group and an o-phenylene group are bonded to each other.

6. The light-emitting device according to claim 1, wherein the third skeleton comprises a biphenyldiyl group.

7. The light-emitting device according to claim 1, wherein the excited complex is configured to exhibit thermally activated delayed fluorescence at room temperature.

8. The light-emitting device according to claim 1, wherein the excited complex is configured to supply excitation energy to the phosphorescent material.

9. The light-emitting device according to claim 1, wherein light emitted from the excited complex overlaps with an absorption band of the phosphorescent material on the lowest energy side.

10. A light-emitting device comprising:
    a light-emitting layer, the light-emitting layer comprising:
        a host material comprising a compound comprising at least a first molecule and a second molecule, the first molecule and the second molecule having the same molecular structure; and
        a phosphorescent material as a guest material,
    wherein each of the first molecule and the second molecule comprises:
        a first skeleton comprising at least one of a π-electron rich heteroaromatic skeleton and an aromatic amine skeleton;
        a second skeleton comprising a π-electron deficient heteroaromatic skeleton; and
        a third skeleton,
    wherein the first skeleton and the second skeleton are bonded to each other through the third skeleton,
    wherein the first molecule and the second molecule are configured to form an excited complex with the first skeleton in the first molecule and the second skeleton in the second molecule, and
    wherein a difference between a peak of an emission spectrum of the compound in a toluene solution and a peak of an emission spectrum of a thin film of the compound is 30 nm or more.

11. The light-emitting device according to claim 10, wherein the π-electron deficient heteroaromatic skeleton comprises at least one of a pyridine skeleton, a diazine skeleton, and a triazine skeleton.

12. The light-emitting device according to claim 10, wherein the third skeleton comprises a biphenyldiyl group.

* * * * *